US012690288B2

(12) United States Patent
Takahashi et al.

(10) Patent No.: US 12,690,288 B2
(45) Date of Patent: Jul. 21, 2026

(54) IMAGING ELEMENT AND IMAGING DEVICE

(71) Applicant: SONY SEMICONDUCTOR SOLUTIONS CORPORATION, Kanagawa (JP)

(72) Inventors: Hiroshi Takahashi, Kanagawa (JP); Shigehiro Ikehara, Kanagawa (JP); Tadashi Iijima, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 387 days.

(21) Appl. No.: 18/550,282

(22) PCT Filed: Jan. 31, 2022

(86) PCT No.: PCT/JP2022/003514
§ 371 (c)(1),
(2) Date: Sep. 12, 2023

(87) PCT Pub. No.: WO2022/201861
PCT Pub. Date: Sep. 29, 2022

(65) Prior Publication Data
US 2024/0186357 A1     Jun. 6, 2024

(30) Foreign Application Priority Data

Mar. 24, 2021     (JP) ................................. 2021-050667

(51) Int. Cl.
*H10F 39/18*          (2025.01)
*H10F 39/00*          (2025.01)
(52) U.S. Cl.
CPC ....... *H10F 39/807* (2025.01); *H10F 39/1865* (2025.01); *H10F 39/811* (2025.01)

(58) Field of Classification Search
CPC .... H10F 39/186; H10F 39/194; H10F 39/199; H10F 39/80; H10F 39/807; H10F 39/813; H04N 25/46; H04N 25/621; H04N 25/704
See application file for complete search history.

(56) References Cited

U.S. PATENT DOCUMENTS 10,073,239 B1 *    9/2018    Jung ...................... H04N 23/67
2009/0213256 A1    8/2009    Kudoh
(Continued)

FOREIGN PATENT DOCUMENTS

CN          109273470          1/2019
JP          2009-177601        8/2009
(Continued)

OTHER PUBLICATIONS

International Search Report and Written Opinion prepared by the Japan Patent Office on Apr. 19, 2022, for International Application No. PCT/JP2022/003514, 2 pgs.

*Primary Examiner* — Tucker J Wright
(74) *Attorney, Agent, or Firm* — SHERIDAN ROSS P.C.

(57)          ABSTRACT

An imaging element according to the present disclosure includes a pixel, an overflow path, a pixel isolation unit, a pixel isolation electrode, an in-pixel isolation unit, and an in-pixel isolation electrode. The pixel includes a plurality of photoelectric conversion units formed in a semiconductor substrate having an interconnect region arranged on a front surface side and performs photoelectric conversion of incident light. The overflow path mutually transfers charges between the plurality of photoelectric conversion units. The pixel isolation unit is at a boundary of the pixel. The pixel isolation electrode is in the pixel isolation unit, and a first bias voltage is applied to the pixel isolation electrode. The in-pixel isolation unit isolates the plurality of photoelectric conversion units from each other. The in-pixel isolation
(Continued)

electrode is arranged in the in-pixel isolation unit, and a second bias voltage is applied to the in-pixel isolation electrode.

23 Claims, 31 Drawing Sheets

(56)                 References Cited

U.S. PATENT DOCUMENTS

| | | |
|---|---|---|
| 2009/0303371 A1 | 12/2009 | Watanabe et al. |
| 2014/0151533 A1 | 6/2014 | Watanabe et al. |
| 2014/0160335 A1 | 6/2014 | Shimotsusa |
| 2016/0064432 A1 | 3/2016 | Shimotsusa |
| 2017/0170229 A1 | 6/2017 | Oh et al. |
| 2017/0263658 A1 | 9/2017 | Shimotsusa |
| 2018/0102384 A1 | 4/2018 | Shimotsusa |
| 2018/0301483 A1 | 10/2018 | Shimotsusa |
| 2019/0123093 A1 | 4/2019 | Watanabe et al. |
| 2019/0259788 A1 | 8/2019 | Shimotsusa |
| 2020/0350358 A1 | 11/2020 | Watanabe et al. |
| 2020/0357832 A1 | 11/2020 | Shimotsusa |

FOREIGN PATENT DOCUMENTS

| | | |
|---|---|---|
| JP | 2009-206210 | 9/2009 |
| JP | 2010-114274 | 5/2010 |
| JP | 2014-116472 | 6/2014 |

* cited by examiner

IMAGE
SIGNAL
GENERA-
TION UNIT

IMAGING ELEMENT AND IMAGING DEVICE

CROSS REFERENCE TO RELATED APPLICATIONS

This application is a national stage application under 35 U.S.C. 371 and claims the benefit of PCT Application No. PCT/JP2022/003514, having an international filing date of 31 Jan. 2022, which designated the United States, which PCT application claimed the benefit of Japanese Patent Application No. 2021-050667 filed 24 Mar. 2021, the entire disclosures of each of which are incorporated herein by reference.

FIELD

The present disclosure relates to an imaging element and an imaging device.

BACKGROUND

An imaging element in which pixels each having a photoelectric conversion unit that performs photoelectric conversion of incident light are arranged in a two-dimensional matrix form is used. The pixel of the imaging element generates an image signal on the basis of charge generated by photoelectric conversion. An isolation region is arranged between the pixels in the imaging element, and charge transfer between the pixels is suppressed. As a result, noise of the image signal can be reduced. The isolation region is formed on a semiconductor substrate on which the photoelectric conversion units are arranged, and isolates the photoelectric conversion units of the adjacent pixels from each other. However, an interface state is formed at an interface of the semiconductor substrate in contact with the isolation region. When charge (electrons) trapped in the interface state is released from the interface state and diffused, dark current is generated. The dark current is signal current due to the charge, not due to the photoelectric conversion. Therefore, when the dark current is superimposed on the charge generated by the photoelectric conversion unit, an error occurs in the image signal.

Under such circumstances, an imaging element has been proposed in which the isolation region is made of a conductive member and a negative bias voltage is applied (see, for example, Patent Literature 1). By applying the negative bias voltage, holes are accumulated in the vicinity of the interface of the semiconductor substrate in contact with the isolation region. The accumulated holes prevent the charge transfer from the interface state, and the dark current can be reduced.

CITATION LIST

Patent Literature

Patent Literature 1: US 2017/0170229 A

SUMMARY

Technical Problem

In an imaging element that detects a focal position of an imaging lens and performs autofocus, phase difference pixels that are pixels for detecting an image-plane phase difference of a subject image are arranged. In a phase difference pixel in which a plurality of photoelectric conversion units are arranged in one pixel out of such phase difference pixels, it is necessary to arrange in the pixel an isolation unit that isolates the photoelectric conversion units from each other. However, in the above-described conventional technique, there is a problem that the photoelectric conversion units in the pixel cannot be isolated from each other.

Therefore, the present disclosure proposes an imaging element and an imaging device that isolate from each other a plurality of photoelectric conversion units arranged in a pixel.

Solution to Problem

An imaging element according to the present disclosure includes: a pixel that includes a plurality of photoelectric conversion units that is formed in a semiconductor substrate having an interconnect region arranged on a front surface side and performs photoelectric conversion of incident light from a subject to generate charges; an overflow path that mutually transfers charges between the plurality of photoelectric conversion units; a pixel isolation unit that is arranged at a boundary of the pixel; a pixel isolation electrode that is arranged in the pixel isolation unit and to which a first bias voltage is applied; an in-pixel isolation unit that isolates the plurality of photoelectric conversion units from each other; an in-pixel isolation electrode that is arranged in the in-pixel isolation unit and to which a second bias voltage is applied; a charge holding unit that holds the generated charges; a plurality of charge transfer units that are each arranged in the corresponding one of the plurality of photoelectric conversion units and configured to transfer charges generated by the photoelectric conversion units to the charge holding unit to cause the charge holding unit to hold the charges; and an image signal generation unit that generates an image signal on a basis of the held charges.

BRIEF DESCRIPTION OF DRAWINGS

FIG. 16E is a diagram illustrating the other example of the method for manufacturing the imaging element according to the sixth embodiment of the present disclosure.

FIG. 16F is a diagram illustrating the other example of the method for manufacturing the imaging element according to the sixth embodiment of the present disclosure.

FIG. 16G is a diagram illustrating the other example of the method for manufacturing the imaging element according to the sixth embodiment of the present disclosure.

FIG. 16H is a diagram illustrating the other example of the method for manufacturing the imaging element according to the sixth embodiment of the present disclosure.

DESCRIPTION OF EMBODIMENTS

Hereinbelow, embodiments of the present disclosure will be described in detail with reference to the drawings. The description will be given in the following order. Note that, in each of the following embodiments, identical components are labeled with the same reference signs, and duplicate description is omitted.

1. First Embodiment
2. Second Embodiment
3. Third Embodiment
4. Fourth Embodiment
5. Fifth Embodiment
6. Sixth Embodiment
7. Modification Examples
8. Configuration Example of Imaging Device

1. First Embodiment

[Configuration of Imaging Element]

Figure 1:
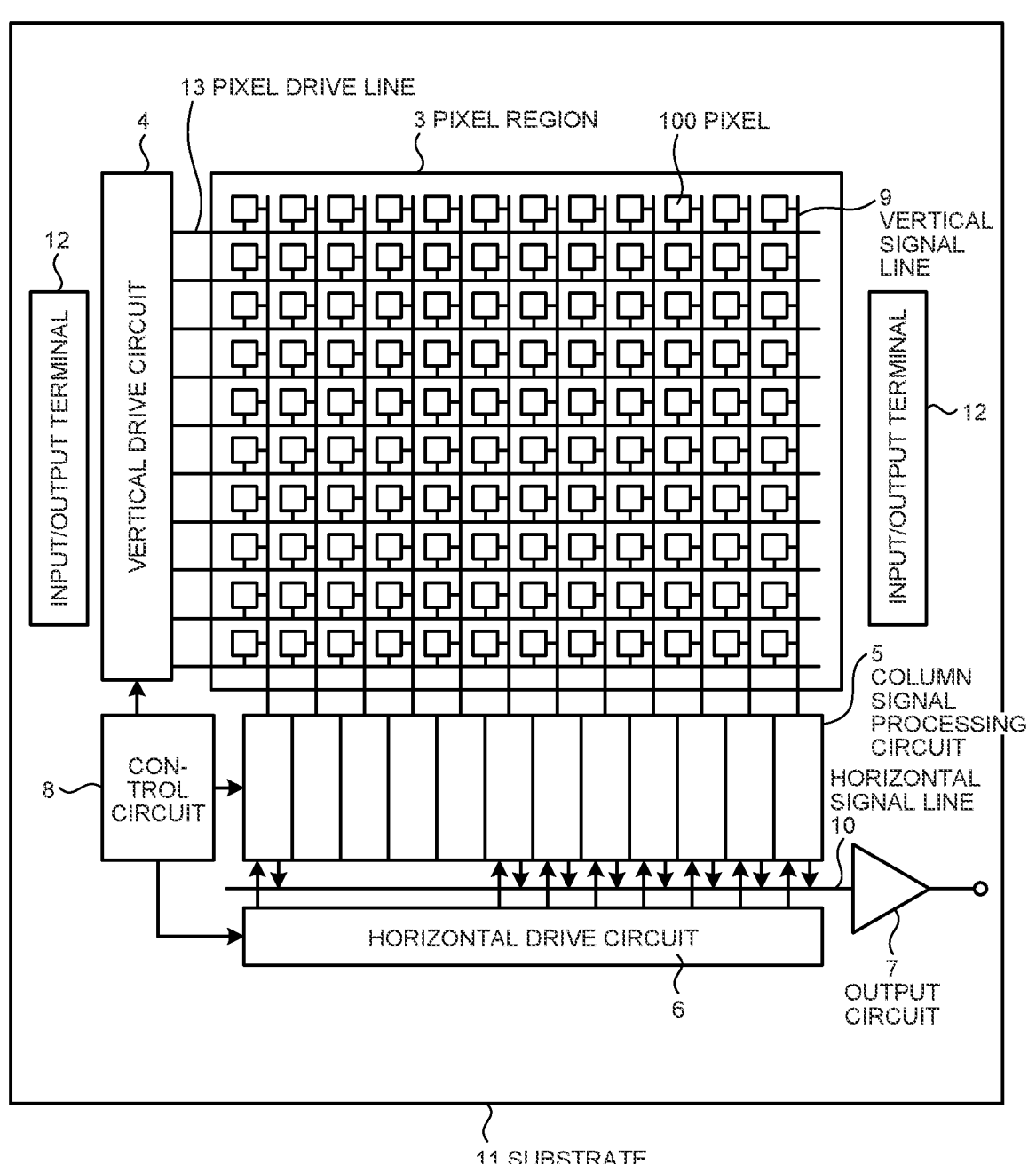
FIG. 1 is a diagram illustrating a configuration example of an imaging device according to an embodiment of the present disclosure.

FIG. 1 is a diagram illustrating a configuration example of an imaging element according to an embodiment of the present disclosure. As illustrated in FIG. 1, an imaging element 1 of the present example includes a pixel region (so-called imaging region) 3 in which pixels 100 each including a plurality of photoelectric conversion elements are regularly and two-dimensionally arranged on a semiconductor substrate 11, for example, a silicon substrate, and a peripheral circuit unit. The pixel 100 includes the photoelectric conversion elements, for example, photodiodes, and a plurality of pixel transistors (so-called MOS transistors). The plurality of pixel transistors can include, for example, three transistors consisting of a transfer transistor (charge transfer unit described below), a reset transistor, and an amplification transistor. Alternatively, the plurality of pixel transistors can include four transistors by adding a selection transistor. The pixel 100 may have a share pixel structure. This pixel share structure includes a plurality of photodiodes, a plurality of transfer transistors, one shared floating diffusion region, and each one of the other shared pixel transistors.

The peripheral circuit unit includes a vertical drive circuit 4, a column signal processing circuit 5, a horizontal drive circuit 6, an output circuit 7, a control circuit 8, and the like.

The control circuit 8 receives an input clock and data instructing an operation mode and the like, and outputs data such as internal information of the imaging element. That is, the control circuit 8 generates a clock signal and a control signal serving as a reference of operations of the vertical drive circuit 4, the column signal processing circuit 5, the horizontal drive circuit 6, and the like on the basis of a vertical synchronization signal, a horizontal synchronization signal, and a master clock. Then, these signals are input into the vertical drive circuit 4, the column signal processing circuit 5, the horizontal drive circuit 6, and the like.

The vertical drive circuit 4 includes, for example, a shift register, selects a pixel drive line 13, supplies a pulse for driving the pixels to the selected pixel drive line, and drives the pixels on a row basis. That is, the vertical drive circuit 4 selectively scans each pixel 100 in the pixel region 3 sequentially in the vertical direction on a row basis, and supplies a pixel signal based on signal charge generated in accordance with the amount of received light in, for example, a photodiode serving as a photoelectric conversion element of each pixel 100 to the column signal processing circuit 5 through a vertical signal line 9.

The column signal processing circuit 5 is arranged, for example, to correspond to the respective columns of the pixels 100, and performs signal processing such as noise removal on the signals output from the pixels 100 of one row for each pixel column. That is, the column signal processing circuit 5 performs signal processing such as correlated double sampling (CDS) for removing fixed pattern noise unique to the pixel 100, signal amplification, and AD conversion. A horizontal selection switch (not illustrated) is connected and provided between an output stage of the column signal processing circuit 5 and a horizontal signal line 10.

The horizontal drive circuit 6 includes, for example, a shift register, sequentially selects each unit of the column signal processing circuit 5 by sequentially outputting a horizontal scanning pulse, and causes each unit of the column signal processing circuit 5 to output a pixel signal to the horizontal signal line 10.

The output circuit 7 performs signal processing on the signal sequentially supplied from each unit of the column signal processing circuit 5 through the horizontal signal line 10, and outputs the processed signal. For example, only buffering may be performed, or black level adjustment, column variation correction, various kinds of digital signal processing, and the like may be performed. An input/output terminal 12 exchanges signals with the outside.

[Configuration of Imaging Element]

Figure 2:
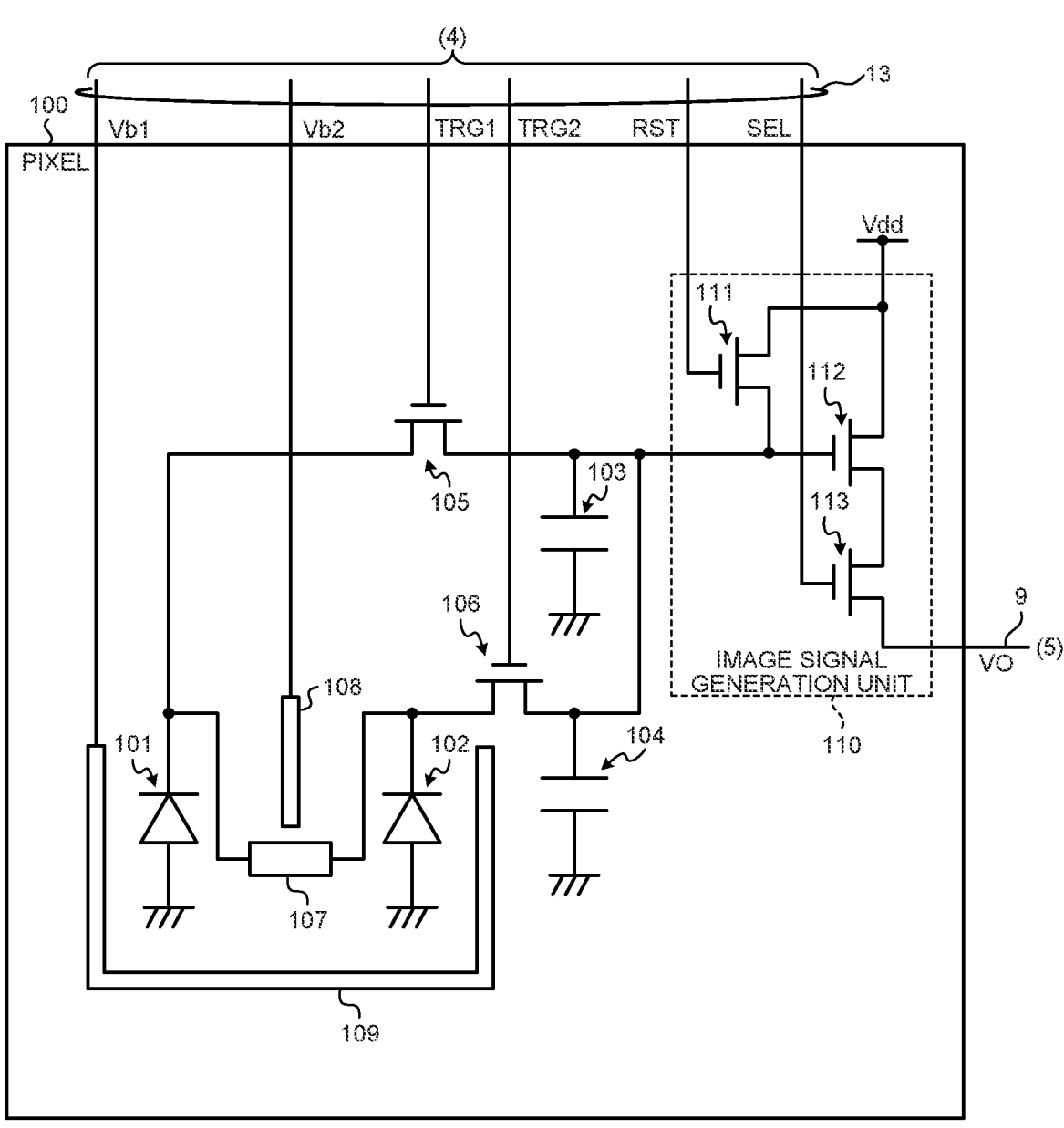
FIG. 2 is a diagram illustrating a configuration example of a pixel according to the embodiment of the present disclosure.

FIG. 2 is a diagram illustrating a configuration example of the pixel according to the embodiment of the present disclosure. FIG. 2 is a circuit diagram illustrating a configuration example of the pixel 100. The pixel 100 includes photoelectric conversion units 101 and 102, charge holding units 103 and 104, charge transfer units 105 and 106, a reset transistor 111, an amplification transistor 112, a selection transistor 113, an overflow path 107, an in-pixel isolation electrode 108, and a pixel isolation electrode 109. Note that a circuit including the reset transistor 111, the amplification transistor 112, and the selection transistor 113 constitutes an image signal generation unit 110.

The photoelectric conversion units 101 and 102 can include photodiodes. Furthermore, the charge transfer units 105 and 106, the reset transistor 111, the amplification transistor 112, and the selection transistor 113 can include an n-channel MOS transistor. In this n-channel MOS transistor, the drain and the source can be made conductive by applying a voltage exceeding a threshold of a gate-source voltage Vgs to the gate. Hereinbelow, a voltage exceeding the threshold of the gate-source voltage Vgs is referred to as an ON voltage. In addition, a control signal including the ON voltage is referred to as an ON signal. The control signal is transmitted by a signal line TRG1 and the like to be described below.

As described above, the pixel drive line 13 and the vertical signal line 9 are provided to the pixel 100. The pixel drive line 13 in FIG. 2 includes a signal line Vb1, a signal line Vb2, a signal line TRG1, a signal line TRG2, a signal line RST, and a signal line SEL. Also, the vertical signal line 9 includes a signal line VO. In addition, a power supply line Vdd is provided to the pixel 100. The power supply line Vdd is a line that supplies power to the pixel 100.

The anode of the photoelectric conversion unit 101 is grounded, and the cathode thereof is connected to the source of the charge transfer unit 105. The anode of the photoelectric conversion unit 102 is grounded, and the cathode thereof is connected to the source of the charge transfer unit 106. The drain of the charge transfer unit 105 is connected to the source of the reset transistor 111, the gate of the amplification transistor 112, the drain of the charge transfer unit 106, one end of the charge holding unit 103, and one end of the charge holding unit 104. The other end of the charge holding unit 103 and the other end of the charge holding unit 104 are grounded. The drain of the reset transistor 111 is connected to the power supply line Vdd. The drain of the amplification transistor 112 is connected to the power supply line Vdd, and the source thereof is connected to the drain of the selection transistor 113. The source of the selection transistor 113 is connected to the signal line VO.

The overflow path 107 is connected between the cathode of the photoelectric conversion unit 101 and the cathode of the photoelectric conversion unit 102. The in-pixel isolation electrode 108 is connected to the signal line Vb2. The pixel isolation electrode 109 is connected to the signal line Vb1. The signal line TRG1 and the signal line TRG2 are connected to the gate of the charge transfer unit 105 and the gate of the charge transfer unit 106, respectively. The signal line RST and the signal line SEL are connected to the gate of the reset transistor 111 and the gate of the selection transistor 113, respectively.

The photoelectric conversion units 101 and 102 perform photoelectric conversion of incident light. The photoelectric conversion units 101 and 102 can include photodiodes formed on a semiconductor substrate 120 described below. The photoelectric conversion units 101 and 102 perform photoelectric conversion of incident light in an exposure period and hold charge generated by the photoelectric conversion.

The charge holding units 103 and 104 hold charges generated by the photoelectric conversion units 101 and 102. FIG. 2 illustrates an example of a case where the charge holding units 103 and 104 are connected in parallel. The charge holding units 103 and 104 can be constituted by a floating diffusion (FD) region, which is a semiconductor region formed in the semiconductor substrate 120.

The charge transfer units 105 and 106 transfer charge. The charge transfer unit 105 transfers charge generated by the photoelectric conversion of the photoelectric conversion unit 101 to the charge holding units 103 and 104, and the charge transfer unit 106 transfers charge generated by the photoelectric conversion of the photoelectric conversion unit 102 to the charge holding units 103 and 104. The charge transfer units 105 and 106 transfer charges by making the photoelectric conversion units 101 and 102 and the charge holding units 103 and 104 conductive, respectively. The control signals of the charge transfer units 105 and 106 are transmitted by the signal lines TRG1 and TRG2, respectively.

The image signal generation unit 110 generates an image signal on the basis of charges held in the charge holding units 103 and 104. As described above, the image signal generation unit 110 includes the reset transistor 111, the amplification transistor 112, and the selection transistor 113.

The reset transistor 111 resets the charge holding units 103 and 104. This reset can be performed by making the charge holding units 103 and 104 conductive to the power supply line Vdd and draining charges of the charge holding units 103 and 104. The control signal of the reset transistor 111 is transmitted by the signal line RST.

The amplification transistor 112 amplifies the voltages of the charge holding units 103 and 104. The gate of the amplification transistor 112 is connected to the charge holding units 103 and 104. Therefore, an image signal having a voltage corresponding to the charges held in the charge holding units 103 and 104 is generated at the source of the amplification transistor 112. Also, the image signal can be output to the signal line VO by making the selection transistor 113 conductive. The control signal of the selection transistor 113 is transmitted by the signal line SEL.

The overflow path 107 mutually transfers charges between the photoelectric conversion units 101 and 102. The overflow path 107 can include a semiconductor region arranged between the photoelectric conversion units 101 and 102.

The in-pixel isolation electrode 108 is an electrode arranged in an in-pixel isolation unit 150 described below. A second bias voltage is applied to the in-pixel isolation electrode 108 via the signal line Vb2. As described below, the in-pixel isolation electrode 108 is arranged between the photoelectric conversion units 101 and 102.

The pixel isolation electrode 109 is an electrode arranged in a pixel isolation unit 160 described below. A first bias voltage is applied to the pixel isolation electrode 109 via the signal line Vb1. As described below, the pixel isolation electrode 109 is formed to surround the pixel 100 including the photoelectric conversion units 101 and 102.

To generate a phase difference signal in the pixel 100, the charge transfer units 105 and 106 individually transfer the charges generated by the corresponding photoelectric conversion units 101 and 102 to the corresponding charge holding units 103 and 104. This charge transfer is referred to as individual transfer. Thereafter, a phase difference signal is generated by the image signal generation unit 110 on the basis of each of the charges individually transferred to the corresponding charge holding units 103 and 104. Hereinbelow, a mode for generating the phase difference signal is referred to as a phase difference signal mode.

On the other hand, to generate an image signal in the pixel 100, the charge transfer units 105 and 106 commonly transfer the charges generated by the photoelectric conversion units 101 and 102 to the charge holding units 103 and 104. In this case, the charge holding units 103 and 104 simultaneously and collectively hold the charges generated by the photoelectric conversion units 101 and 102. This charge transfer is referred to as collective transfer. Also, a mode for generating the image signal is referred to as an image signal mode.

[Configuration of Plane of Imaging Element]

Figure 3:
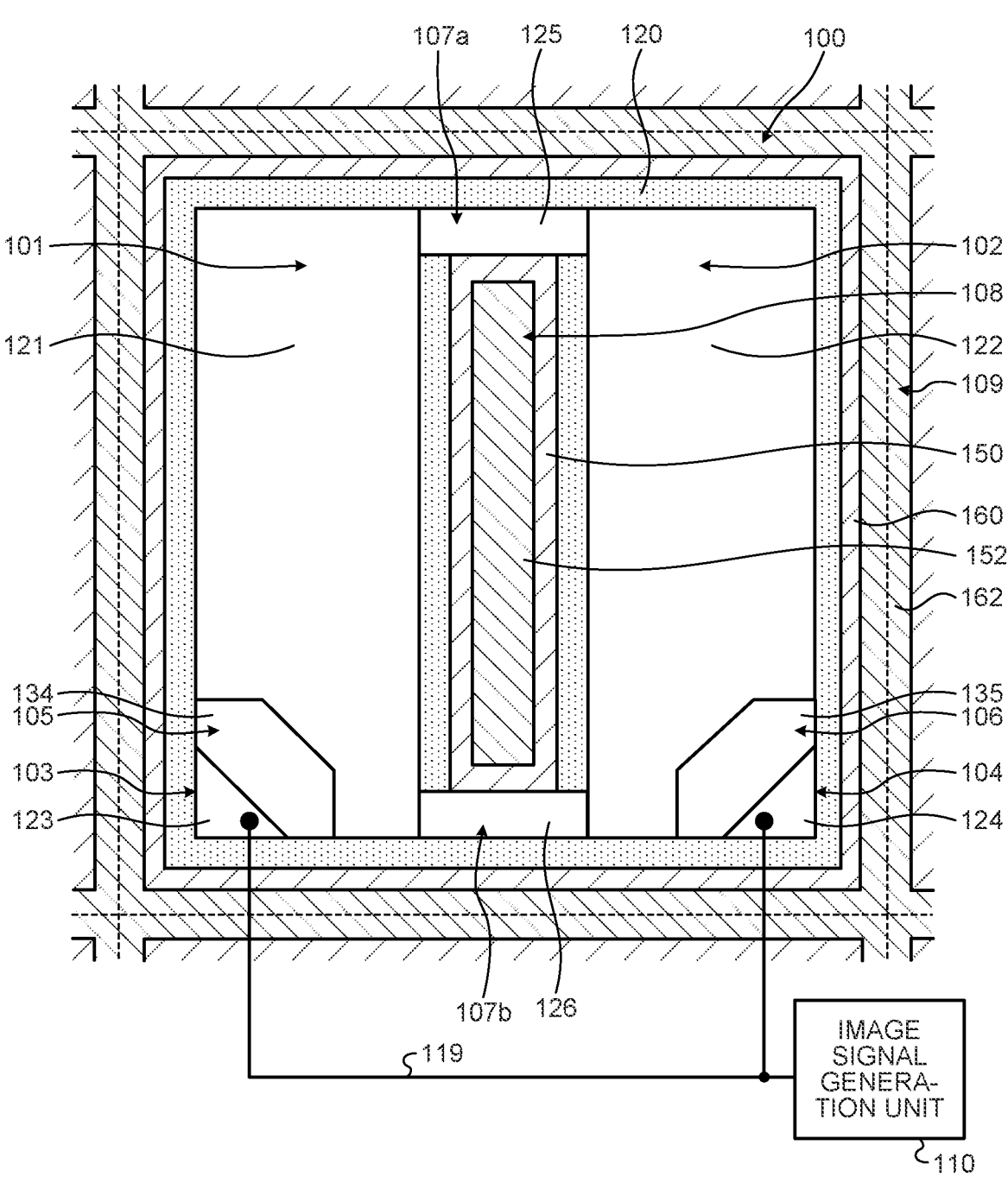
FIG. 3 is a diagram illustrating a configuration example of the pixel according to a first embodiment of the present disclosure.

FIG. 3 is a diagram illustrating a configuration example of the pixel according to the first embodiment of the present disclosure. FIG. 3 is a plan view illustrating a configuration example of the pixel 100. FIG. 3 is a diagram schematically illustrating a configuration of the pixel 100 as viewed from the back surface side of the semiconductor substrate 120. The dotted rectangle in FIG. 3 represents the region of the pixel 100. Also, the white rectangle represents a semiconductor region and a gate electrode formed on the semiconductor substrate 120. In the pixel 100, semiconductor regions 121 and 122 constituting the photoelectric conversion units 101 and 102, respectively, are arranged, and the charge transfer units 105 and 106 are arranged adjacent to the semiconductor regions 121 and 122. In FIG. 3, gate electrodes 134 and 135 of the charge transfer units 105 and 106 are illustrated. Semiconductor regions 123 and 124 constituting the charge holding units 103 and 104 are arranged adjacent to the charge transfer units 105 and 106. Note that the gate electrodes 134 and 135 and the semiconductor regions 123 and 124 are arranged on the front surface side of the semiconductor substrate 120.

The overflow path 107 is arranged on the semiconductor substrate 120 between the pixel isolation unit 160 and the in-pixel isolation unit 150 described below. FIG. 3 illustrates an example of the pixel 100 in which two overflow paths 107a and 107b are arranged. The overflow paths 107a and 107b are constituted by semiconductor regions 125 and 126, respectively.

The in-pixel isolation unit 150 is arranged between the photoelectric conversion units 101 and 102. The in-pixel isolation unit 150 isolates the photoelectric conversion units 101 and 102 from each other. In the in-pixel isolation unit 150, an electrode 152 constituting the above-described in-pixel isolation electrode 108 is arranged. Also, the pixel isolation unit 160 is arranged at the boundary of the pixel 100. The pixel isolation unit 160 is formed to surround the pixel 100 and isolates adjacent pixels 100 from each other. In the pixel isolation unit 160, an electrode 162 constituting the above-described pixel isolation electrode 109 is arranged.

Note that the image signal generation unit 110 is further illustrated in FIG. 3. FIG. 3 illustrates an example in which the image signal generation unit 110 is arranged in a region outside of the pixel 100. The pixel 100 in FIG. 3 is connected to the charge holding units 103 and 104 by a signal line 119.

[Configuration of Cross-Section of Imaging Element]

Figure 4:
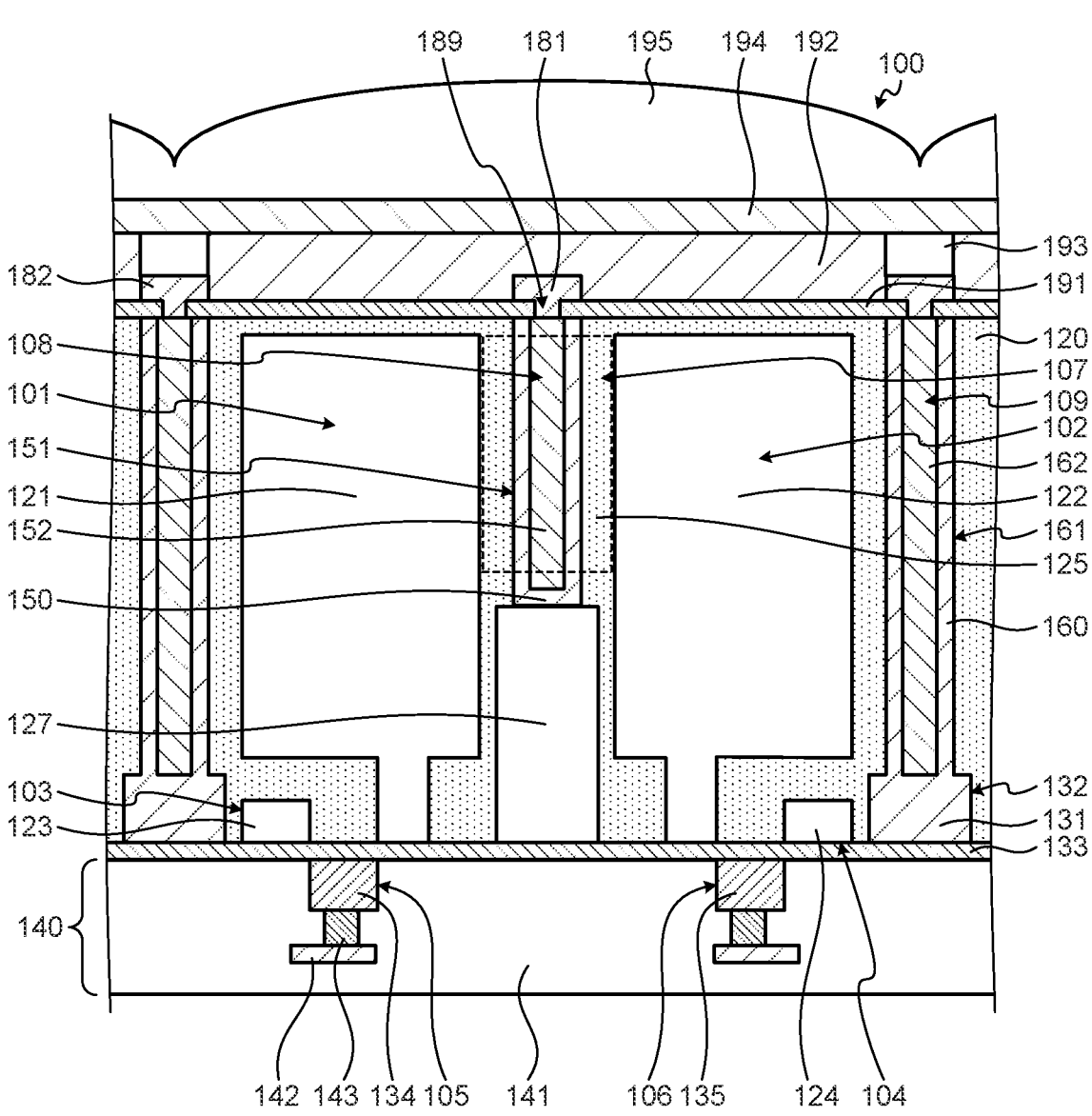
FIG. 4 is a cross-sectional view illustrating a configuration example of the pixel according to the first embodiment of the present disclosure.

FIG. 4 is a cross-sectional view illustrating a configuration example of the pixel according to the first embodiment of the present disclosure. FIG. 4 is a cross-sectional view illustrating a configuration example of the pixel 100. The pixel 100 in FIG. 4 includes the semiconductor substrate 120, insulating films 133 and 191, an interconnect region 140, the in-pixel isolation unit 150, the pixel isolation unit 160, an in-pixel isolation unit interconnect 181, a pixel isolation unit interconnect 182, a color filter 192, a light-shielding wall 193, a planarization film 194, and an on-chip lens 195.

The semiconductor substrate 120 is a semiconductor substrate in which a diffusion layer of the element of the pixel 100 is arranged. The semiconductor substrate 120 can be made of, for example, silicon (Si). The element such as the photoelectric conversion unit 101 can be arranged in a well region formed in the semiconductor substrate 120. For convenience, the semiconductor substrate 120 in FIG. 4 is assumed to be formed in a p-type well region. By arranging an n-type or p-type semiconductor region in the well region, the diffusion layer of the element can be formed. In FIG. 4, the photoelectric conversion units 101 and 102, the charge transfer units 105 and 106, the charge holding units 103 and 104, and the overflow path 107 are illustrated.

The photoelectric conversion unit 101 is constituted by the n-type semiconductor region 121. Specifically, a photodiode formed by a pn junction at an interface between the n-type semiconductor region 121 and a surrounding p-type well region corresponds to the photoelectric conversion unit 101. Similarly, the photoelectric conversion unit 102 is constituted by the n-type semiconductor region 122. Charges generated by photoelectric conversion of the photoelectric conversion units 101 and 102 during the exposure period are accumulated in the n-type semiconductor regions 121 and 122, respectively. The accumulated charges are transferred to and held in the charge holding units 103 and 104 by the charge transfer units 105 and 106 after the lapse of the exposure period. Note that the semiconductor regions 121 and 122 in FIG. 4 are partially extended to the front surface side of the semiconductor substrate 120. The extended regions constitute the source regions of the charge transfer units 105 and 106 described below.

Also, the n-type semiconductor regions 123 and 124 constituting the charge holding units 103 and 104 are arranged on the front surface side of the semiconductor substrate 120. These n-type semiconductor regions 123 and 124 are semiconductor regions having a relatively high impurity concentration, and constitute the above-described FD.

Also, the semiconductor region 125 constituting the overflow path 107 is arranged between the n-type semiconductor regions 121 and 122 constituting the photoelectric conversion units 101 and 102, respectively. The semiconductor region 125 has the same conductivity type as those of the semiconductor regions 121 and 122, and is arranged adjacent to the semiconductor regions 121 and 122. A potential barrier is formed between the semiconductor region 125 and the semiconductor regions 121 and 122. By lowering the potential barrier, charge can be transferred between the semiconductor regions 121 and 122.

The in-pixel isolation unit 150 is arranged between the photoelectric conversion units 101 and 102. The in-pixel isolation unit 150 is made of an insulating member, and electrically isolates the photoelectric conversion units 101 and 102 from each other. FIG. 4 illustrates an example in which the in-pixel isolation unit 150 is arranged on the back surface side of the semiconductor substrate 120, and the in-pixel isolation unit 150 can be formed by filling a groove portion 151 formed from the back surface side of the semiconductor substrate 120 with an insulating member such as silicon oxide ($SiO_2$).

In the in-pixel isolation unit 150, the in-pixel isolation electrode 108 is arranged. The in-pixel isolation electrode 108 can be formed by arranging the electrode 152 at the center of the groove portion 151 formed in the semiconductor substrate 120. The electrode 152 can be made of, for example, tungsten.

Furthermore, an in-pixel isolation region 127 is arranged between the photoelectric conversion units 101 and 102 on the front surface side of the semiconductor substrate 120. The in-pixel isolation region 127 prevents transfer of charge between the photoelectric conversion units 101 and 102. The in-pixel isolation region 127 can be constituted by a semiconductor region having the same conductivity type as the well region and having a relatively high impurity concentration.

Furthermore, the pixel isolation unit 160 is arranged in the semiconductor substrate 120 at the boundary of the pixel 100. The pixel isolation unit 160 is made of an insulating member and electrically isolates the pixels 100 from each other. FIG. 4 illustrates an example in which the pixel isolation unit 160 is arranged on the back surface side of the semiconductor substrate 120. Also, the pixel isolation unit 160 can be formed by filling a groove portion 161 formed from the front surface side of the semiconductor substrate 120 with an insulating member such as $SiO_2$.

In the pixel isolation unit 160, the pixel isolation electrode 109 is arranged. The pixel isolation electrode 109 can be formed by arranging the electrode 162 at the center of the groove portion 161 formed in the semiconductor substrate 120. The electrode 162 can be made of, for example, tungsten.

Furthermore, an isolation unit 131 is arranged on the front surface side of the semiconductor substrate 120 at the boundary of the pixel 100. The isolation unit 131 can be formed by filling a relatively shallow groove portion 132 formed on the front surface side of the semiconductor substrate 120 with an insulating member. The isolation unit 131 is referred to as shallow trench isolation (STI). The isolation unit 131 can be arranged at a position overlapping with the pixel isolation unit 160.

The insulating film 133 is a film that insulates the front surface side of the semiconductor substrate 120. The insulating film 133 can be made of $SiO_2$ or silicon nitride (SiN).

The gate electrodes 134 and 135 are arranged on the front surface side of the semiconductor substrate 120. The gate electrodes 134 and 135 constitute gates of the charge transfer units 105 and 106, respectively. The gate electrodes 134 and 135 can be made of polycrystalline silicon. Note that the insulating film 133 on the lower layer of the gate electrodes 134 and 135 constitutes a gate insulating film. The charge transfer unit 105 is constituted by a MOS transistor with the semiconductor region 121 and the semiconductor region 123 as a source region and a drain region, respectively. Similarly, the charge transfer unit 106 is constituted by a MOS transistor with the semiconductor region 122 and the semiconductor region 124 as a source region and a drain region, respectively.

The interconnect region 140 is a region arranged on the front surface side of the semiconductor substrate 120 and in which the interconnect of the pixel 100 is arranged. The interconnect region 140 includes an interconnect 142 and an insulating layer 141. The interconnect 142 transmits a signal or the like of the element of the pixel 100. The interconnect 142 can be made of a conductor such as copper (Cu) and tungsten. The insulating layer 141 insulates the interconnect 142 and the like. The insulating layer 141 can be made of, for example, $SiO_2$. In addition, a contact plug 143 is arranged between the semiconductor region of the semiconductor substrate 120 and the gate electrode 134, and the interconnect 142. The contact plug 143 can be made of a columnar metal.

The insulating film 191 insulates the back surface side of the semiconductor substrate 120. The insulating film 191 can be made of, for example, $SiO_2$.

The in-pixel isolation unit interconnect 181 and the pixel isolation unit interconnect 182 are interconnects arranged on the back surface side of the semiconductor substrate 120 and connected to the in-pixel isolation electrode 108 and the pixel isolation electrode 109. The in-pixel isolation unit interconnect 181 is connected to the in-pixel isolation electrode 108, and the pixel isolation unit interconnect 182 is connected to the pixel isolation electrode 109. The in-pixel isolation unit interconnect 181 and the pixel isolation unit interconnect 182 are connected to the in-pixel isolation electrode 108 and the pixel isolation electrode 109 via opening portions 189 formed in the insulating film 191. The in-pixel isolation unit interconnect 181 and the pixel isolation unit interconnect 182 can be made of metal such as tungsten.

The color filter 192 is an optical filter that transmits light of a predetermined wavelength out of the incident light. As the color filter 192, for example, a color filter that transmits red light, green light, and blue light can be used.

The light-shielding wall 193 is arranged in the region of the color filter 192 at the boundary of the pixel 100 to shield incident light from the adjacent pixel 100. Also, the planarization film 194 planarizes the surface of the color filter 192.

The on-chip lens 195 is a lens that condenses incident light. The on-chip lens 195 is formed in a hemispherical shape, and condenses incident light onto the photoelectric conversion units 101 and 102.

The pixel 100 in FIG. 4 performs imaging using incident light emitted to the back surface side of the semiconductor substrate 120. The imaging element 1 including such a pixel 100 is referred to as a back-illuminated imaging element.

The in-pixel isolation unit 150 and the pixel isolation unit 160 are embedded in the semiconductor substrate 120. As described above, the interface state is formed at the interface of the semiconductor substrate 120 in contact with the in-pixel isolation unit 150 and the pixel isolation unit 160, which causes dark current. Therefore, a charge accumulation region in which holes are accumulated is formed in the vicinity of the interface of the semiconductor substrate 120 to reduce the influence of the dark current. The charge accumulation region can be formed by applying a negative bias voltage to the in-pixel isolation electrode 108 and the pixel isolation electrode 109. By increasing the absolute value of the bias voltage, the width of the charge accumulation region can be increased. The influence of the interface state can further be reduced.

On the other hand, in a case where the absolute value of the bias voltage is increased to increase the width of the charge accumulation region, a saturation charge amount of the photoelectric conversion units 101 and 102 decreases. This is because a semiconductor region capable of accumulating charge is reduced. Since the pixel isolation unit 160 is formed to surround the pixel 100, the influence of the change in the bias voltage of the pixel isolation electrode 109 on the saturation charge amount is large. The bias voltage of the pixel isolation electrode 109 can be, for example, a voltage corresponding to a band gap of Si constituting the semiconductor substrate 120, such as −1.4 V. Alternatively, the bias voltage to be applied to the pixel isolation electrode 109 can be adjusted in accordance with a desired charge accumulation capacity (saturation charge amount to be described below) for the photoelectric conversion units 101 and 102 and the thickness of the insulating member constituting the pixel isolation unit 160, and can be set to a different voltage from the voltage corresponding to the band gap of Si, such as −1.2 V. Furthermore, the absolute value of the bias voltage can be lowered after the charge accumulation region is formed in the pixel isolation unit 160 or the like.

Note that the bias voltage of the in-pixel isolation electrode 108 can be set to the same voltage as the bias voltage of the pixel isolation electrode 109. Also, the bias voltage of the in-pixel isolation electrode 108 can be set to a different voltage from the bias voltage of the pixel isolation electrode 109. Hereinbelow, the bias voltages of the pixel isolation electrode 109 and the in-pixel isolation electrode 108 are referred to as a first bias voltage and a second bias voltage, respectively.

As described above, the photoelectric conversion units 101 and 102 perform photoelectric conversion during the exposure period to generate charges, and accumulate the charges in the semiconductor regions 121 and 122 of the photoelectric conversion units. The charge amount that can be accumulated in the semiconductor region 121 or the like is referred to as a saturation charge amount. Generated charges that exceed the saturation charge amount overflow the semiconductor regions 121 and 122 and transfer to the charge holding units 103 and 104. The charges transferred to the charge holding units 103 and 104 are drained by the reset.

In a case where the amounts of charge generated from the photoelectric conversion units 101 and 102 differ, the amounts of charge accumulated in the semiconductor regions 121 and 122 also have different values. For example, in a case where the on-chip lens 195 is arranged to be shifted toward the photoelectric conversion unit 101 due to variations in the manufacturing process, a large amount of charge is generated and accumulated in the photoelectric conversion unit 101. When the amount of accumulated charge reaches the saturation charge amount during the exposure period, charge overflow occurs in the photoelectric conversion unit 101. On the other hand, since the amount of accumulated charge has not reached the saturation charge amount, the photoelectric conversion unit 102 continues to accumulate charge. This situation causes a problem in the image signal mode, in which the above-described collective transfer is performed. The reason for this is that, in the collective transfer, the charges generated from the photoelectric conversion units 101 and 102 are added, so that the increase in the amount of charge after the addition slows down at the time when the charge overflow occurs in the photoelectric conversion unit 101, and the linearity of the image signal is impaired.

To avoid this, the overflow path 107 is arranged, and charge is transferred to the photoelectric conversion unit 102 before the amount of accumulated charge of the photoelectric conversion unit 101 reaches the saturation charge amount. As a result, the linearity of the image signal can be maintained. By applying the negative second bias voltage to the in-pixel isolation electrode 108, the potential barrier of the overflow path 107 can be adjusted. For example, by applying the second bias voltage of −0.5 V to the in-pixel isolation electrode 108, the potential barrier of the overflow path 107 can be lowered. It is possible to mutually transfer charges between the photoelectric conversion units 101 and 102.

On the other hand, in the phase difference signal mode, in which the individual transfer is performed, the potential barrier of the overflow path 107 is heightened to limit the transfer of charges between the photoelectric conversion units 101 and 102. As a result, the saturation charge amounts of the photoelectric conversion units 101 and 102 increase. The amplitude of the phase difference signal can be increased, and the detection range of the image-plane phase difference can be widened. The second bias voltage in the phase difference signal mode can be, for example, −2 V.

[Configuration of Back-Surface-Side Interconnects]

Figure 5A:
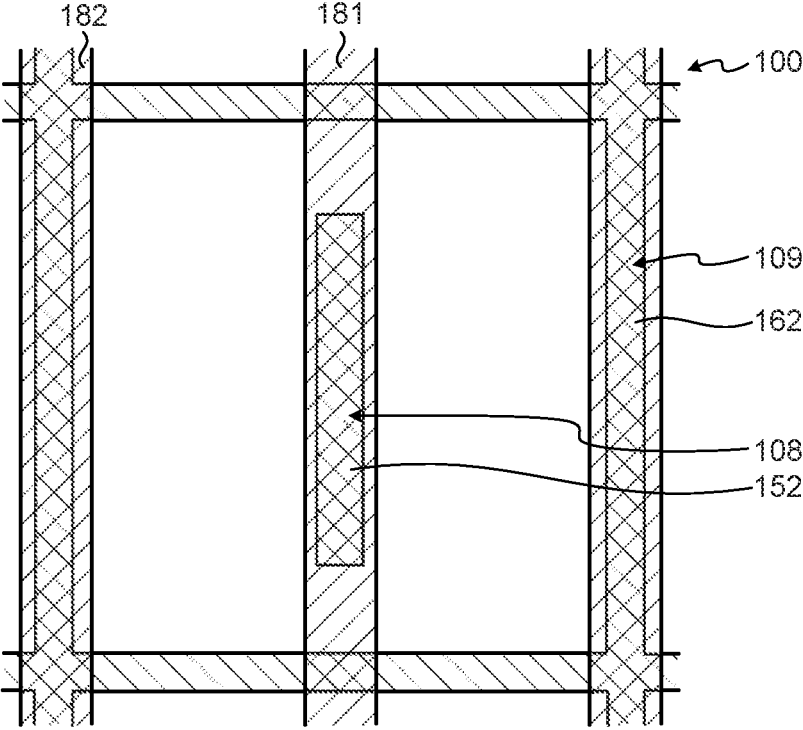
FIG. 5A is a diagram illustrating a configuration example of a back-surface-side interconnect according to the first embodiment of the present disclosure.
Figure 5B:
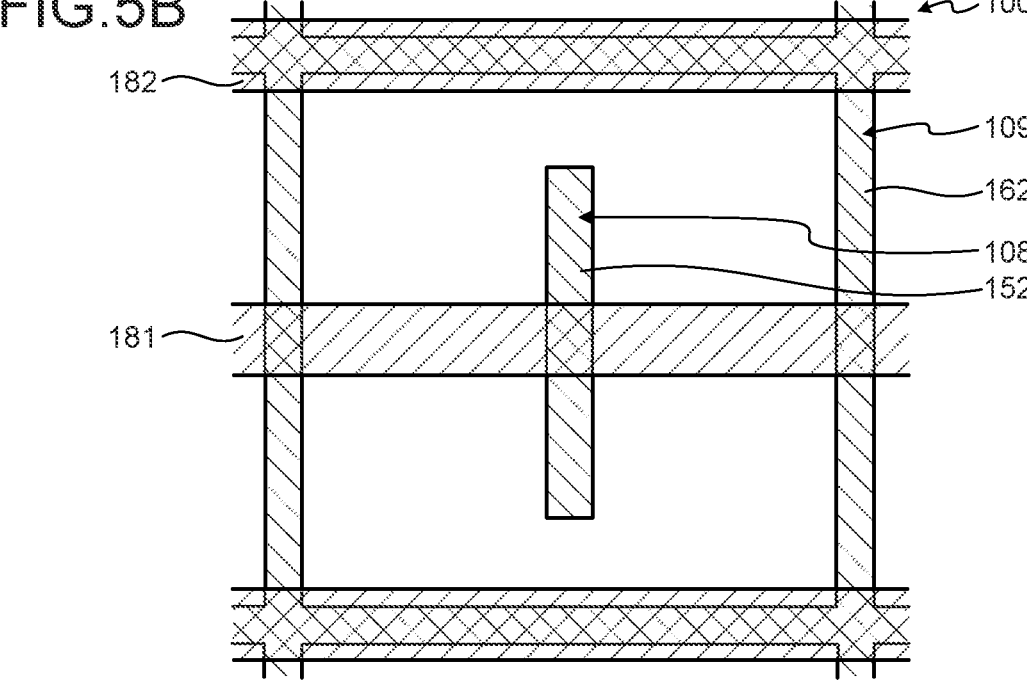
FIG. 5B is a diagram illustrating a configuration example of the back-surface-side interconnect according to the first embodiment of the present disclosure.
Figure 5C:
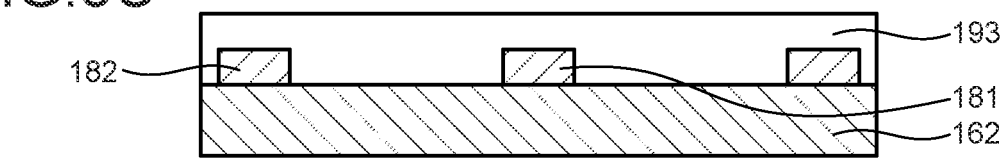
FIG. 5C is a diagram illustrating a configuration example of the back-surface-side interconnect according to the first embodiment of the present disclosure.

FIGS. 5A to 5C are diagrams illustrating configuration examples of back-surface-side interconnects according to the first embodiment of the present disclosure. FIGS. 5A to 5C are diagrams illustrating configuration examples of the in-pixel isolation unit interconnect 181 and the pixel isolation unit interconnect 182.

FIG. 5A is a diagram illustrating an example in which the in-pixel isolation unit interconnect 181 and the pixel isolation unit interconnect 182 are arranged in the same direction as that of the in-pixel isolation electrode 108.

FIG. 5B is a diagram illustrating an example in which the in-pixel isolation unit interconnect 181 and the pixel isolation unit interconnect 182 are arranged in a different direction from that of the in-pixel isolation electrode 108.

FIG. 5C is a diagram illustrating a cross-sectional configuration of the in-pixel isolation unit interconnect 181 and the pixel isolation unit interconnect 182 at the boundary of the pixel 100. The light-shielding wall 193 is arranged at the boundary of the pixel 100. The light-shielding wall 193 is formed to cover the in-pixel isolation unit interconnect 181 and the pixel isolation unit interconnect 182. Furthermore, the thickness of the light-shielding wall 193 is adjusted in accordance with the presence or absence of the in-pixel isolation unit interconnect 181 and the pixel isolation unit interconnect 182. Thus, the surface of the light-shielding wall 193 can be planarized.

Note that the in-pixel isolation unit interconnect 181 and the pixel isolation unit interconnect 182 in FIGS. 5A to 5C can be connected to the interconnect 142 of the interconnect region 140 by a through via penetrating the semiconductor substrate 120. The through via can be arranged in a region outside of the pixel region 3 described in FIG. 1.

[Generation of Image Signal and Phase Difference Signal]

Figure 6:
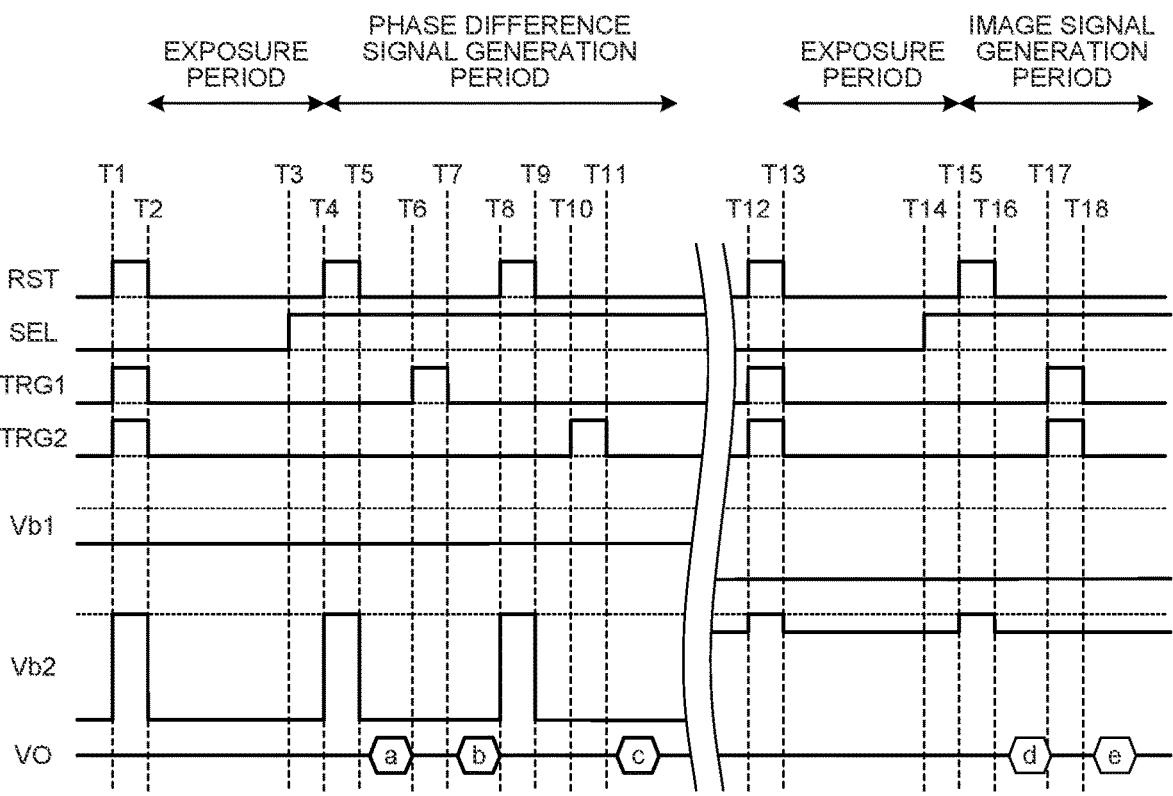
FIG. 6 is a diagram illustrating an example of generation of an image signal and a phase difference signal according to the embodiment of the present disclosure.

FIG. 6 is a diagram illustrating an example of generation of the image signal and the phase difference signal according to the embodiment of the present disclosure. FIG. 6 is a timing chart illustrating an example of generation of the image signal and the phase difference signal in the pixel 100.

In FIG. 6, "RST", "SEL", "TRG1", and "TRG2" represent signals of the signal line RST, the signal line SEL, the signal line TRG1, and the signal line TRG2, respectively. These represent the waveforms of the binarized control signals, and the portion of the value "1" represents a region where the ON signal is transmitted. Also, "Vb1" represents the first bias voltage transmitted by the signal line Vb1. Also, "Vb2" represents the second bias voltage transmitted by the signal line Vb2. Also, the broken line represents the 0 V level. Also, "VO" represents the output of the signal line VO. The first half of FIG. 6 represents the procedure of the phase difference signal mode, and the second half represents the procedure of the image signal mode.

In the initial state of the phase difference signal mode, the value "0" is applied to the signal line RST, the signal line SEL, the signal line TRG1, and the signal line TRG2. Also, a bias voltage of −2 V is applied to the signal line Vb2. Note that a bias voltage of −1.2 V is applied to the signal line Vb1 in the entire period of the phase difference signal mode.

At T1, the ON signal is applied to the signal lines RST, TRG1, and TRG2. As a result, the reset transistor 111 and the charge transfer units 105 and 106 are made conductive, and the photoelectric conversion units 101 and 102 and the charge holding units 103 and 104 are reset. Also, a bias voltage of 0 V is applied to the signal line Vb2. The potential barrier of the overflow path 107 becomes low, and charge is drained.

At T2, the application of the ON signal to the signal lines RST, TRG1, and TRG2 is stopped. As a result, the exposure period is started, and charges generated by photoelectric conversion are accumulated in the photoelectric conversion units 101 and 102. Also, the bias voltage of the signal line Vb2 returns to −2 V.

At T3, the ON signal is applied to the signal line SEL. The application of the ON signal to the signal line SEL continues until the pixels 100 in one row of the pixel unit 3 output the phase difference signals.

At T4, the ON signal is applied to the signal line RST, and the charge holding units 103 and 104 are reset. Also, a bias voltage of 0 V is applied to the signal line Vb2. At T6, the exposure period ends.

At T5, the application of the ON signal to the signal line RST is stopped. Also, the bias voltage of the signal line Vb2 returns to −2 V. In a period before the following timing T6, an image signal a at the time of reset is output from the signal line VO.

At T6, the ON signal is applied to the signal line TRG1. The charge transfer unit 105 is made conductive, and the charge accumulated in the photoelectric conversion unit 101 is transferred to the charge holding units 103 and 104.

At T7, the application of the ON signal to the signal line TRG1 is stopped. In a period before the following timing T8, an image signal b corresponding to the charge of the photoelectric conversion unit 101 is output from the signal line VO. The above-described CDS is executed by the image signal a and the image signal b, and a phase difference signal is generated.

At T8, the ON signal is applied to the signal line RST, and the charge holding units 103 and 104 are reset. Also, a bias voltage of 0 V is applied to the signal line Vb2.

At T9, the application of the ON signal to the signal line RST is stopped. Also, the bias voltage of the signal line Vb2 returns to −2 V.

At T10, the ON signal is applied to the signal line TRG2. The charge transfer unit 106 is made conductive, and charge accumulated in the photoelectric conversion unit 102 is transferred to the charge holding units 103 and 104.

At T11, the application of the ON signal to the signal line TRG2 is stopped. Thereafter, an image signal c corresponding to the charge of the photoelectric conversion unit 102 is output from the signal line VO. The CDS is executed by the above-described image signal a and image signal c, and a second phase difference signal is generated.

In this manner, two phase difference signals can be generated in the phase difference signal mode. Next, the image signal mode will be described.

In the initial state of the image signal mode, the value "0" is applied to the signal line RST, the signal line SEL, the signal line TRG1, and the signal line TRG2. A bias voltage of −0.3 V is applied to the signal line Vb2. Note that a bias voltage of −1.4 V is applied to the signal line Vb1 in the entire period of the image signal mode.

At T12, the ON signal is applied to the signal lines RST, TRG1, and TRG2. As a result, the reset transistor 111 and the charge transfer units 105 and 106 are made conductive, and the photoelectric conversion units 101 and 102 and the charge holding units 103 and 104 are reset. Also, a bias voltage of 0 V is applied to the signal line Vb2.

At T13, the application of the ON signal to the signal lines RST, TRG1, and TRG2 is stopped. Also, the bias voltage of the signal line Vb2 returns to −0.3 V. As a result, the exposure period is started, and charges generated by photoelectric conversion are accumulated in the photoelectric conversion units 101 and 102.

At T14, the ON signal is applied to the signal line SEL. The application of the ON signal to the signal line SEL continues until the pixels 100 in one row of the pixel unit 3 output the image signals.

At T15, the ON signal is applied to the signal line RST, and the charge holding units 103 and 104 are reset. Also, a bias voltage of 0 V is applied to the signal line Vb2. At T15, the exposure period ends.

At T16, the application of the ON signal to the signal line RST is stopped. Also, the bias voltage of the signal line Vb2 returns to −0.3 V. In a period before the following timing T17, an image signal d at the time of reset is output from the signal line VO.

At T17, the ON signal is applied to the signal lines TRG1 and TRG2. The charge transfer units 105 and 106 are made conductive, and the charges accumulated in the photoelectric conversion units 101 and 102 are transferred to the charge holding units 103 and 104.

At T18, the application of the ON signal to the signal lines TRG1 and TRG2 is stopped. Thereafter, an image signal e corresponding to the charges of the photoelectric conversion units 101 and 102 is output from the signal line VO. The CDS is executed by the image signal d and the image signal e, and an image signal is generated.

The phase difference signal and the image signal can be generated in the above procedure. Note that the above-described bias voltages of the signal lines Vb1 and Vb2 are described as examples, and other bias voltage values can also be applied.

[Method for Manufacturing Imaging Element]

Figure 7A:
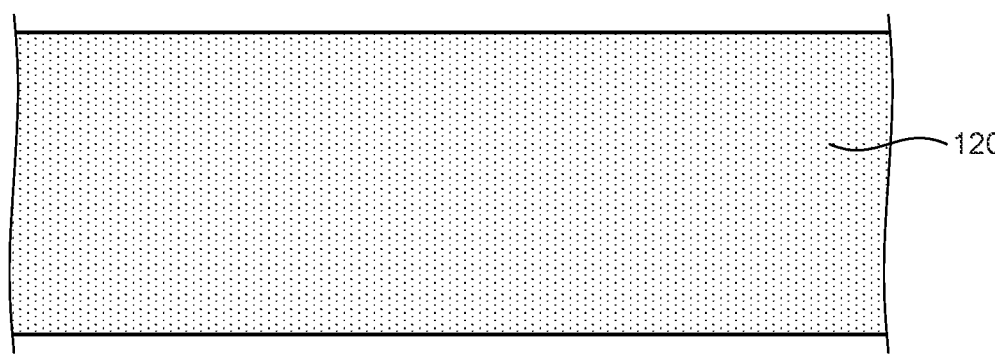
FIG. 7A is a diagram illustrating an example of a method for manufacturing an imaging element according to the first embodiment of the present disclosure.
Figure 7B:
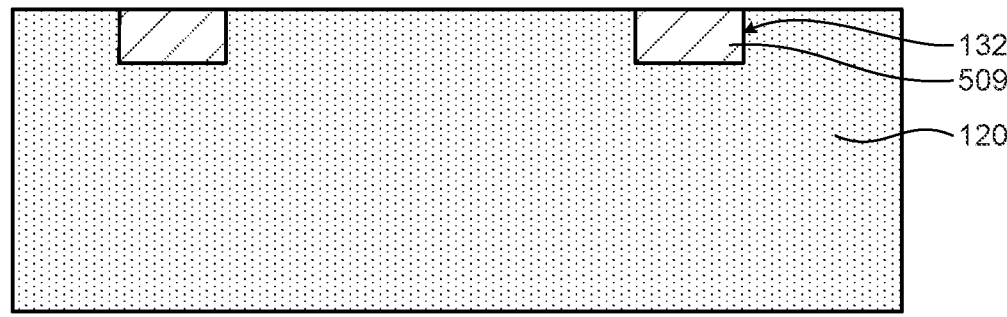
FIG. 7B is a diagram illustrating the example of the method for manufacturing the imaging element according to the first embodiment of the present disclosure.
Figure 7C:
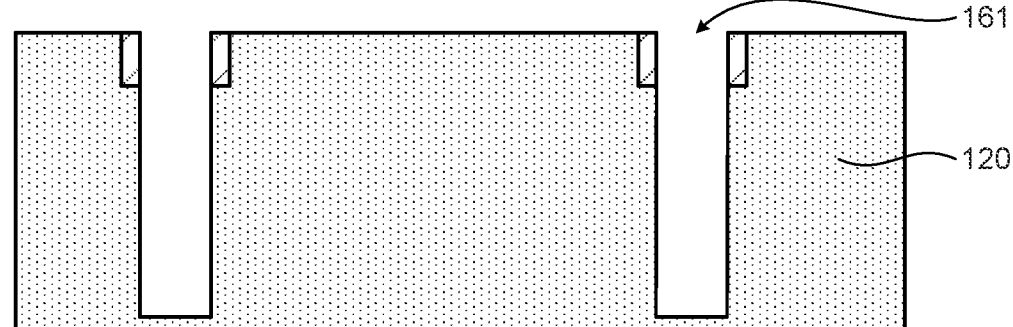
FIG. 7C is a diagram illustrating the example of the method for manufacturing the imaging element according to the first embodiment of the present disclosure.
Figure 7D:
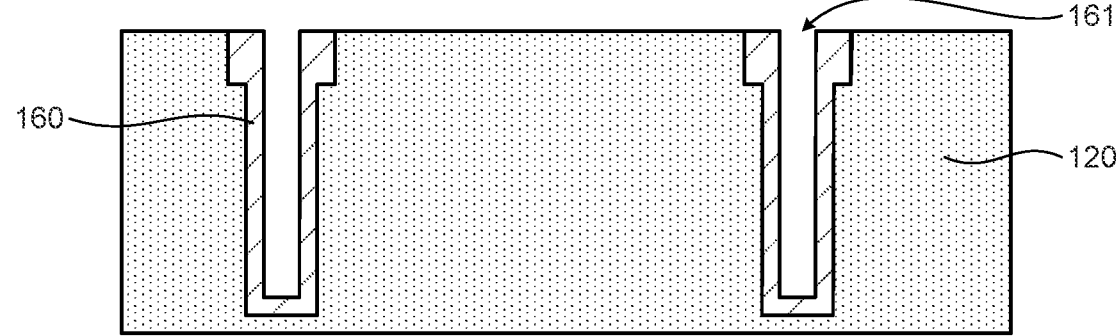
FIG. 7D is a diagram illustrating the example of the method for manufacturing the imaging element according to the first embodiment of the present disclosure.
Figure 7E:
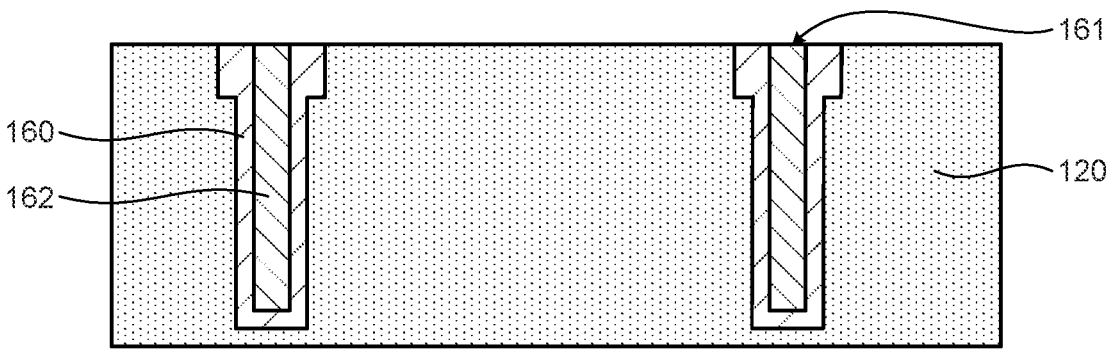
FIG. 7E is a diagram illustrating the example of the method for manufacturing the imaging element according to the first embodiment of the present disclosure.
Figure 7F:
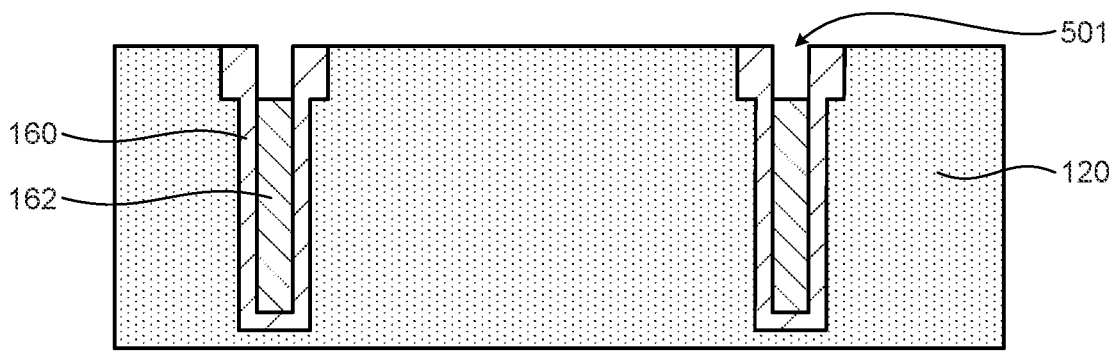
FIG. 7F is a diagram illustrating the example of the method for manufacturing the imaging element according to the first embodiment of the present disclosure.
Figure 7G:
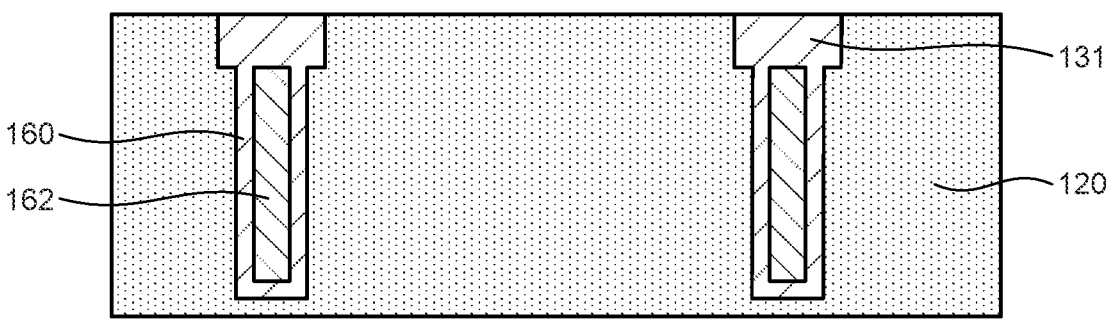
FIG. 7G is a diagram illustrating the example of the method for manufacturing the imaging element according to the first embodiment of the present disclosure.
Figure 7H:
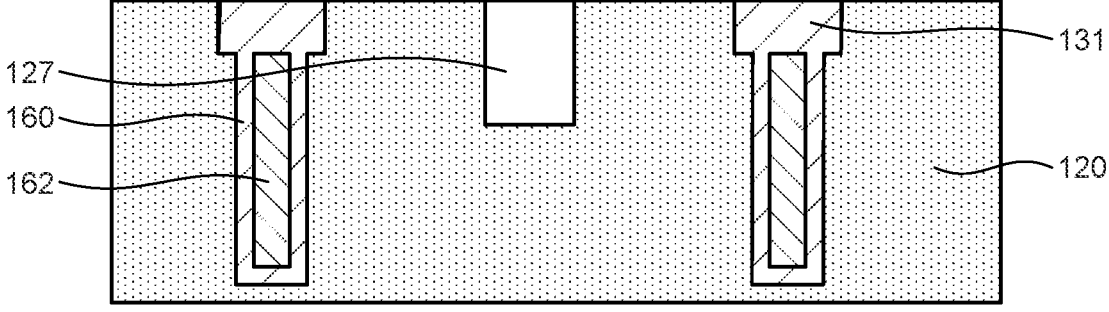
FIG. 7H is a diagram illustrating the example of the method for manufacturing the imaging element according to the first embodiment of the present disclosure.
Figure 7I:
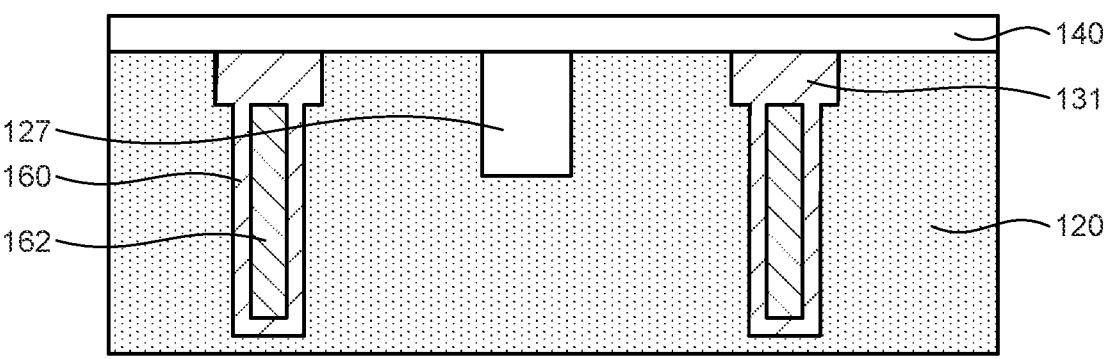
FIG. 7I is a diagram illustrating the example of the method for manufacturing the imaging element according to the first embodiment of the present disclosure.
Figure 7J:
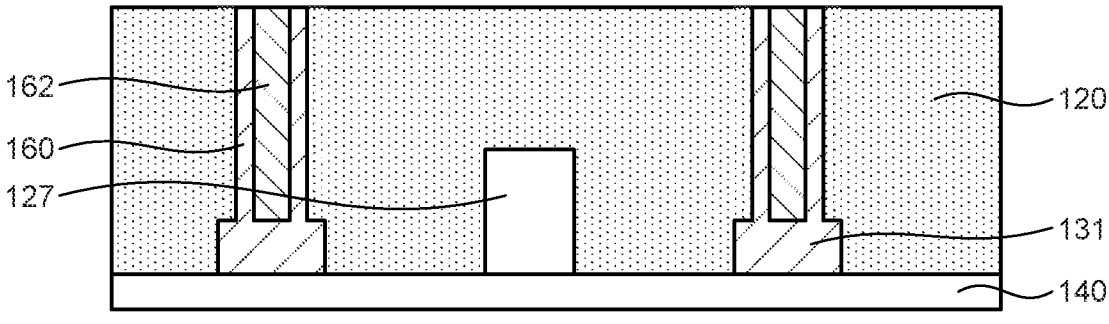
FIG. 7J is a diagram illustrating the example of the method for manufacturing the imaging element according to the first embodiment of the present disclosure.
Figure 7K:
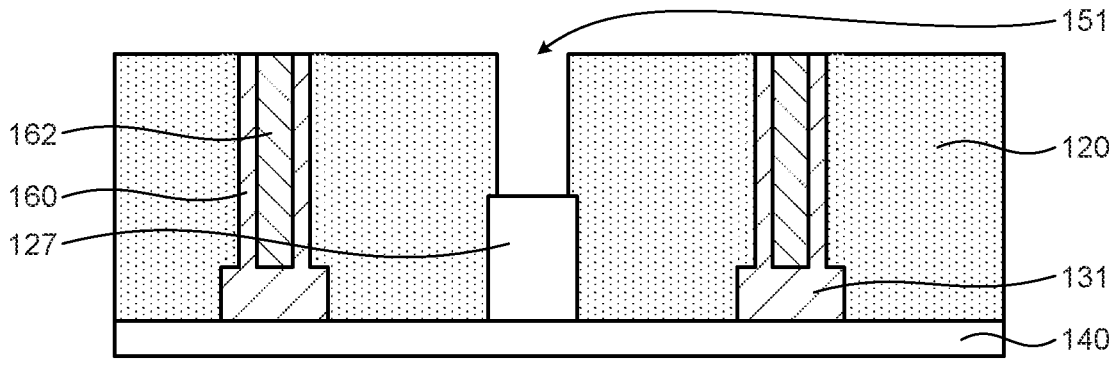
FIG. 7K is a diagram illustrating the example of the method for manufacturing the imaging element according to the first embodiment of the present disclosure.
Figure 7L:
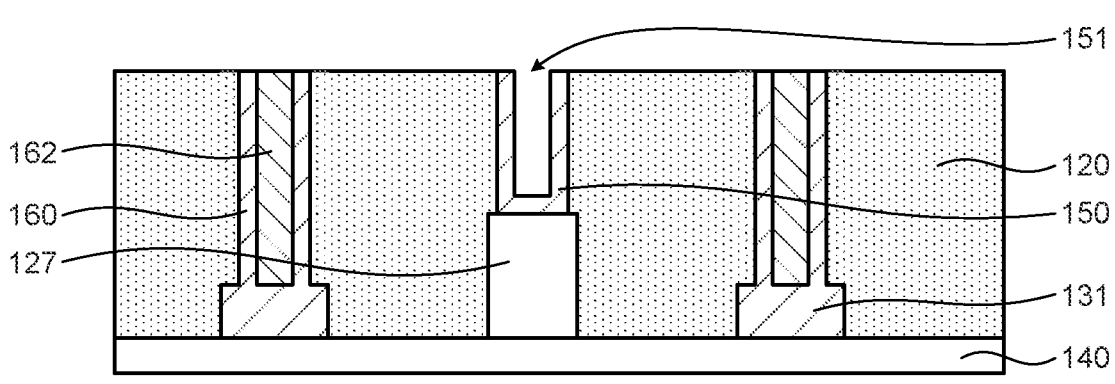
FIG. 7L is a diagram illustrating the example of the method for manufacturing the imaging element according to the first embodiment of the present disclosure.
Figure 7M:
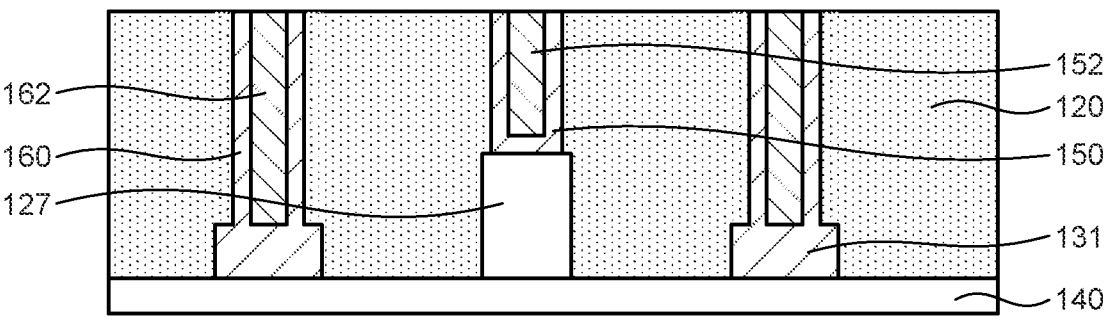
FIG. 7M is a diagram illustrating the example of the method for manufacturing the imaging element according to the first embodiment of the present disclosure.
Figure 7N:
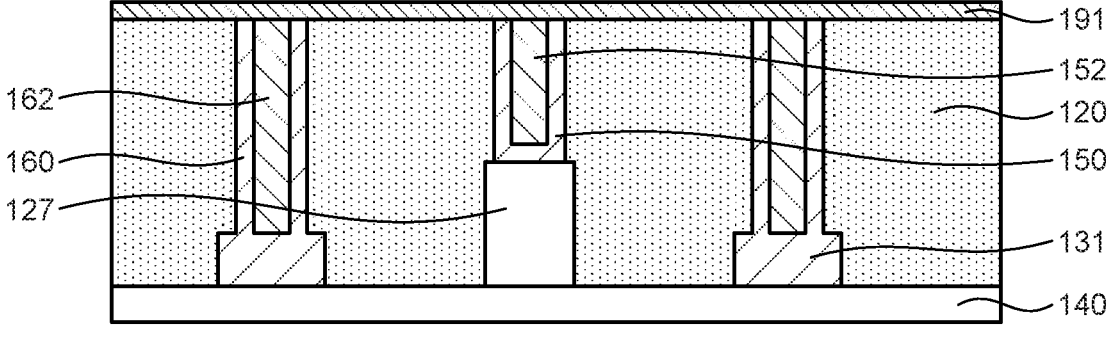
FIG. 7N is a diagram illustrating the example of the method for manufacturing the imaging element according to the first embodiment of the present disclosure.
Figure 7O:
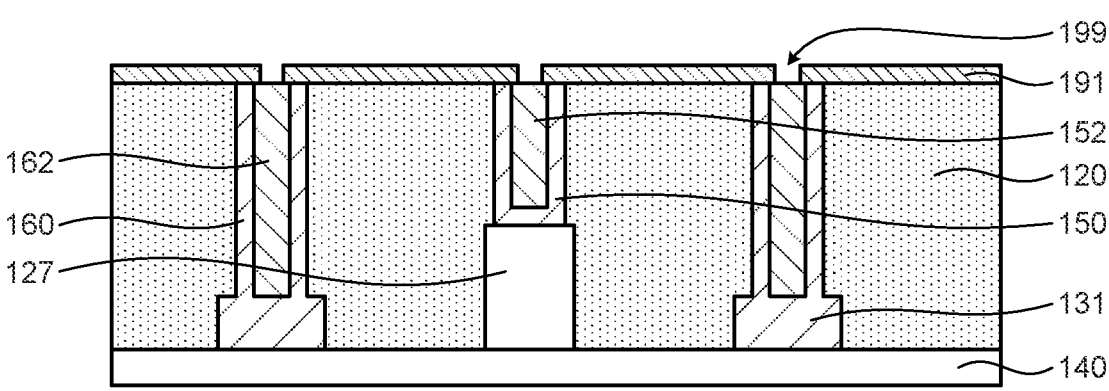
FIG. 7O is a diagram illustrating the example of the method for manufacturing the imaging element according to the first embodiment of the present disclosure.
Figure 7P:
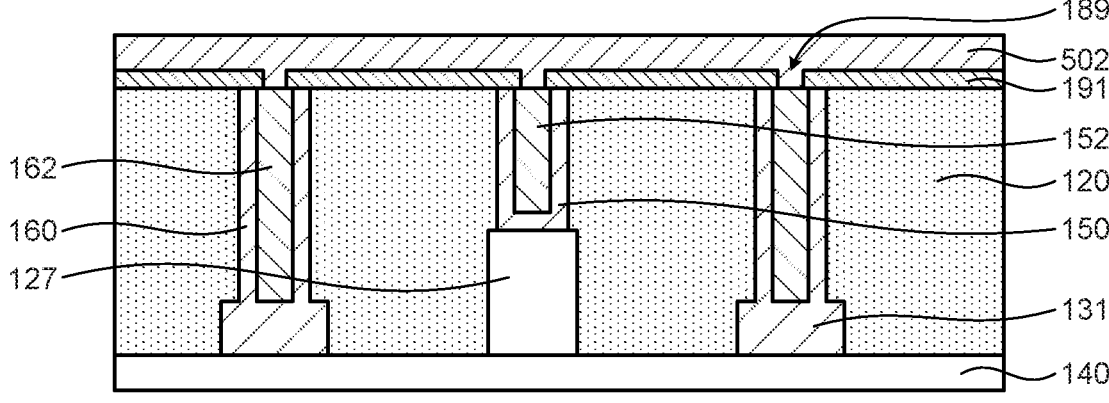
FIG. 7P is a diagram illustrating the example of the method for manufacturing the imaging element according to the first embodiment of the present disclosure.
Figure 7Q:
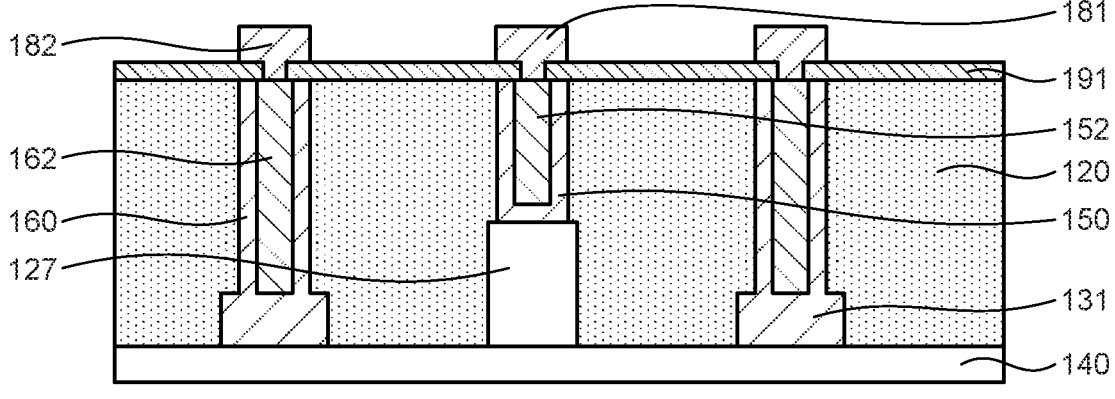
FIG. 7Q is a diagram illustrating the example of the method for manufacturing the imaging element according to the first embodiment of the present disclosure.
Figure 7R:
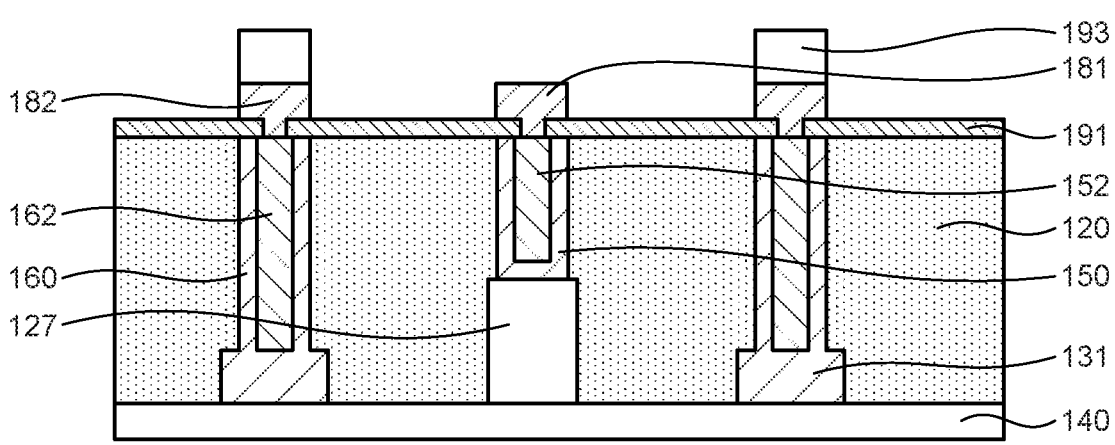
FIG. 7R is a diagram illustrating the example of the method for manufacturing the imaging element according to the first embodiment of the present disclosure.
Figure 7S:
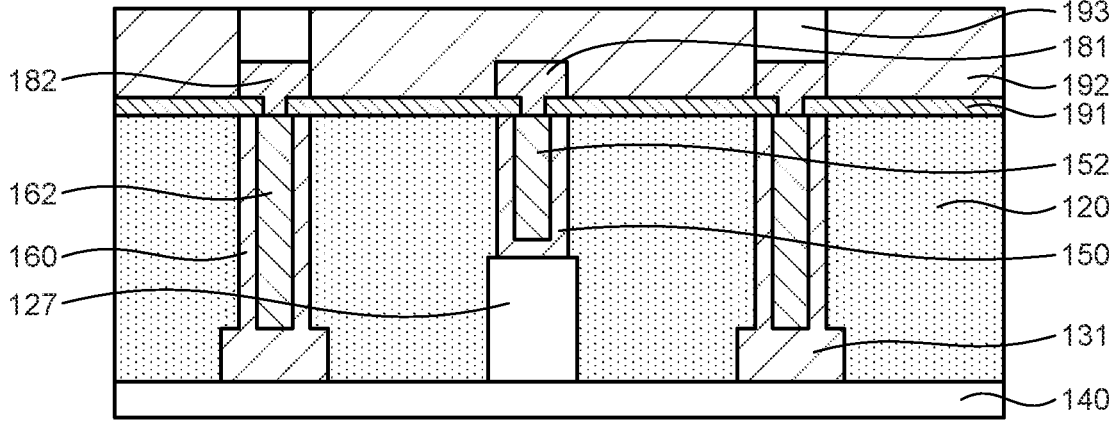
FIG. 7S is a diagram illustrating the example of the method for manufacturing the imaging element according to the first embodiment of the present disclosure.

FIGS. 7A to 7S are diagrams illustrating an example of a method for manufacturing the imaging element according to the first embodiment of the present disclosure. FIGS. 7A to 7S are diagrams illustrating an example of a process for manufacturing the imaging element 1.

First, a well region is formed in the semiconductor substrate 120, and the semiconductor region 121 (not illustrated) and the like are formed (FIG. 7A).

Subsequently, the groove portion 132 is formed in a region on the front surface side of the semiconductor substrate 120 where the isolation unit 131 is to be arranged. This can be performed by dry etching. Subsequently, an insulating film 509 is arranged in the groove portion 132 (FIG. 7B). This can be performed by filling the groove portion 132 with an insulating member such as SiO₂ using chemical vapor deposition (CVD) or the like and planarizing the surface.

Subsequently, the groove portion 161 is formed in a region on the front surface side of the semiconductor substrate 120 where the pixel isolation unit 160 is to be arranged (FIG. 7C). This can be performed by dry etching.

Subsequently, an insulating member is arranged on the wall surface of the groove portion 161 to form the pixel isolation unit 160 (FIG. 7D). This can be performed by forming a film of SiO₂ or the like using CVD or the like.

Subsequently, the electrode 162 is arranged in the groove portion 161 to form the pixel isolation electrode 109 (FIG. 7E). This can be performed by forming a film of tungsten or the like using CVD or the like.

Subsequently, the front surface side of the pixel isolation electrode 109 is removed by etching to form an opening portion 501 (FIG. 7F).

Subsequently, an insulating member is arranged in the opening portion 501 to form the isolation unit 131 (FIG. 7G). This can be performed by forming a film of SiO$_2$ or the like using CVD or the like.

Subsequently, the in-pixel isolation region 127 is formed on the front surface side of the semiconductor substrate 120 (FIG. 7H). This can be performed by ion implantation.

Subsequently, the insulating film 133 (not illustrated) and the gate electrodes 134 and 135 (not illustrated) are formed on the front surface side of the semiconductor substrate 120. Subsequently, the interconnect region 140 is formed (FIG. 7I).

Subsequently, the semiconductor substrate 120 is turned upside down, and the back surface side is ground to be thinned. The semiconductor substrate 120 can be ground by chemical mechanical polishing (CMP). As a result, the pixel isolation unit 160 and the pixel isolation electrode 109 are exposed to the back surface side of the semiconductor substrate 120 (FIG. 7J).

Subsequently, the groove portion 151 is formed in a region on the back surface side of the semiconductor substrate 120 where the in-pixel isolation unit 150 is to be arranged (FIG. 7K). This can be performed by dry etching.

Subsequently, an insulating member is arranged on the wall surface of the groove portion 151 to form the in-pixel isolation unit 150 (FIG. 7L). This can be performed by forming a film of SiO$_2$ or the like using CVD or the like.

Subsequently, the electrode 152 is arranged in the groove portion 151 to form the in-pixel isolation electrode 108 (FIG. 7M). This can be performed by forming a film of tungsten or the like using CVD or the like.

Subsequently, the insulating film 191 is arranged on the back surface side of the semiconductor substrate 120 (FIG. 7N). This can be performed by forming a film of SiO$_2$ or the like using CVD or the like.

Subsequently, opening portions 199 are formed in the insulating film 191 adjacent to the in-pixel isolation electrode 108 and the pixel isolation electrode 109 (FIG. 7O).

Subsequently, a material film 502 for the in-pixel isolation unit interconnect 181 and the like is arranged on the back surface side of the semiconductor substrate 120 including the opening portions 199 (FIG. 7P). This can be performed by forming a film of tungsten using CVD or the like.

Subsequently, the material film 502 is etched to form the in-pixel isolation unit interconnect 181 and the pixel isolation unit interconnect 182 (FIG. 7Q).

Subsequently, the light-shielding wall 193 is arranged at the boundary of the pixel 100 on the back surface side of the semiconductor substrate 120 (FIG. 7R).

Subsequently, the color filter 192 is formed on the back surface side of the semiconductor substrate 120 (FIG. 7S). Thereafter, the planarization film 194 and the on-chip lens 195 are arranged. In the aforementioned process, the imaging element 1 can be manufactured.

In this manner, in the imaging element 1 according to the first embodiment of the present disclosure, the photoelectric conversion units 101 and 102 arranged in the pixel 100 can be isolated from each other by arranging the in-pixel isolation unit 150 in the pixel 100. By arranging the in-pixel isolation electrode 108 in the in-pixel isolation unit 150 and applying a bias voltage, the charge accumulation region can be formed, and the dark current can be reduced.

2. Second Embodiment

In the imaging element 1 according to the first embodiment described above, the pixel isolation unit 160 is arranged at the boundary of the pixel 100. On the other hand, the imaging element 1 according to a second embodiment of the present disclosure is different from the above-described first embodiment in that the pixel isolation unit 160 formed to penetrate the semiconductor substrate 120 of the pixel 100 is arranged.

[Configuration of Cross-Section of Imaging Element]

Figure 8:
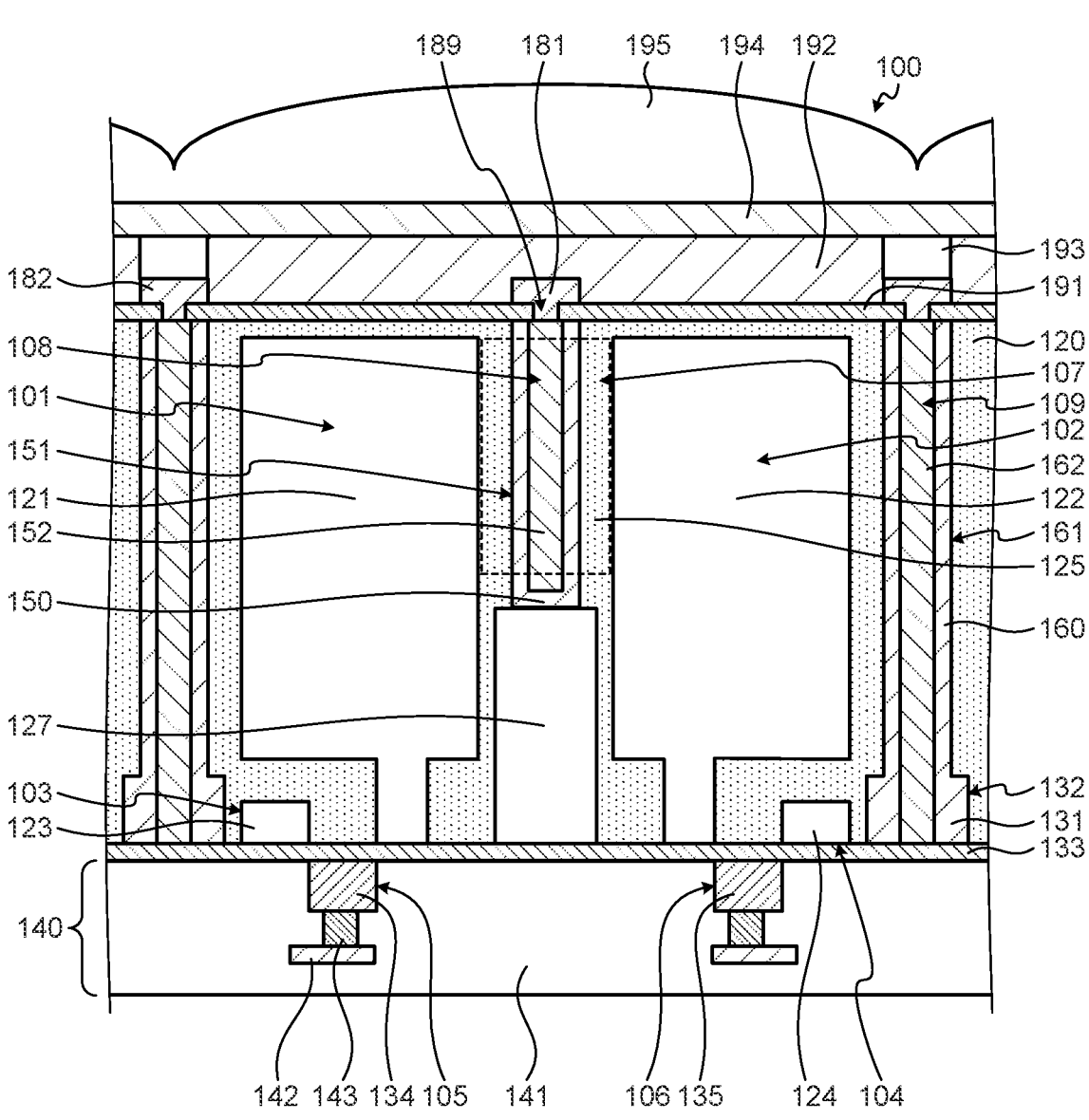
FIG. 8 is a cross-sectional view illustrating a configuration example of the pixel according to a second embodiment of the present disclosure.

FIG. 8 is a cross-sectional view illustrating a configuration example of the pixel according to the second embodiment of the present disclosure. FIG. 8 is a cross-sectional view illustrating a configuration example of the pixel 100 similarly to FIG. 4. The pixel 100 in FIG. 8 is different from the pixel 100 in FIG. 4 in including the pixel isolation unit 160 formed to penetrate the semiconductor substrate 120.

The pixel isolation unit 160 and the pixel isolation electrode 109 in FIG. 8 are formed to penetrate the semiconductor substrate 120. Note that the isolation unit 131 constitutes a part of the pixel isolation unit 160. Since the pixel isolation electrode 109 is formed to penetrate the semiconductor substrate 120, the range of the charge accumulation region at the boundary of the pixel 100 can be widened. Note that the pixel isolation electrode 109 in FIG. 8 can be formed by omitting the steps in FIGS. 7F and 7G.

The configuration of the imaging element 1 other than this is similar to the configuration of the imaging element 1 in the first embodiment of the present disclosure, and thus description thereof is omitted.

As described above, the imaging element 1 according to the second embodiment of the present disclosure includes the pixel isolation unit 160 and the pixel isolation electrode 109 formed to penetrate the semiconductor substrate 120. As a result, the charge accumulation region at the boundary of the pixel 100 can be widened, and the dark current can further be reduced.

3. Third Embodiment

In the imaging element 1 according to the second embodiment described above, the interconnect of the pixel isolation electrode 109 is arranged on the back surface side of the semiconductor substrate 120. On the other hand, the imaging element 1 according to a third embodiment of the present disclosure is different from the above-described second embodiment in that the interconnect of the pixel isolation electrode 109 is arranged on the front surface side of the semiconductor substrate 120.

[Configuration of Cross-Section of Imaging Element]

Figure 9:
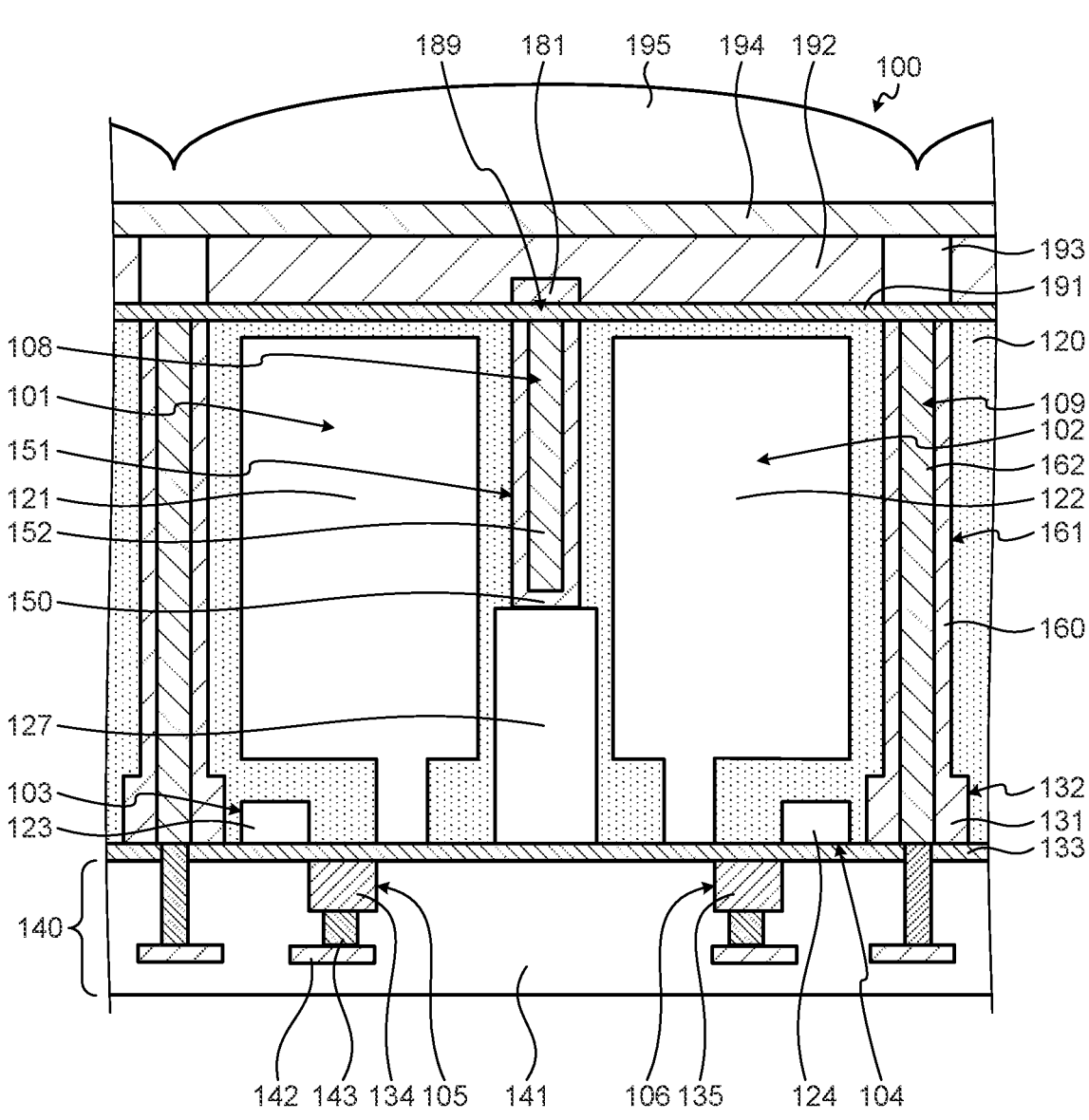
FIG. 9 is a cross-sectional view illustrating a configuration example of the pixel according to a third embodiment of the present disclosure.

FIG. 9 is a cross-sectional view illustrating a configuration example of the pixel according to the third embodiment of the present disclosure. FIG. 9 is a cross-sectional view illustrating a configuration example of the pixel 100 similarly to FIG. 8. The pixel 100 in FIG. 9 is different from the pixel 100 in FIG. 8 in that the contact plug 143 and the interconnect 142 are connected to the pixel isolation electrode 109 instead of the pixel isolation unit interconnect 182.

The pixel isolation electrode 109 is formed to penetrate the semiconductor substrate 120. Therefore, by forming an opening portion in the insulating film 133 adjacent to the pixel isolation electrode 109 and arranging the contact plug 143 in the opening portion, the pixel isolation electrode 109 can be connected to the interconnect 142. In the pixel isolation electrode 109 in FIG. 9, the first bias voltage is applied via the interconnect 142 in the interconnect region 140. In the pixel 100 in FIG. 9, the pixel isolation unit interconnect 182 can be omitted.

The configuration of the imaging element 1 other than this is similar to the configuration of the imaging element 1 in the second embodiment of the present disclosure, and thus description thereof is omitted.

In this manner, in the imaging element 1 according to the third embodiment of the present disclosure, the first bias voltage is applied to the pixel isolation electrode 109 using the contact plug 143 and the interconnect 142 in the interconnect region 140. The pixel isolation unit interconnect 182 can be omitted, and the configuration of the pixel 100 can be simplified.

4. Fourth Embodiment

In the imaging element 1 according to the first embodiment described above, the in-pixel isolation unit interconnect 181 and the pixel isolation unit interconnect 182 made of metal such as tungsten are used. On the other hand, the imaging element 1 according to a fourth embodiment of the present disclosure is different from the above-described first embodiment in that a back-surface-side interconnect made of a transparent member is used.

[Configuration of Back-Surface-Side Interconnects]

Figure 10A:
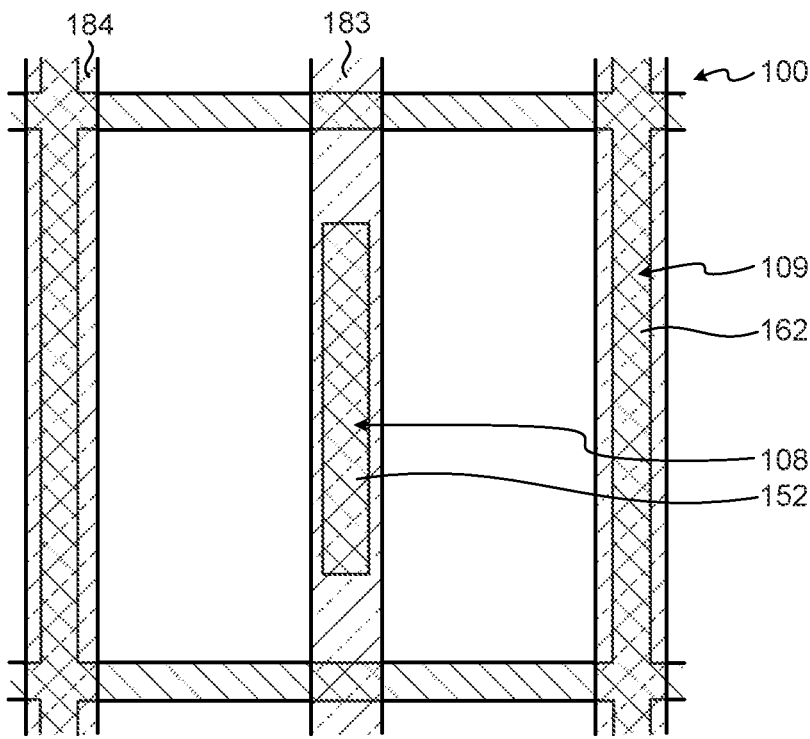
FIG. 10A is a diagram illustrating a configuration example of a back-surface-side interconnect according to a fourth embodiment of the present disclosure.
Figure 10B:
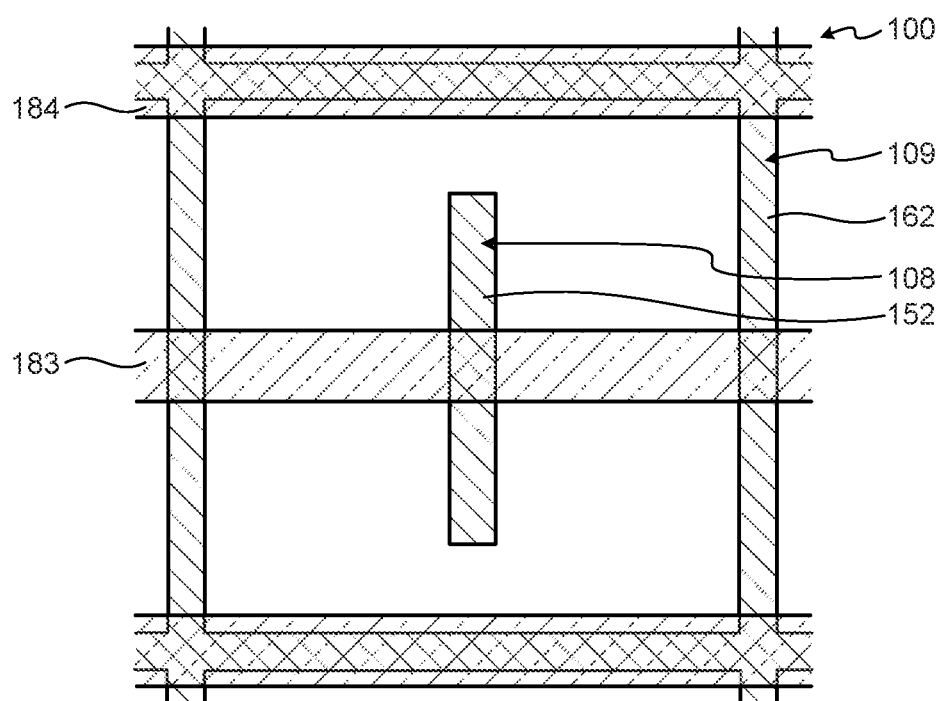
FIG. 10B is a diagram illustrating a configuration example of the back-surface-side interconnect according to the fourth embodiment of the present disclosure.

FIGS. 10A and 10B are diagrams illustrating configuration examples of back-surface-side interconnects according to the fourth embodiment of the present disclosure. FIGS. 10A and 10B are plan views illustrating configuration examples of back-surface-side interconnects, similarly to FIGS. 5A and 5B. The pixel 100 in FIGS. 10A and 10B is different from those in FIGS. 5A and 5B in including an in-pixel isolation unit interconnect 183 and a pixel isolation unit interconnect 184 instead of the in-pixel isolation unit interconnect 181 and the pixel isolation unit interconnect 182.

The in-pixel isolation unit interconnect 183 and the pixel isolation unit interconnect 184 are interconnects made of transparent members such as transparent conductive films. The in-pixel isolation unit interconnect 183 is connected to the in-pixel isolation electrode 108, and the pixel isolation unit interconnect 184 is connected to the pixel isolation electrode 109. The in-pixel isolation unit interconnect 183 and the pixel isolation unit interconnect 184 can include, for example, indium tin oxide (ITO), In$_2$O$_3$, zinc oxide (ZnO), indium zinc oxide (IZO), and In—Ga—Zn—O (IGZO).

FIG. 10A illustrates an example in which the in-pixel isolation unit interconnect 183 and the pixel isolation unit interconnect 184 are arranged in the same direction as that of the in-pixel isolation electrode 108, and FIG. 10B illustrates an example in which the in-pixel isolation unit interconnect 183 and the pixel isolation unit interconnect 184 are arranged in a different direction from that of the in-pixel isolation electrode 108.

[Other Configurations of Back-Surface-Side Interconnects]

Figure 11A:
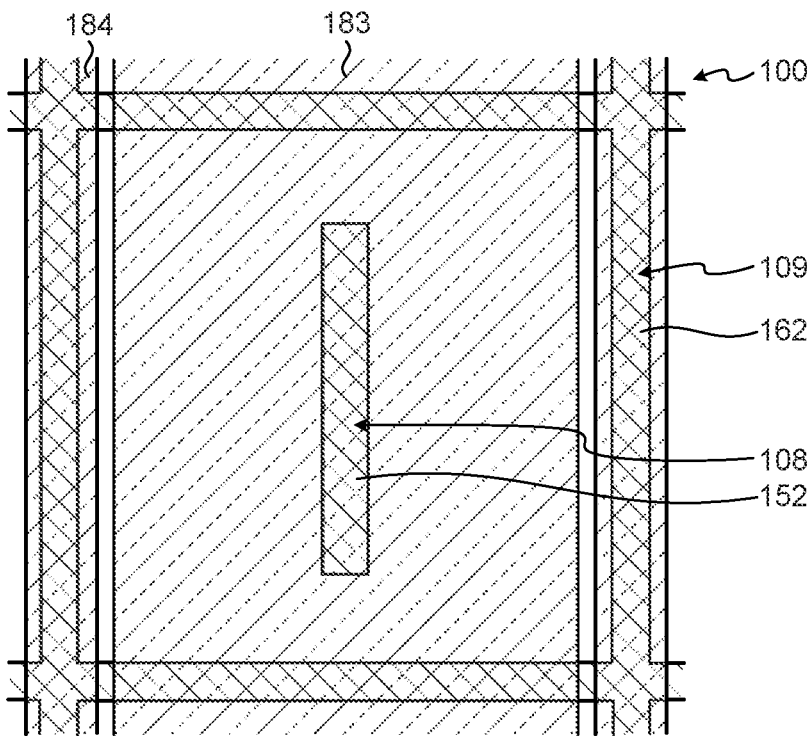
FIG. 11A is a diagram illustrating another configuration example of the back-surface-side interconnect according to the fourth embodiment of the present disclosure.
Figure 11B:
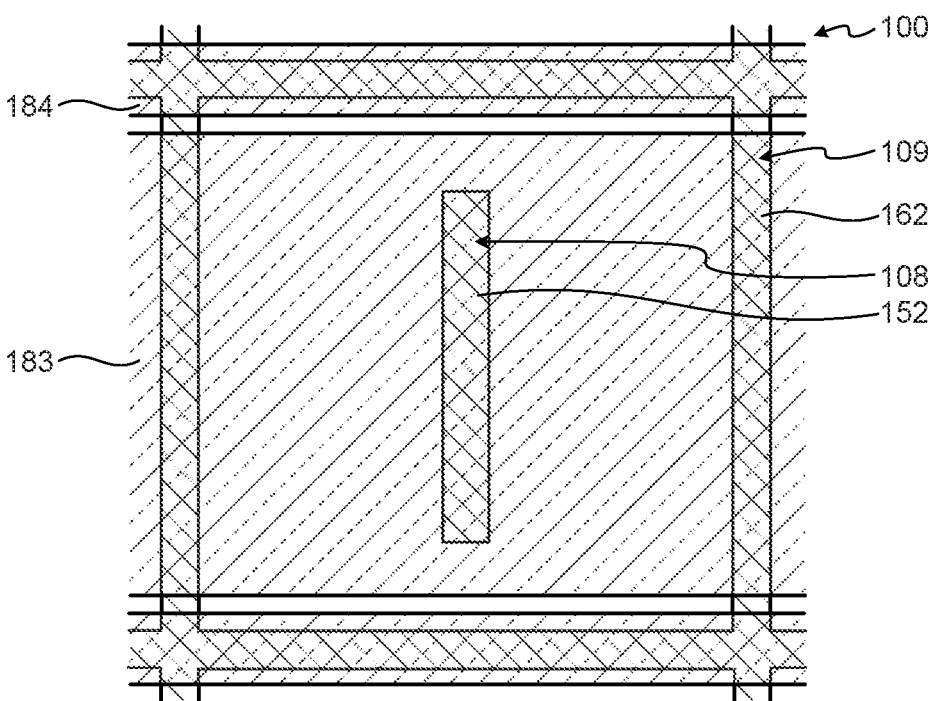
FIG. 11B is a diagram illustrating another configuration example of the back-surface-side interconnect according to the fourth embodiment of the present disclosure.

FIGS. 11A and 11B are diagrams illustrating other configuration examples of the back-surface-side interconnects according to the fourth embodiment of the present disclosure. FIGS. 11A and 11B are plan views illustrating configuration examples of the back-surface-side interconnects, similarly to FIGS. 10A and 10B. The in-pixel isolation unit interconnect 183 in FIGS. 11A and 11B is different from the in-pixel isolation unit interconnect 183 in FIGS. 10A and 10B in that the width is different from that of the pixel isolation unit interconnect 184.

The in-pixel isolation unit interconnect 183 in FIGS. 11A and 11B is formed to cover a wide range on the back side of the pixel 100. In general, a transparent conductive film has lower conductivity than a metal film. Therefore, the in-pixel isolation unit interconnect 183 has a higher resistance value than the in-pixel isolation unit interconnect 181 made of a metal film. As illustrated in FIG. 6, the second bias voltage changes frequently. In a case where the resistance value of the in-pixel isolation unit interconnect 183 that transmits the second bias voltage is high, the delay time increases, and different pixels 100 have different second bias voltages. Therefore, non-uniformity occurs among the image signals.

To avoid this, as illustrated in FIGS. 11A and 11B, the in-pixel isolation unit interconnect 183 is widened. As a result, the resistance of the in-pixel isolation unit interconnect 183 can be lowered, and the delay time in transmission of the second bias voltage can be shortened.

Modification Example

Figure 11C:
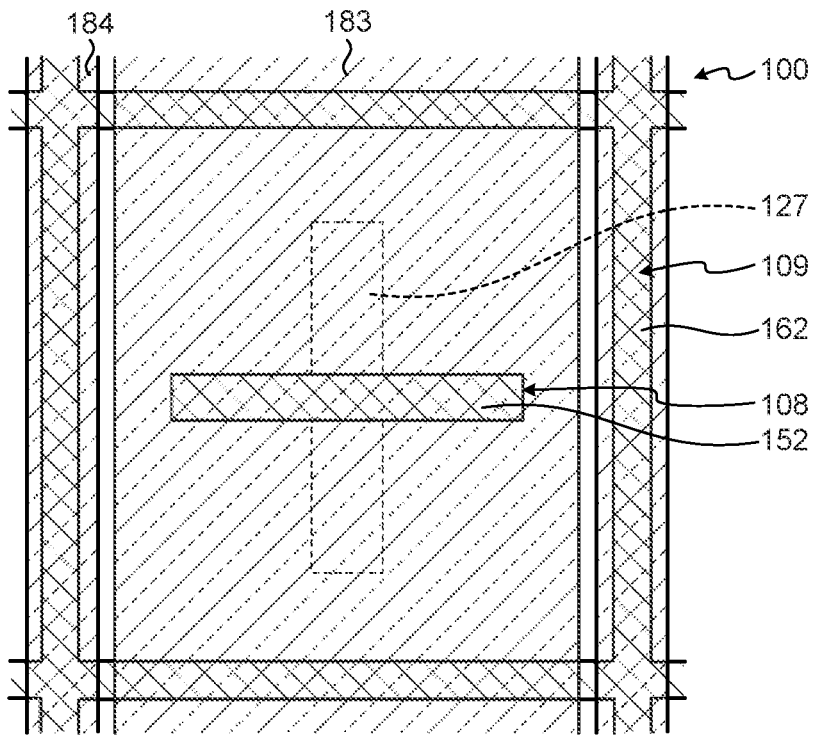
FIG. 11C is a diagram illustrating a modification example of the configuration of the pixel 100 according to the fourth embodiment of the present disclosure.
Figure 11D:
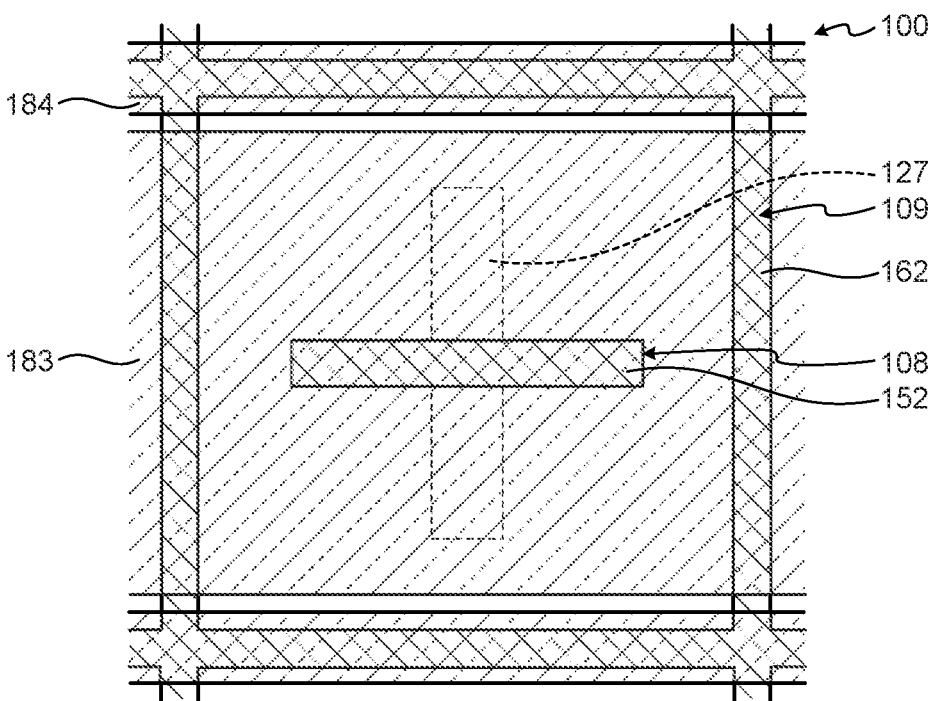
FIG. 11D is a diagram illustrating a modification example of the configuration of the pixel 100 according to the fourth embodiment of the present disclosure.

FIGS. 11C and 11D are diagrams illustrating a modification example of the configuration of the pixel 100 according to the fourth embodiment of the present disclosure. FIGS. 11C and 11D illustrate an example in which the in-pixel isolation electrode 108 is arranged in a different direction from that of the in-pixel isolation region 127 and is arranged in a direction perpendicular to the boundary between the photoelectric conversion units 101 and 102. The in-pixel isolation electrode 108 enables incident light to be reflected on a region of the photoelectric conversion unit 101 or the like. The conversion efficiency of the pixel 100 can be improved.

The configuration of the imaging element 1 other than this is similar to the configuration of the imaging element 1 in the first embodiment of the present disclosure, and thus description thereof is omitted.

In this manner, the imaging element 1 according to the fourth embodiment of the present disclosure includes, in the pixel 100, the in-pixel isolation unit interconnect 183 and the pixel isolation unit interconnect 184 made of transparent members. As a result, the amount of light incident on the photoelectric conversion unit 101 can be increased. The sensitivity of the pixel 100 can be improved.

5. Fifth Embodiment

The imaging element 1 according to the first embodiment described above includes the in-pixel isolation unit 150 and the pixel isolation unit 160 arranged on the back surface side of the semiconductor substrate 120. On the other hand, the imaging element 1 according to a fifth embodiment of the present disclosure is different from the above-described first embodiment in that an in-pixel isolation unit and a pixel isolation unit are provided on each of the surfaces of the semiconductor substrate 120.

[Configuration of Cross-Section of Imaging Element]

Figure 12:
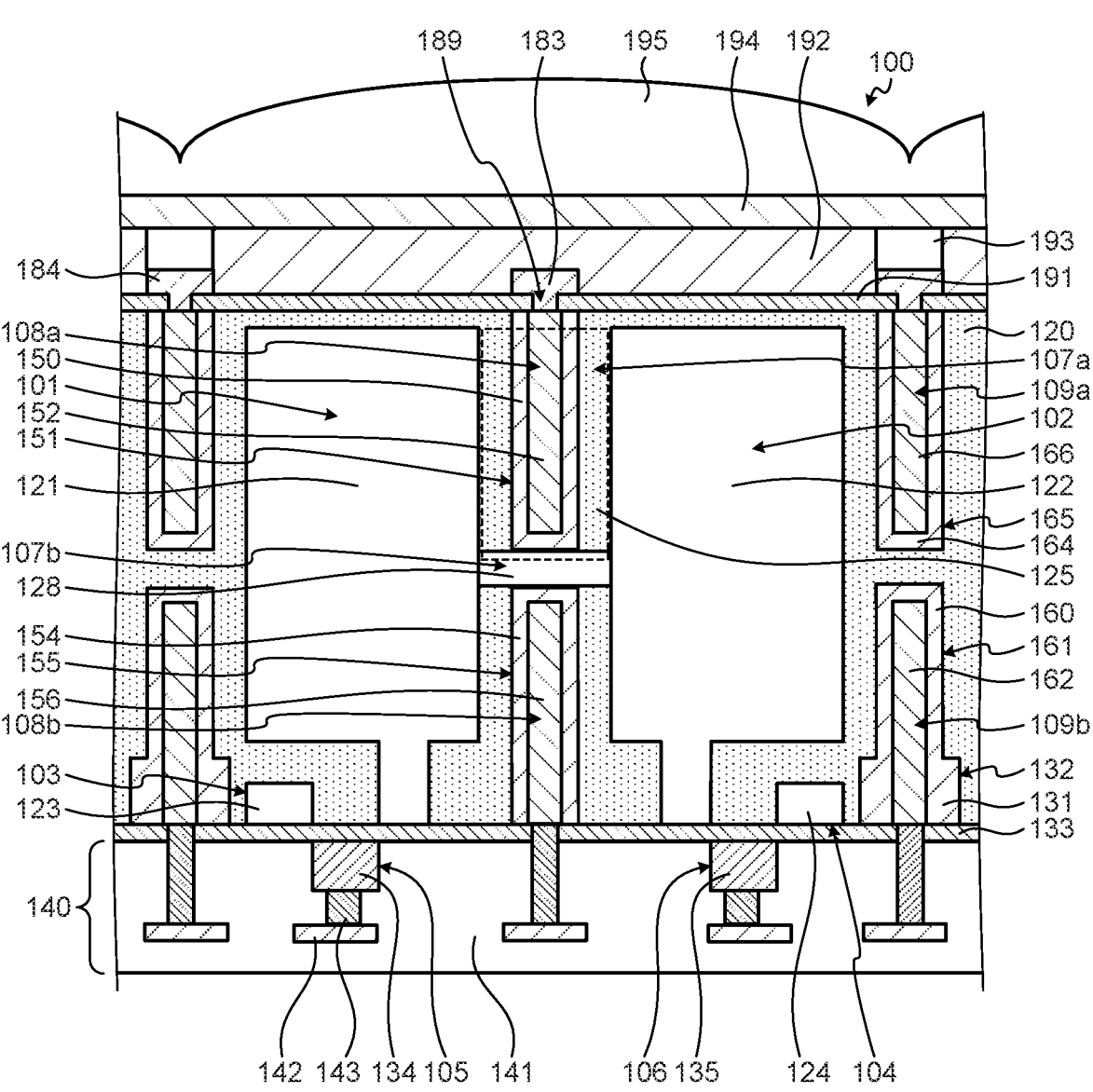
FIG. 12 is a cross-sectional view illustrating a configuration example of the pixel according to the fifth embodiment of the present disclosure.

FIG. 12 is a cross-sectional view illustrating a configuration example of the pixel according to the fifth embodiment of the present disclosure. FIG. 12 is a cross-sectional view illustrating a configuration example of the pixel 100 similarly to FIG. 4. The pixel 100 in FIG. 12 is different from the pixel 100 in FIG. 4 in that an in-pixel isolation unit 154 is arranged instead of the in-pixel isolation region 127, and a pixel isolation unit 164 is further arranged.

The in-pixel isolation unit 154 is an in-pixel isolation unit arranged on the front surface side of the semiconductor substrate 120. The in-pixel isolation unit 154 can be formed by filling a groove portion 155 formed from the front surface side of the semiconductor substrate 120 with an insulating member. Furthermore, the in-pixel isolation electrode 108 can be arranged in the in-pixel isolation unit 154. Note that the in-pixel isolation electrodes 108 respectively arranged in the in-pixel isolation unit 150 and the in-pixel isolation unit 154 are distinguished by adding reference signs "a" and "b". An in-pixel isolation electrode 108*b* can be constituted by an electrode 156 arranged at the center of the groove portion 155.

Also, the pixel isolation unit 160 in FIG. 12 is arranged on the front surface side of the semiconductor substrate 120. The pixel isolation unit 164 is arranged at the boundary of the pixel 100 on the back surface side of the semiconductor substrate 120. The pixel isolation unit 164 can be formed by filling a groove portion 165 formed from the back surface side of the semiconductor substrate 120 with an insulating member. Furthermore, the pixel isolation electrode 109 can be arranged in the pixel isolation unit 164. Note that the pixel isolation electrodes 109 respectively arranged in the pixel isolation unit 160 and the pixel isolation unit 164 are distinguished by adding reference signs "a" and "b". A pixel isolation electrode 109*b* can be constituted by an electrode 166 arranged at the center of the groove portion 165.

Also, the pixel 100 in FIG. 12 includes the overflow paths 107*a* and 107*b*. The overflow path 107*a* is an overflow path constituted by the semiconductor region 125 arranged between the in-pixel isolation unit 150 and the pixel isolation unit 164. The overflow path 107*b* is an overflow path constituted by a semiconductor region 128 arranged between the in-pixel isolation units 150 and 154. Note that either one of the overflow paths 107*a* and 107*b* can be arranged.

The same second bias voltage as that to An in-pixel isolation electrode 108*a* can be applied to the in-pixel isolation electrode 108*b*. Furthermore, a different second bias voltage from that to the in-pixel isolation electrode 108*a* can be applied to the in-pixel isolation electrode 108*b*.

The pixel isolation unit interconnect 184 is connected to a pixel isolation electrode 109*a*. On the other hand, the contact plug 143 and the interconnect 142 in the interconnect region 140 can be connected to the pixel isolation electrode 109*b*. The same first bias voltage as that to the pixel isolation electrode 109*a* can be applied to the pixel isolation electrode 109*b*. Furthermore, a different first bias voltage from that to the pixel isolation electrode 109*a* can be applied to the pixel isolation electrode 109*b*.

The pixel 100 in FIG. 12 includes the in-pixel isolation electrodes 108*a* and 108*b* and the pixel isolation electrodes 109*a* and 109*b* on both the surfaces of the semiconductor substrate 120. By adjusting the bias voltages to be applied to these electrodes, the saturation charge amounts and the dark currents of the photoelectric conversion units 101 and 102 can be adjusted on both the surfaces of the semiconductor substrate 120.

Note that the in-pixel isolation unit 154 is an example of a second in-pixel isolation unit described in the claims. The in-pixel isolation electrode 108*b* is an example of a second in-pixel isolation electrode described in the claims. The pixel isolation unit 160 in FIG. 12 is an example of a second pixel isolation unit described in the claims. The pixel isolation electrode 109*b* in FIG. 12 is an example of a second pixel isolation electrode described in the claims.

[Method for Manufacturing Imaging Element]

FIGS. 13A to 13E are diagrams illustrating an example of the method for manufacturing the imaging element according to the fifth embodiment of the present disclosure. FIGS. 13A to 13E are diagrams illustrating an example of a process for manufacturing the in-pixel isolation units 150 and 154 and the pixel isolation units 160 and 164 in the process for manufacturing the imaging element 1 according to the fifth embodiment of the present disclosure.

Figure 13A:
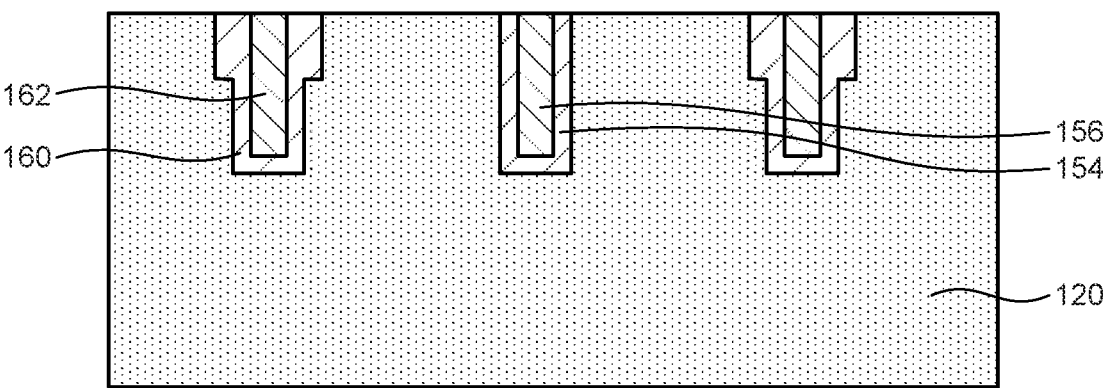
FIG. 13A is a diagram illustrating an example of the method for manufacturing the imaging element according to the fifth embodiment of the present disclosure.

First, the groove portions 161 and 155 are formed on the front surface side of the semiconductor substrate 120. Subsequently, insulating members are arranged on the wall surfaces of the groove portions 161 and 155 to form the in-pixel isolation unit 154 and the pixel isolation unit 160. Subsequently, conductive members are arranged in the groove portions 161 and 155 to form the electrodes 156 and 162 (FIG. 13A).

Figure 13B:
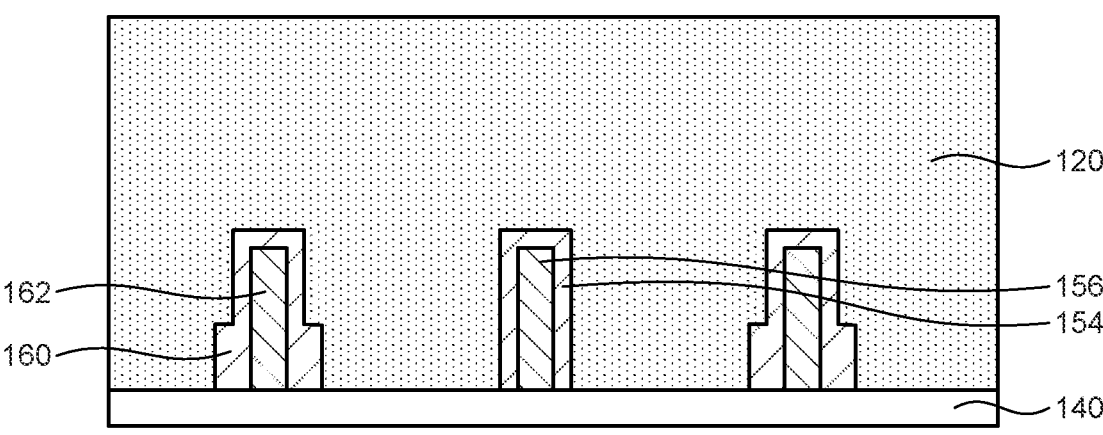
FIG. 13B is a diagram illustrating the example of the method for manufacturing the imaging element according to the fifth embodiment of the present disclosure.

Subsequently, the interconnect region 140 is formed on the front surface side of the semiconductor substrate 120. Subsequently, the semiconductor substrate 120 is turned upside down, and the back surface side of the semiconductor substrate 120 is ground (FIG. 13B).

Figure 13C:
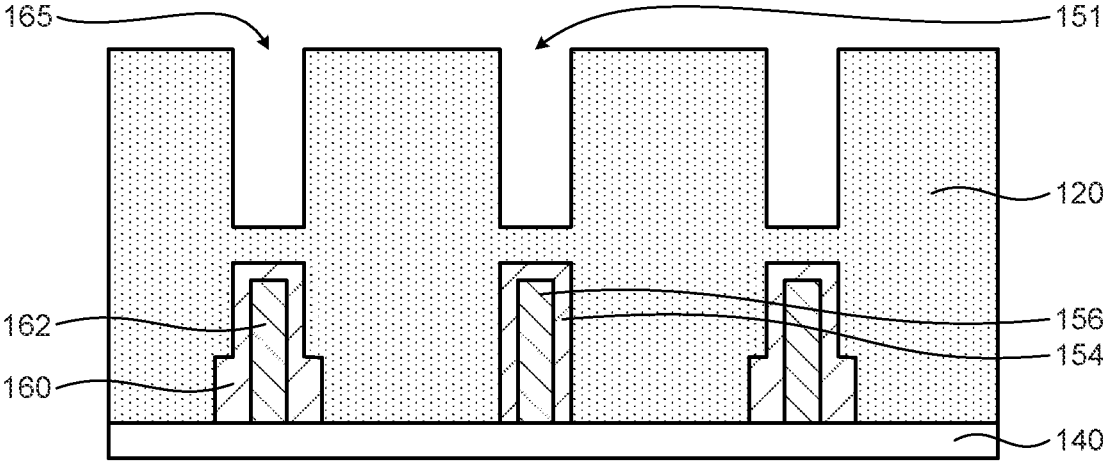
FIG. 13C is a diagram illustrating the example of the method for manufacturing the imaging element according to the fifth embodiment of the present disclosure.

Subsequently, the groove portions 151 and 165 are formed on the back surface side of the semiconductor substrate 120 (FIG. 13C).

Figure 13D:
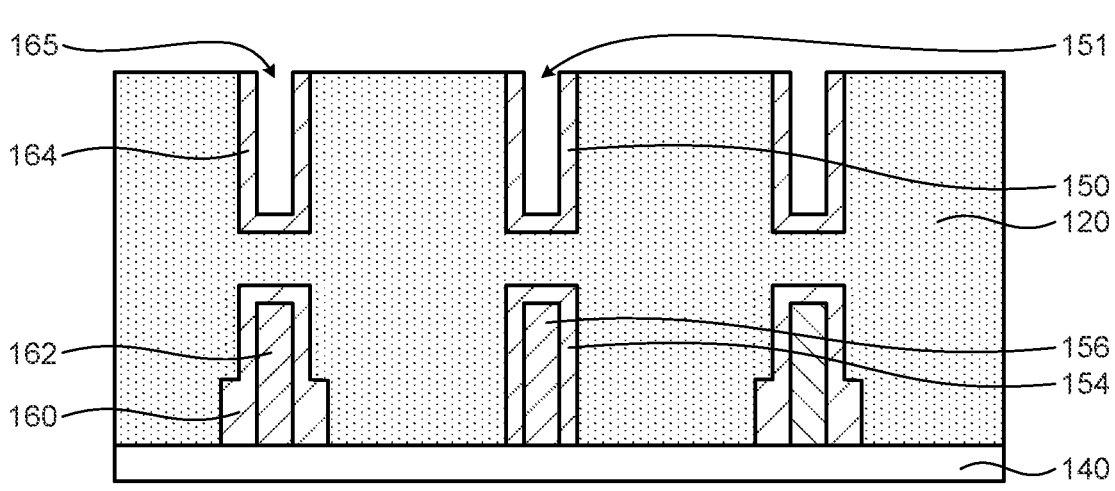
FIG. 13D is a diagram illustrating the example of the method for manufacturing the imaging element according to the fifth embodiment of the present disclosure.

Subsequently, insulating members are arranged on the wall surfaces of the groove portions 151 and 165 to form the in-pixel isolation unit 150 and the pixel isolation unit 164 (FIG. 13D).

Figure 13E:
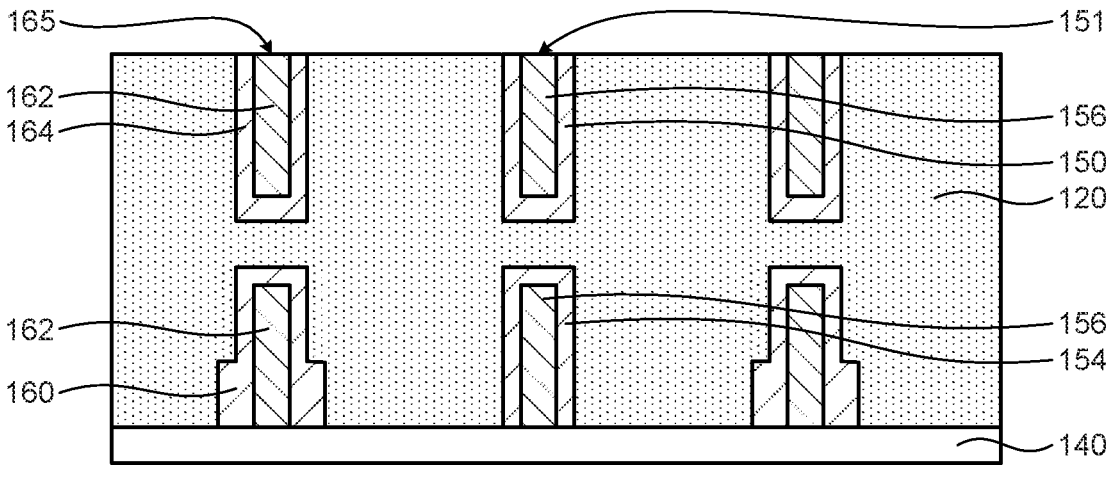
FIG. 13E is a diagram illustrating the example of the method for manufacturing the imaging element according to the fifth embodiment of the present disclosure.

Subsequently, conductive members are arranged in the groove portions 151 and 165 to form the electrodes 156 and 162 (FIG. 13E).

The configuration of the imaging element 1 other than this is similar to the configuration of the imaging element 1 in the first embodiment of the present disclosure, and thus description thereof is omitted.

In this manner, the imaging element 1 according to the fifth embodiment of the present disclosure includes the in-pixel isolation electrodes 108*a* and 108*b* and the pixel isolation electrodes 109*a* and 109*b* on both the surfaces of the semiconductor substrate 120. The bias voltages to be applied to these electrodes can be adjusted and optimized.

6. Sixth Embodiment

In the imaging element 1 according to the first embodiment described above, the in-pixel isolation electrode 108 and the pixel isolation electrode 109 constituted by the electrodes 152 and 162 made of metals are used. On the other hand, the imaging element 1 according to a sixth embodiment of the present disclosure is different from the above-described first embodiment in that the in-pixel isolation electrode 108 and the pixel isolation electrode 109 constituted by electrodes made of transparent conductive films are used.

[Configuration of Cross-Section of Imaging Element]

Figure 14:
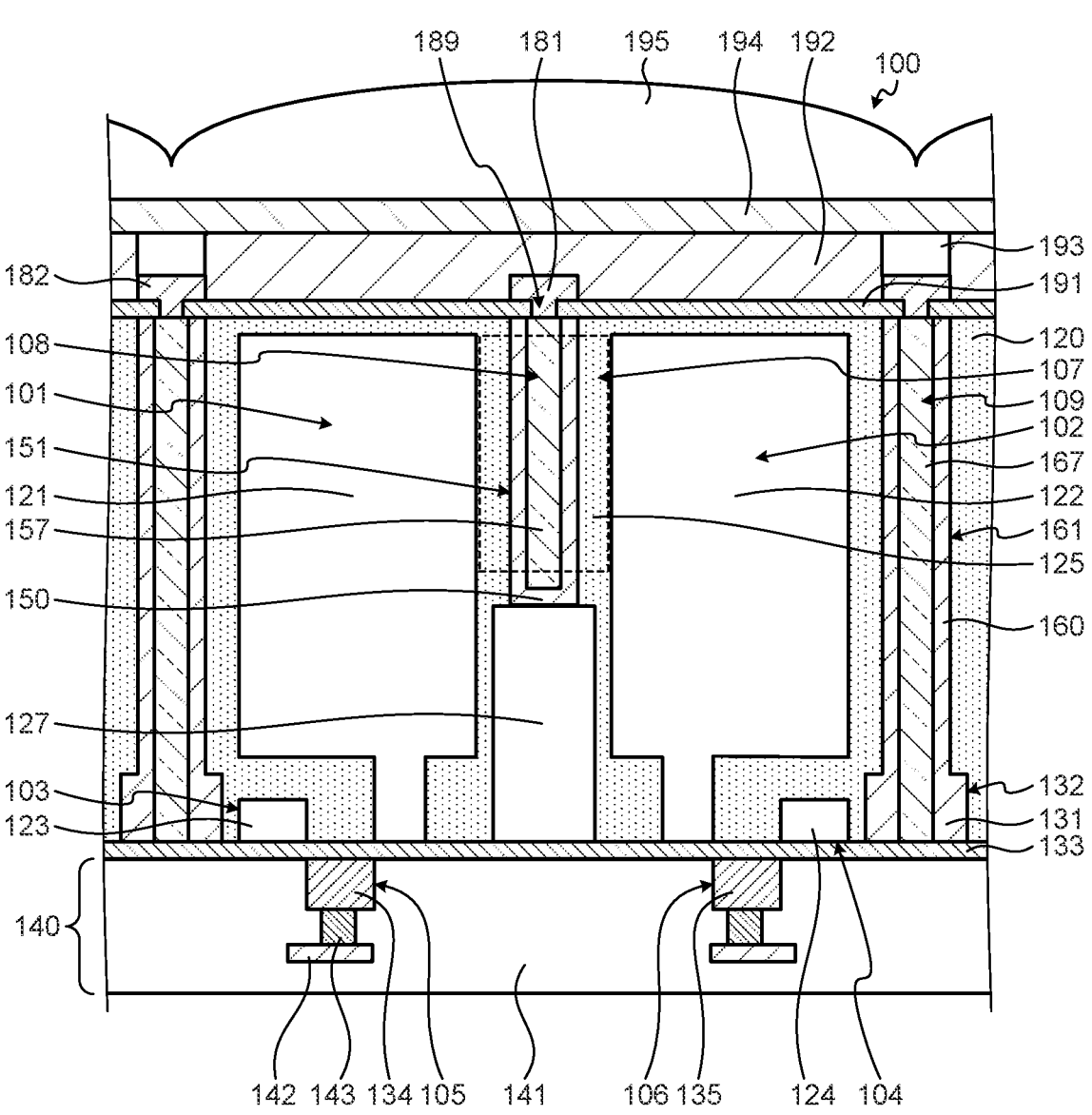
FIG. 14 is a cross-sectional view illustrating a configuration example of the pixel according to a sixth embodiment of the present disclosure.

FIG. 14 is a cross-sectional view illustrating a configuration example of the pixel according to the sixth embodiment of the present disclosure. FIG. 14 is a cross-sectional view illustrating a configuration example of the pixel 100 similarly to FIG. 4. The pixel 100 in FIG. 14 is different from the pixel 100 in FIG. 4 in that an electrode 157 is arranged instead of the electrode 152 and an electrode 167 is arranged instead of the electrode 162.

The in-pixel isolation electrode 108 in FIG. 14 includes the electrode 157. Furthermore, the pixel isolation electrode 109 in FIG. 14 includes the electrode 167. These electrodes 157 and 167 are made of transparent members such as transparent conductive films. For each of these transparent conductive films, the member described in FIG. 10A can be used.

Note that the configuration of the imaging element 1 is not limited to that in this example. For example, instead of the in-pixel isolation unit interconnect 181 and the pixel isolation unit interconnect 182, the in-pixel isolation unit interconnect 183 and the pixel isolation unit interconnect 184 described in FIG. 10A can be arranged.

[Method for Manufacturing Imaging Element]

FIGS. 15A to 15D are diagrams illustrating an example of the method for manufacturing the imaging element according to the sixth embodiment of the present disclosure. FIGS. 15A to 15D are diagrams illustrating an example of a process for manufacturing the in-pixel isolation unit 150 and the pixel isolation unit 160 in the process for manufacturing the imaging element 1 according to the sixth embodiment of the present disclosure.

Figure 15A:
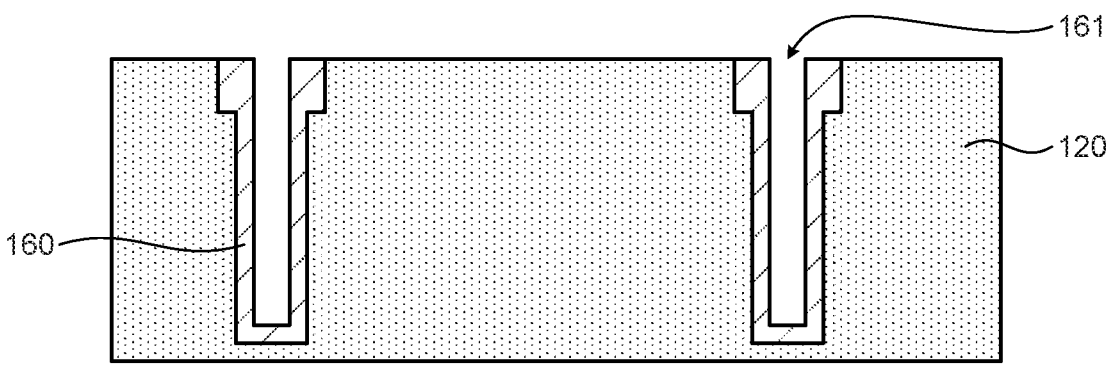
FIG. 15A is a diagram illustrating an example of the method for manufacturing the imaging element according to the sixth embodiment of the present disclosure.

First, the groove portion 161 is formed on the front surface side of the semiconductor substrate 120. Subsequently, an insulating member is arranged on the wall surface of the groove portion 161 to form the pixel isolation unit 160 (FIG. 15A).

Figure 15B:
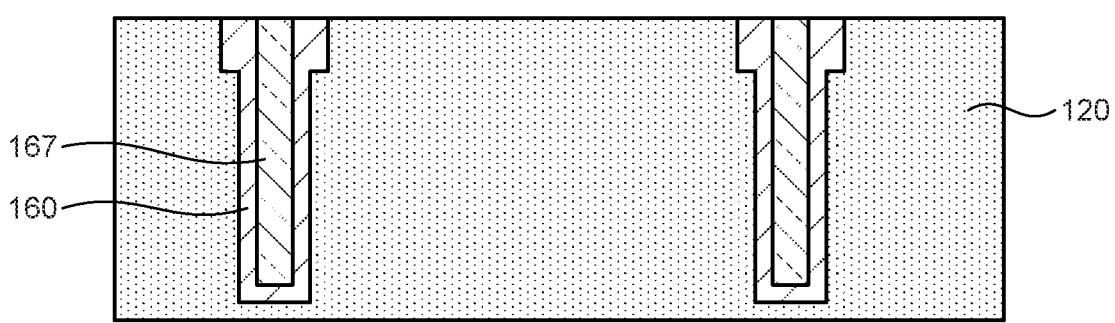
FIG. 15B is a diagram illustrating the example of the method for manufacturing the imaging element according to the sixth embodiment of the present disclosure.
Figure 15C:
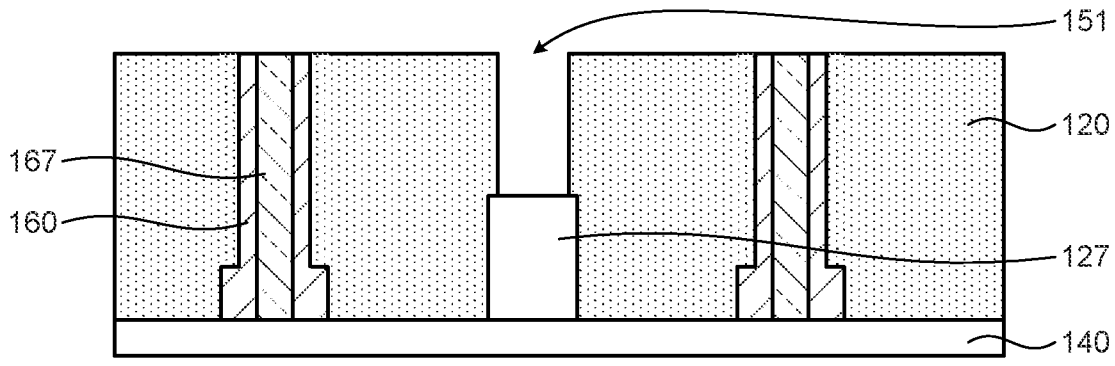
FIG. 15C is a diagram illustrating the example of the method for manufacturing the imaging element according to the sixth embodiment of the present disclosure.

Subsequently, a transparent conductive film is arranged in the groove portion 161 to form the electrode 167 (FIG. 15B). Subsequently, the in-pixel isolation region 127 is formed in the semiconductor substrate 120, and the interconnect region 140 is formed on the front surface side of the semiconductor substrate 120. Subsequently, the semiconductor substrate 120 is turned upside down, and the back surface side of the semiconductor substrate 120 is ground. Subsequently, the groove portion 151 is formed on the back surface side of the semiconductor substrate 120 (FIG. 15C).

Figure 15D:
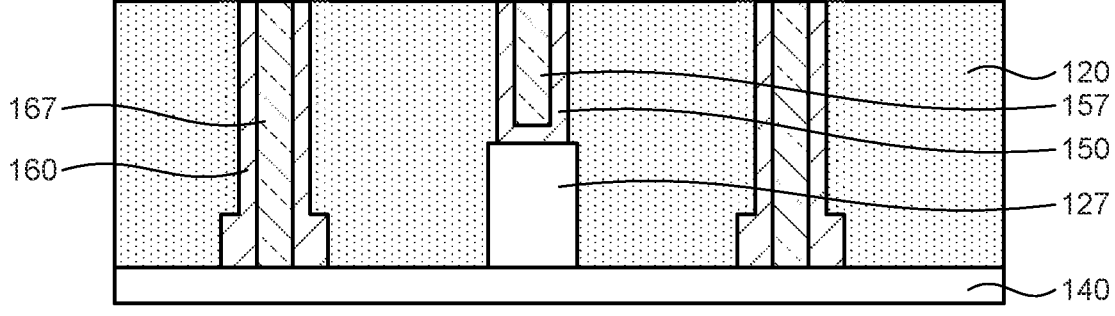
FIG. 15D is a diagram illustrating the example of the method for manufacturing the imaging element according to the sixth embodiment of the present disclosure.

Subsequently, an insulating member is arranged on the wall surface of the groove portion 151 to form the in-pixel isolation unit 150. Subsequently, a transparent conductive film is arranged in the groove portion 151 to form the electrode 157 (FIG. 15D).

In the above process, as illustrated in FIG. 15B, the electrode 167 made of the transparent conductive film is arranged in the groove portion 151 formed on the front surface side of the semiconductor substrate 120. Therefore, it is necessary to apply a low-temperature process to the subsequent steps. This is because the transparent conductive film has low heat resistance.

[Another Method for Manufacturing Imaging Element]

FIGS. 16A to 16H are diagrams illustrating another example of the method for manufacturing the imaging element according to the sixth embodiment of the present disclosure. FIGS. 16A to 16H are diagrams illustrating another example of the process for manufacturing the in-pixel isolation unit 150 and the pixel isolation unit 160 in the process for manufacturing the imaging element 1 according to the sixth embodiment of the present disclosure.

Figure 16A:
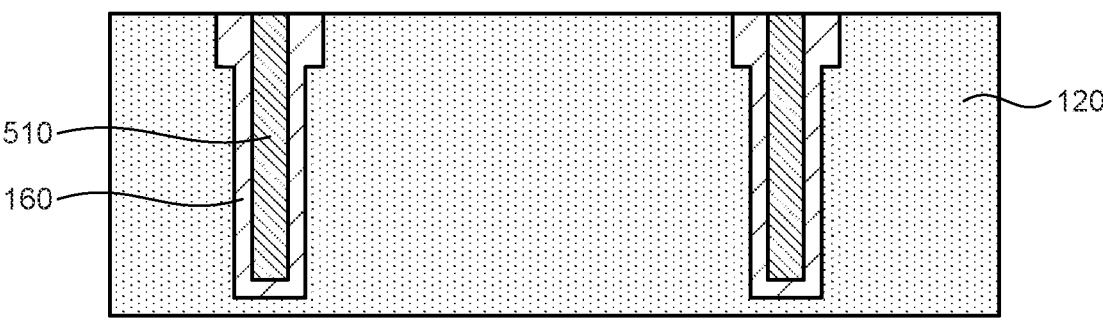
FIG. 16A is a diagram illustrating another example of the method for manufacturing the imaging element according to the sixth embodiment of the present disclosure.

First, the groove portion 161 is formed on the front surface side of the semiconductor substrate 120. Subsequently, an insulating member is arranged on the wall surface of the groove portion 161 to form the pixel isolation unit 160. Subsequently, a temporary electrode 510 is arranged in the groove portion 161. The temporary electrode 510 can be made of, for example, polycrystalline silicon (FIG. 16A).

Figure 16B:
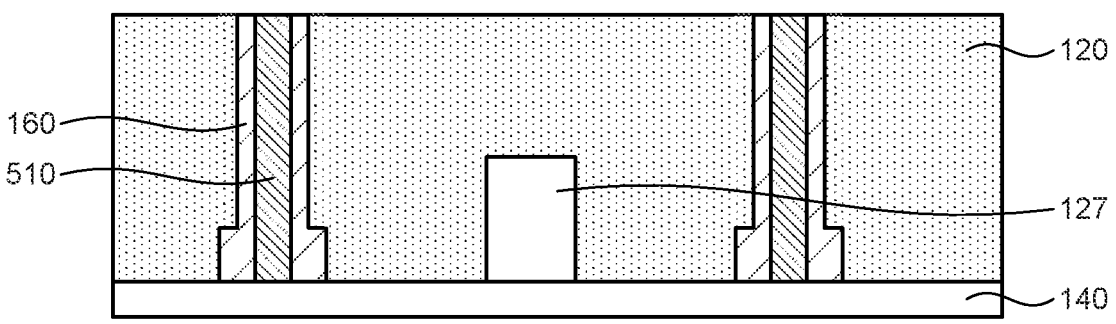
FIG. 16B is a diagram illustrating the other example of the method for manufacturing the imaging element according to the sixth embodiment of the present disclosure.

Subsequently, the in-pixel isolation region 127 is formed in the semiconductor substrate 120, and the interconnect region 140 is formed on the front surface side of the semiconductor substrate 120. Subsequently, the semiconductor substrate 120 is turned upside down, and the back surface side of the semiconductor substrate 120 is ground. (FIG. 16B).

Figure 16C:
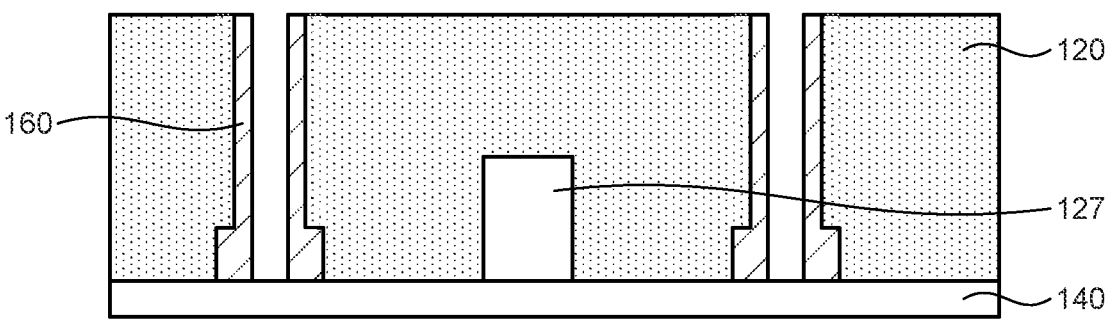
FIG. 16C is a diagram illustrating the other example of the method for manufacturing the imaging element according to the sixth embodiment of the present disclosure.
Figure 16D:
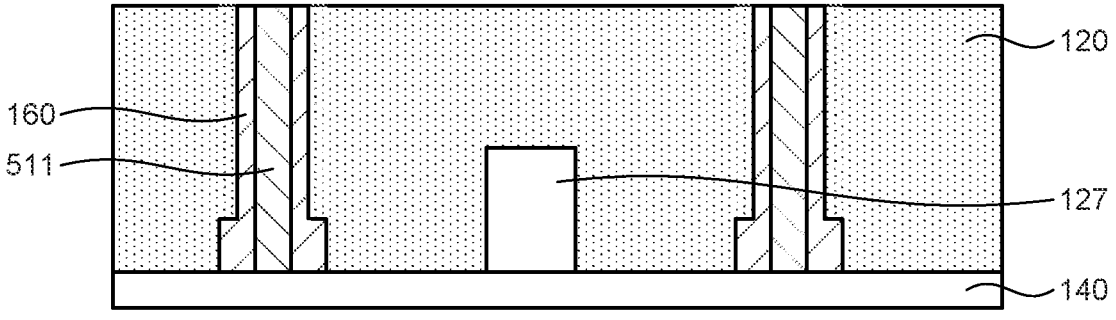
FIG. 16D is a diagram illustrating the other example of the method for manufacturing the imaging element according to the sixth embodiment of the present disclosure.

Subsequently, the temporary electrode 510 in the groove portion 151 is removed by etching (FIG. 16C). Subsequently, a resist 511 is arranged in the groove portion 151 (FIG. 16D).

Figures 16E, 16F, 16G, 16H:
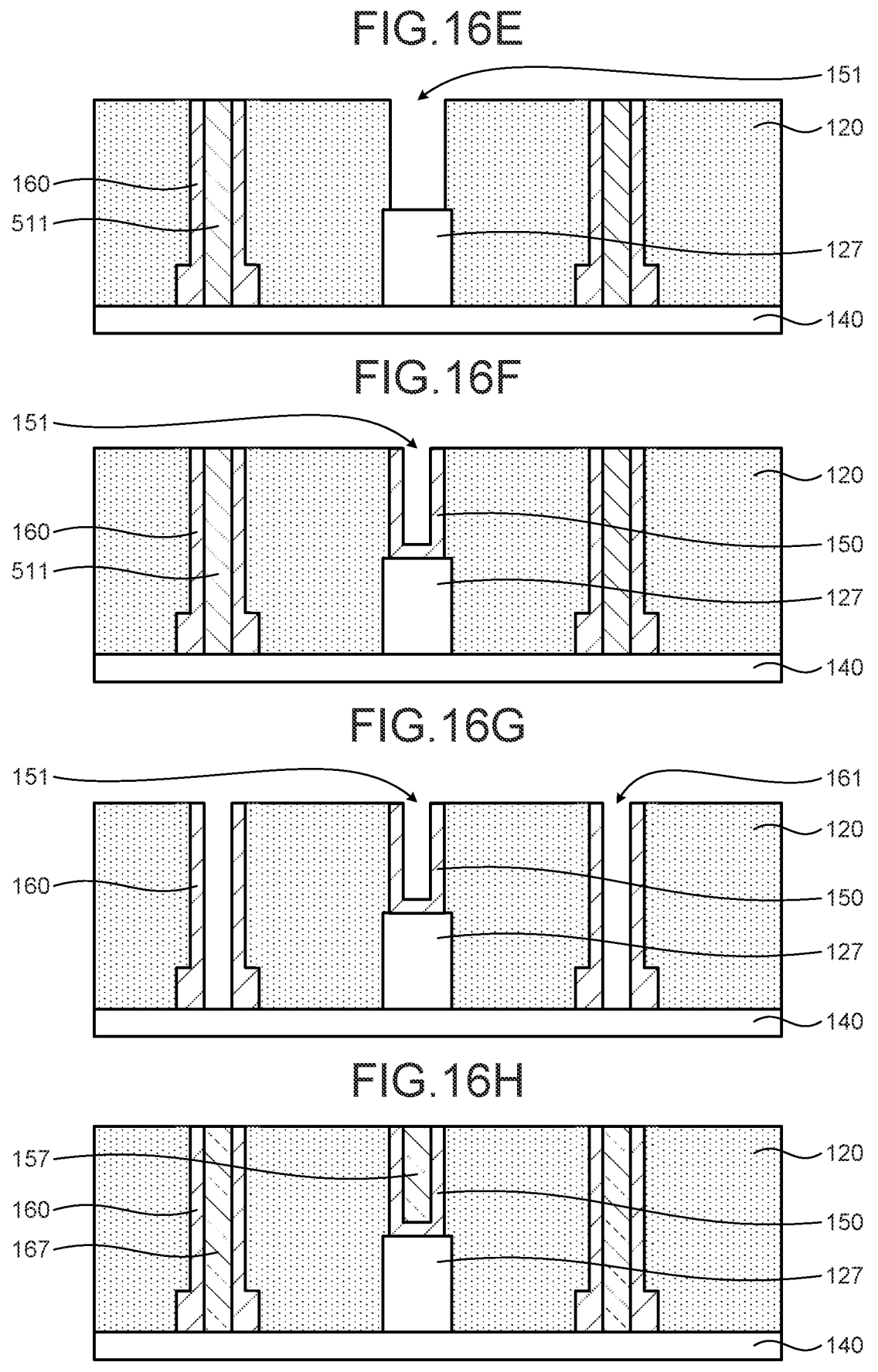

Subsequently, the groove portion 151 is formed on the back surface side of the semiconductor substrate 120 (FIG. 16E). Subsequently, an insulating member is arranged on the wall surface of the groove portion 151 to form the in-pixel isolation unit 150 (FIG. 16F).

Subsequently, the resist 511 in the groove portion 161 is removed (FIG. 16G). Subsequently, transparent conductive films are arranged in the groove portions 151 and 161 to form the electrodes 157 and 167 (FIG. 16H).

In the manufacturing process illustrated in FIGS. 16A to 16H, as illustrated in FIG. 16A, the temporary electrode 510 is arranged in the groove portion 161 formed on the front surface side of the semiconductor substrate 120. The temporary electrode 510 is made of polycrystalline silicon. The polycrystalline silicon is a member having high heat resistance. Therefore, a high-temperature process, for example, a process of forming an insulating film by means of thermal oxidation of the semiconductor substrate 120, can be applied to the subsequent steps.

First Modification Example

The imaging element 1 described in FIG. 12 uses the electrodes 152 and 156 and the electrodes 162 and 166 made of metals, but electrodes made of transparent conductive films can be used.

[Configuration of Cross-Section of Imaging Element]

Figure 17:
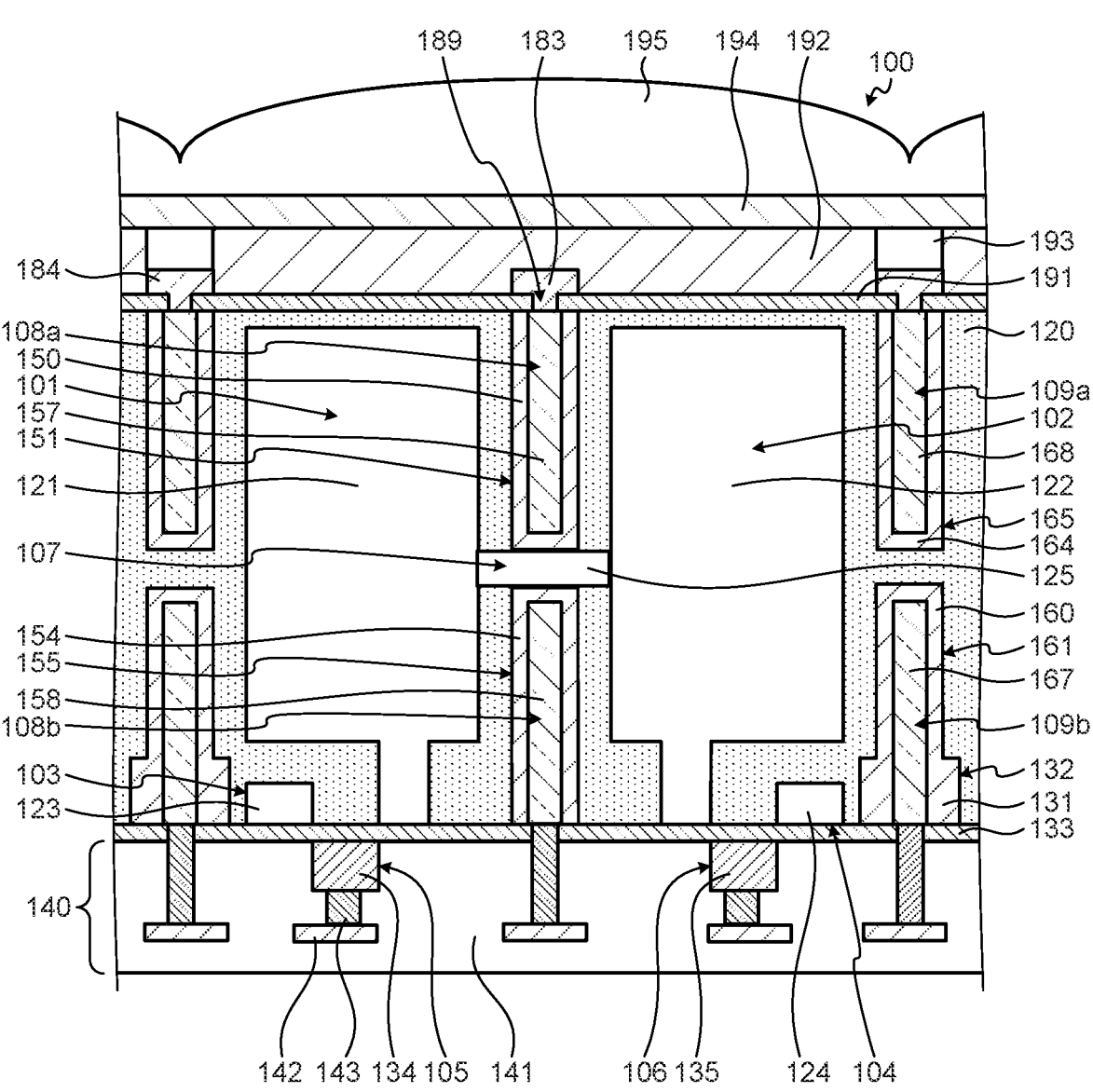
FIG. 17 is a cross-sectional view illustrating a configuration example of the pixel according to a first modification example of the sixth embodiment of the present disclosure.

FIG. 17 is a cross-sectional view illustrating a configuration example of the pixel according to a first modification example of the sixth embodiment of the present disclosure. FIG. 17 is a diagram illustrating a configuration example of the pixel 100 similarly to FIG. 12. The pixel 100 in FIG. 17 is different from the pixel 100 in FIG. 12 in that electrodes 157 and 158 are arranged instead of the electrodes 152 and 156, and electrodes 167 and 168 are arranged instead of the electrodes 162 and 166. The electrodes 157 and 158 and the electrodes 167 and 168 are electrodes made of transparent conductive films.

Second Modification Example

In the imaging element 1 described in FIG. 17, electrodes made of transparent conductive films are used for the electrodes 157 and 158 and the electrodes 167 and 168, but only some of the electrodes may be made of transparent conductive films.

[Configuration of Cross-Section of Imaging Element]

Figure 18A:
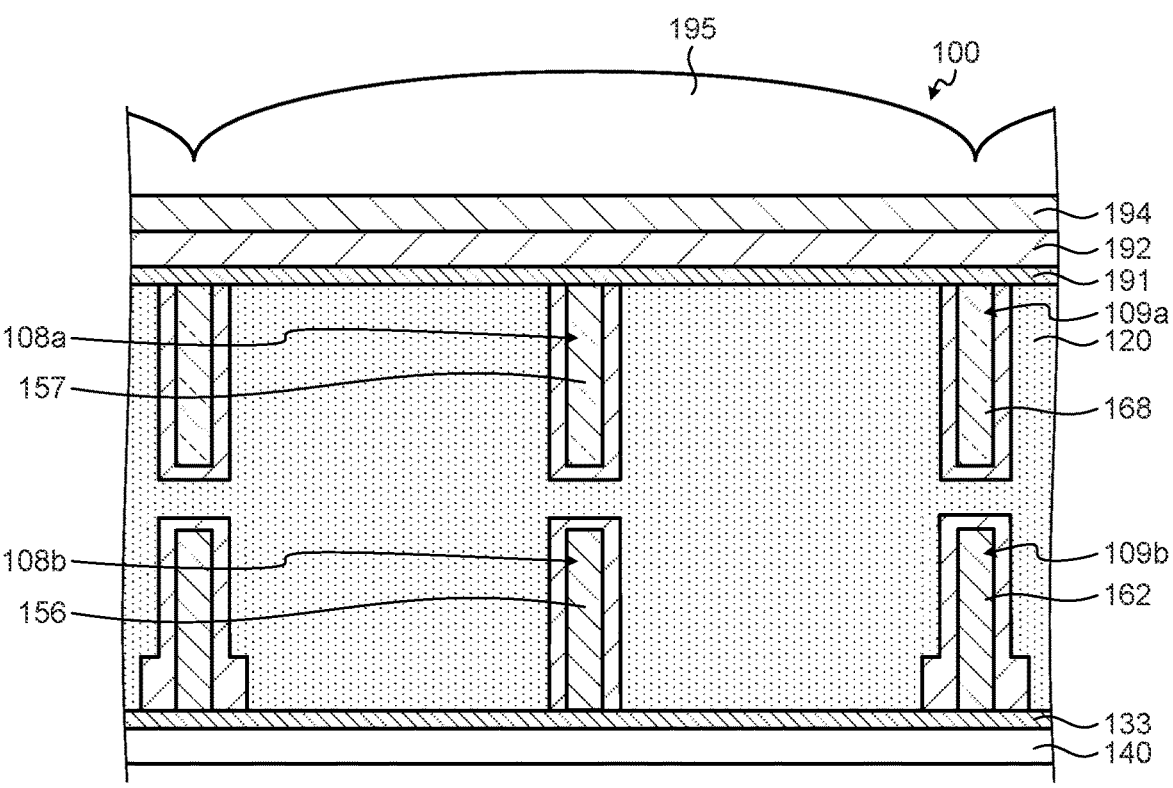
FIG. 18A is a cross-sectional view illustrating a configuration example of the pixel according to a second modification example of the sixth embodiment of the present disclosure.
Figure 18B:
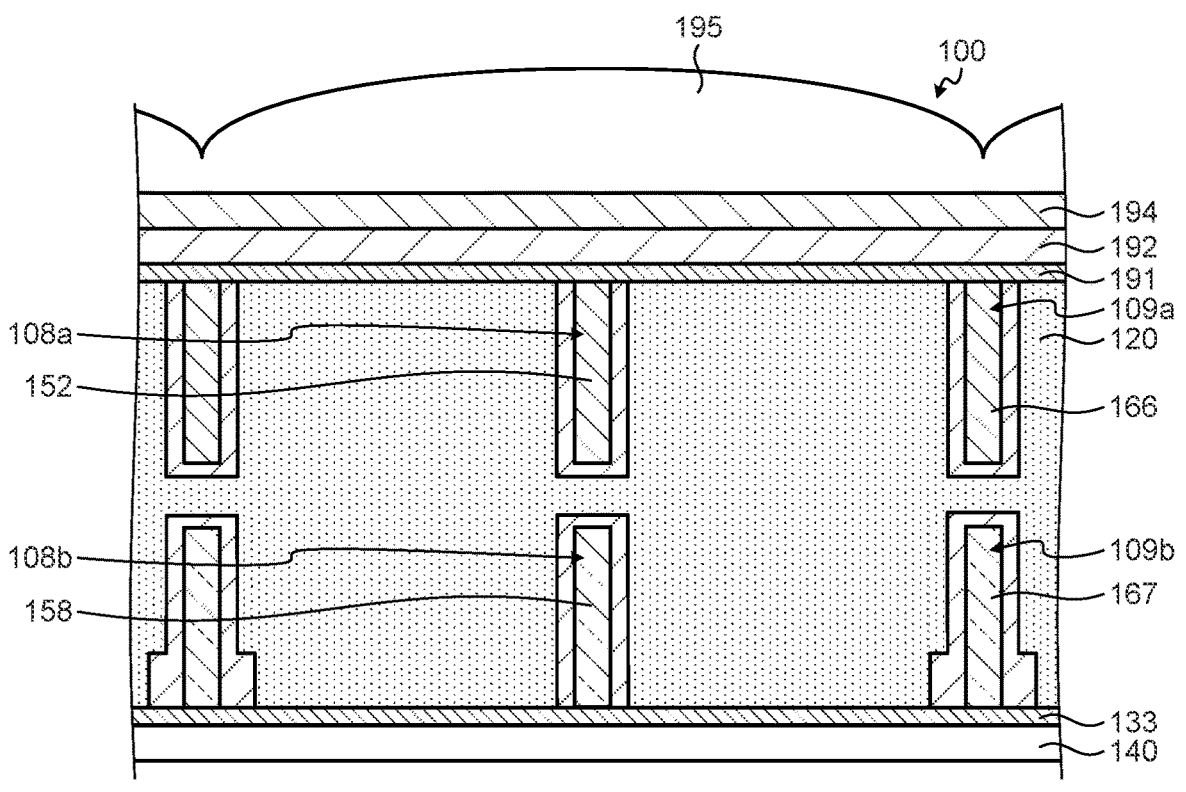
FIG. 18B is a cross-sectional view illustrating a configuration example of the pixel according to the second modification example of the sixth embodiment of the present disclosure.

FIGS. 18A and 18B are cross-sectional views illustrating configuration examples of the pixel according to a second modification example of the sixth embodiment of the present disclosure. FIGS. 18A and 18B are diagrams illustrating simplified configuration examples of the pixel 100. FIG. 18A is a diagram illustrating an example of the pixel 100 in which the electrodes 157 and 168 made of transparent conductive films are arranged on the back surface side of the semiconductor substrate 120. Also, FIG. 18B is a diagram illustrating an example in which the electrodes 158 and 167 made of transparent conductive films are arranged on the front surface side of the semiconductor substrate 120.

[Another Configuration of Cross-Section of Imaging Element]

Figure 19A:
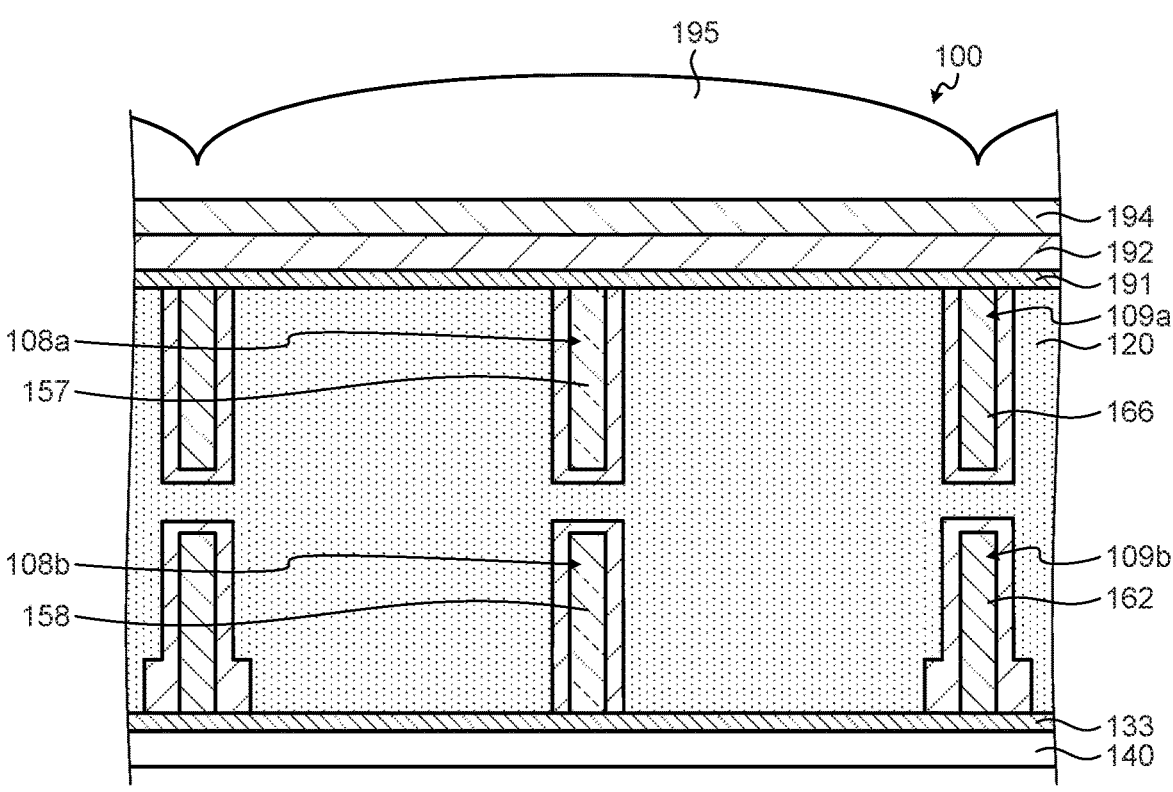
FIG. 19A is a cross-sectional view illustrating another configuration example of the pixel according to the second modification example of the sixth embodiment of the present disclosure.
Figure 19B:
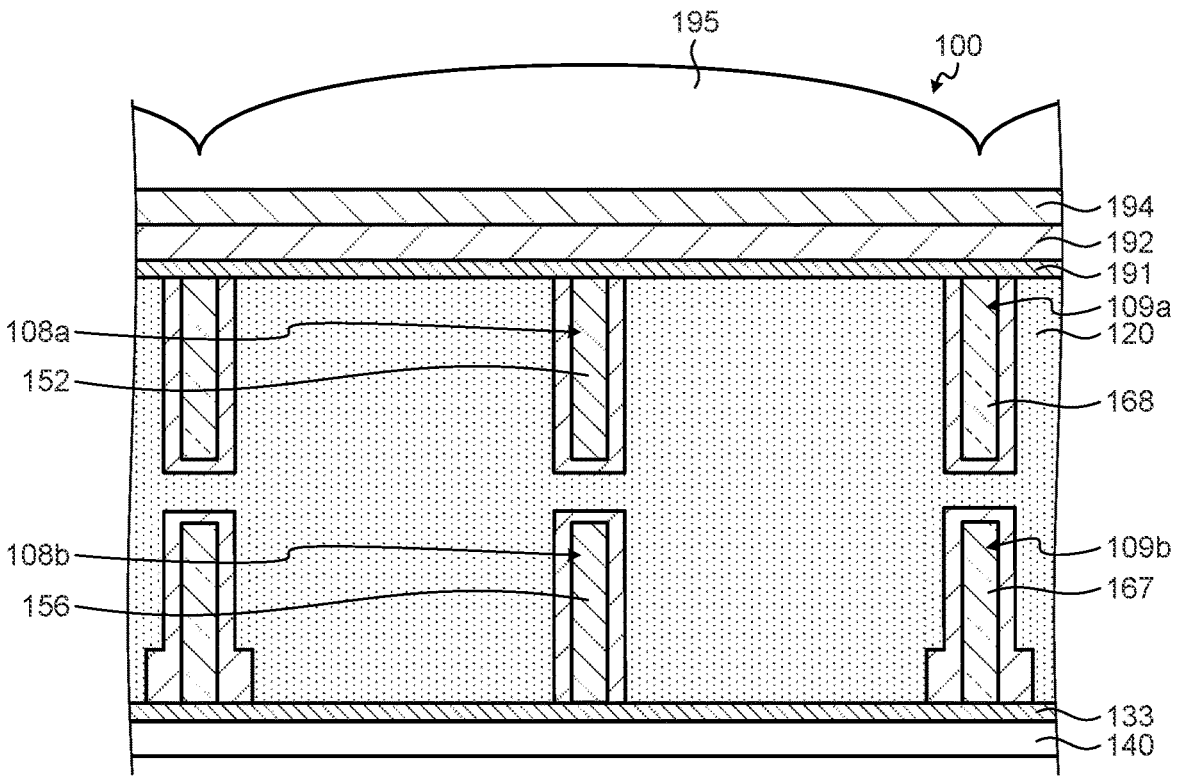
FIG. 19B is a cross-sectional view illustrating another configuration example of the pixel according to the second modification example of the sixth embodiment of the present disclosure.

FIGS. 19A and 19B are cross-sectional views illustrating other configuration examples of the pixel according to the second modification example of the sixth embodiment of the present disclosure. FIGS. 19A and 19B are diagrams illustrating simplified configuration examples of the pixel 100 similarly to FIGS. 18A and 18B. FIG. 19A illustrates an example of the pixel 100 in which the electrodes 157 and 158 made of transparent conductive films are arranged in the in-pixel isolation electrodes 108a and 108b. Also, FIG. 19B illustrates an example in which the electrodes 167 and 168 made of transparent conductive films are arranged in the pixel isolation electrodes 109a and 109b.

The configuration of the imaging element 1 other than this is similar to the configuration of the imaging element 1 in the first embodiment of the present disclosure, and thus description thereof is omitted.

In this manner, in the imaging element 1 according to the sixth embodiment of the present disclosure, bias voltages are applied to the in-pixel isolation electrode 108 and the pixel isolation electrode 109 made of transparent members.

7. Modification Example

The imaging element 1 according to the first embodiment described above uses the in-pixel isolation electrode 108 and the pixel isolation electrode 109, but the in-pixel isolation electrode 108 and the pixel isolation electrode 109 having different shapes from those can also be used.

[Configuration of In-Pixel Isolation Electrode and Pixel Isolation Electrode]

Figure 20A:
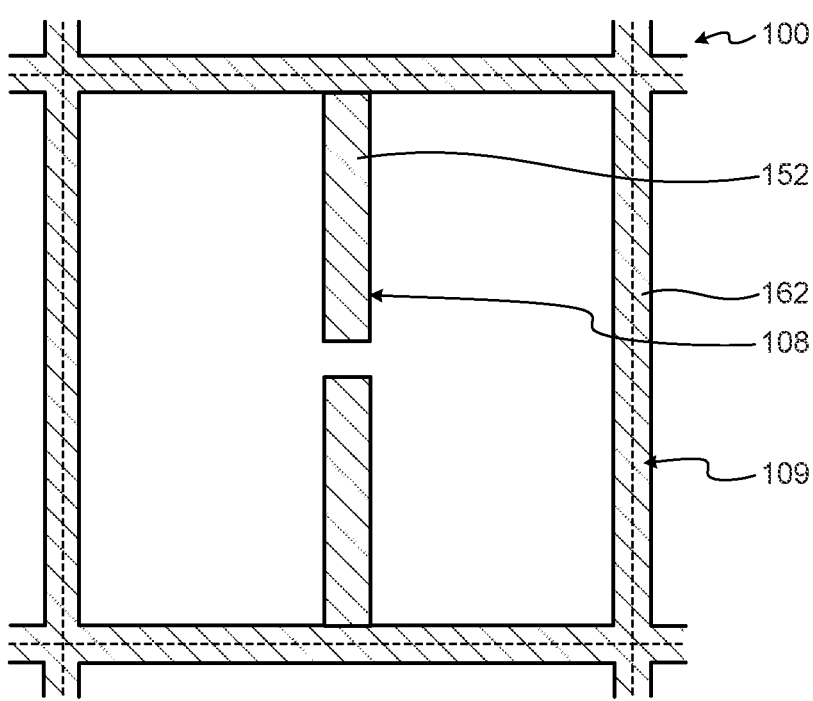
FIG. 20A is a diagram illustrating a configuration example of the pixel according to a modification example of the present disclosure.
Figure 20B:
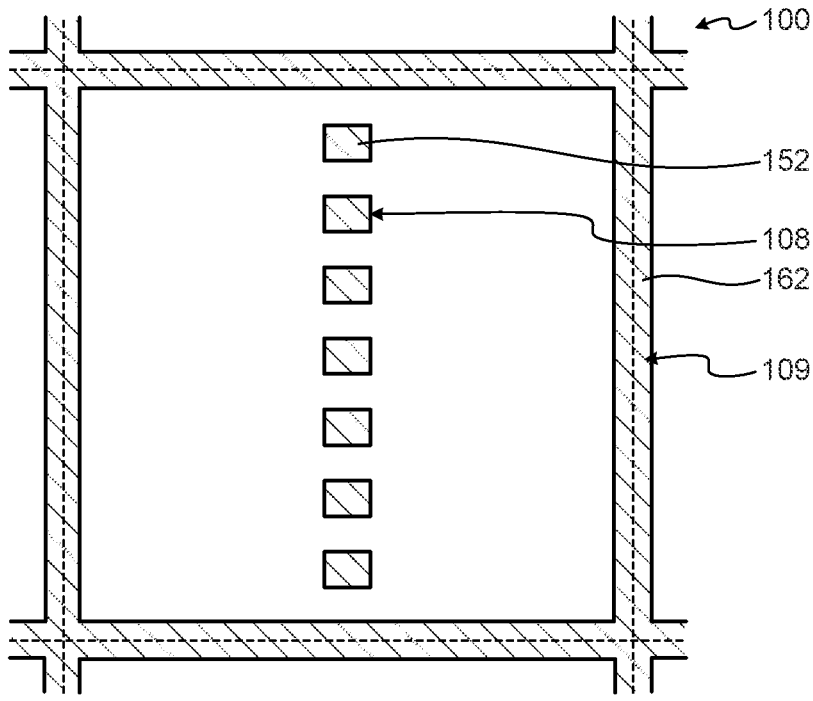
FIG. 20B is a diagram illustrating a configuration example of the pixel according to the modification example of the present disclosure.
Figure 20C:
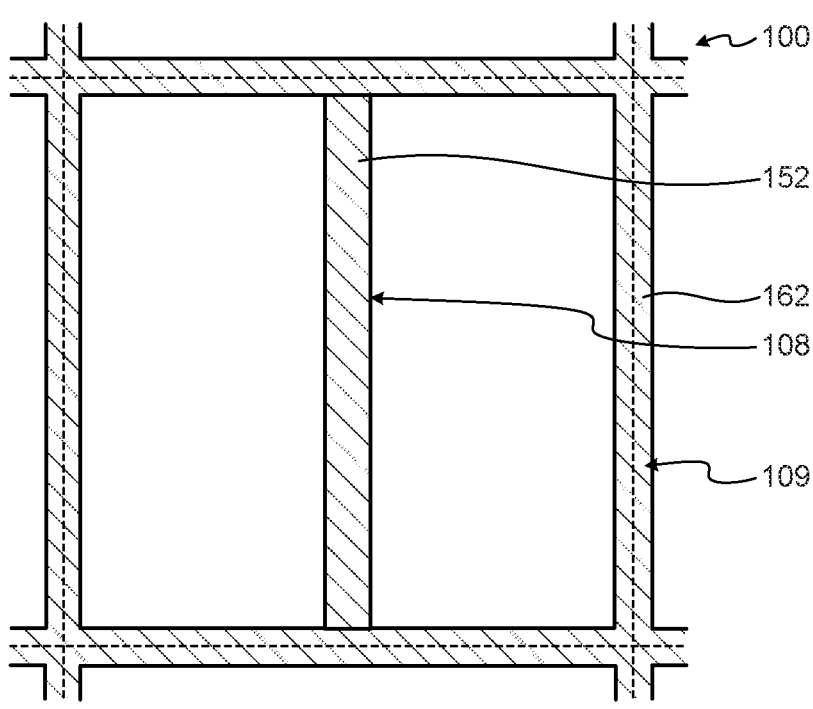
FIG. 20C is a diagram illustrating a configuration example of the pixel according to the modification example of the present disclosure.

FIGS. 20A to 20C are diagrams illustrating configuration examples of the pixel according to a modification example of the present disclosure. FIGS. 20A to 20C are diagrams illustrating configuration examples of the in-pixel isolation electrode 108 and the pixel isolation electrode 109 in the pixel 100.

FIG. 20A is a diagram illustrating the in-pixel isolation electrode 108 constituted by the electrode 152 divided into two in a planar view of the semiconductor substrate 120. The overflow path 107 can be arranged between the two electrodes 152. In the pixel 100 in FIG. 20A, the in-pixel isolation electrode 108 and the pixel isolation electrode 109 each formed to penetrate the semiconductor substrate 120 can be arranged. Furthermore, the in-pixel isolation electrode 108 and the pixel isolation electrode 109 each divided and provided on the front surface side and the back surface side of the semiconductor substrate 120 as illustrated in FIG. 12 can also be arranged.

FIG. 20B is a diagram illustrating the in-pixel isolation electrode 108 constituted by the electrode 152 divided into two or more in a planar view of the semiconductor substrate 120. The overflow path 107 can be arranged between the plurality of electrodes 152. Furthermore, the overflow path 107 can be arranged between the electrode 152 and the electrode 152 constituting the pixel isolation electrode 109. In the pixel 100 in FIG. 20B, the in-pixel isolation electrode 108 and the pixel isolation electrode 109 each formed to penetrate the semiconductor substrate 120 can be arranged. Furthermore, the in-pixel isolation electrode 108 and the pixel isolation electrode 109 each divided and provided on the front surface side and the back surface side of the semiconductor substrate 120 as illustrated in FIG. 12 can also be arranged.

FIG. 20C is a diagram illustrating the in-pixel isolation electrode 108 constituted by the electrode 152 formed to abut on the electrode 162 constituting the pixel isolation electrode 109 in a plan view of the semiconductor substrate 120. In the pixel 100 in FIG. 20C, the pixel isolation electrode 109 formed to penetrate the semiconductor substrate 120 or the pixel isolation electrode 109 divided and provided on the front surface side and the back surface side of the semiconductor substrate 120 can be arranged. On the other hand, in the pixel 100 in FIG. 20C, the divided in-pixel isolation electrodes 108 are arranged on the front surface side and the back surface side of the semiconductor substrate 120. In this case, the overflow path 107 is arranged between the in-pixel isolation electrodes 108 divided and provided on the front surface side and the back surface side.

[Configuration of Pixel Isolation Electrode]

Figure 21A:
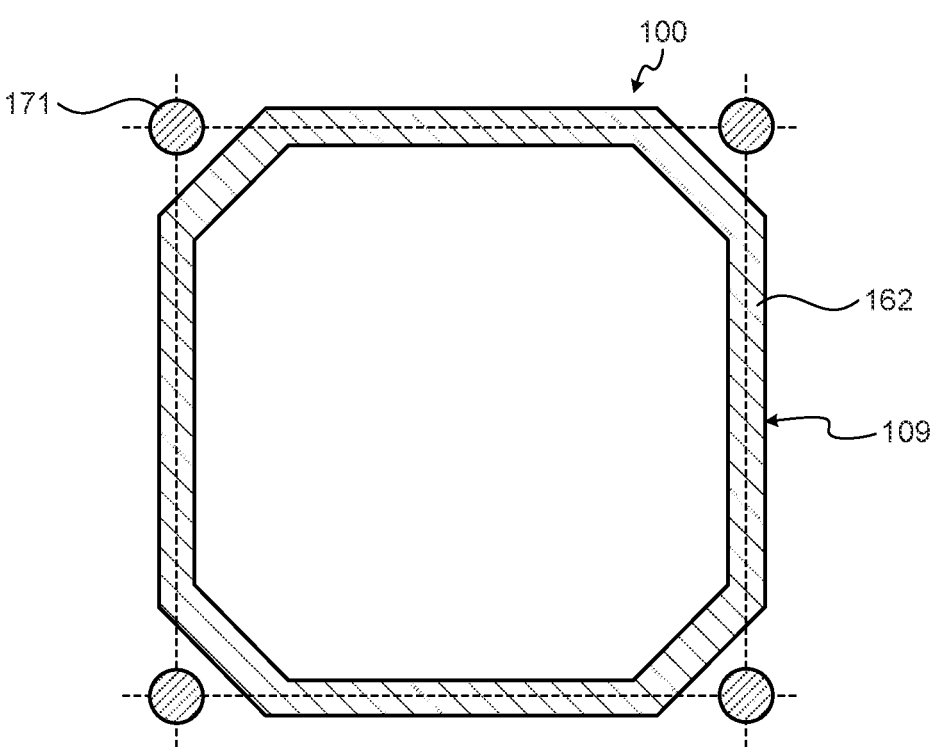
FIG. 21A is a diagram illustrating another configuration example of the pixel according to the modification example of the present disclosure.

FIGS. 21A and 22B are diagrams illustrating other configuration examples of the pixel according to the modification example of the present disclosure. FIGS. 21A and 22B are diagrams illustrating configuration examples of the pixel isolation electrode 109 in the pixel 100.

FIG. 21A is a diagram illustrating an example of the pixel isolation electrode 109 constituted by the electrode 162 formed in an octagonal shape in a plan view of the semiconductor substrate 120. By making the electrode 162 octagonal, it is possible to reduce the concentration of the electric field on the corner portions of the pixel 100 when the first bias voltage is applied to the electrode 162. Note that through vias 171 can be arranged at the corner portions of the pixel 100. Each of the through vias 171 is a via plug formed to penetrate the semiconductor substrate 120, and is a via plug connected to the interconnect 142 of the interconnect region 140. By connecting the through vias 171 to the in-pixel isolation unit interconnect 181 and the pixel isolation unit interconnect 182, the first bias voltage and the second bias voltage can be supplied via the through vias 171.

Figure 21B:
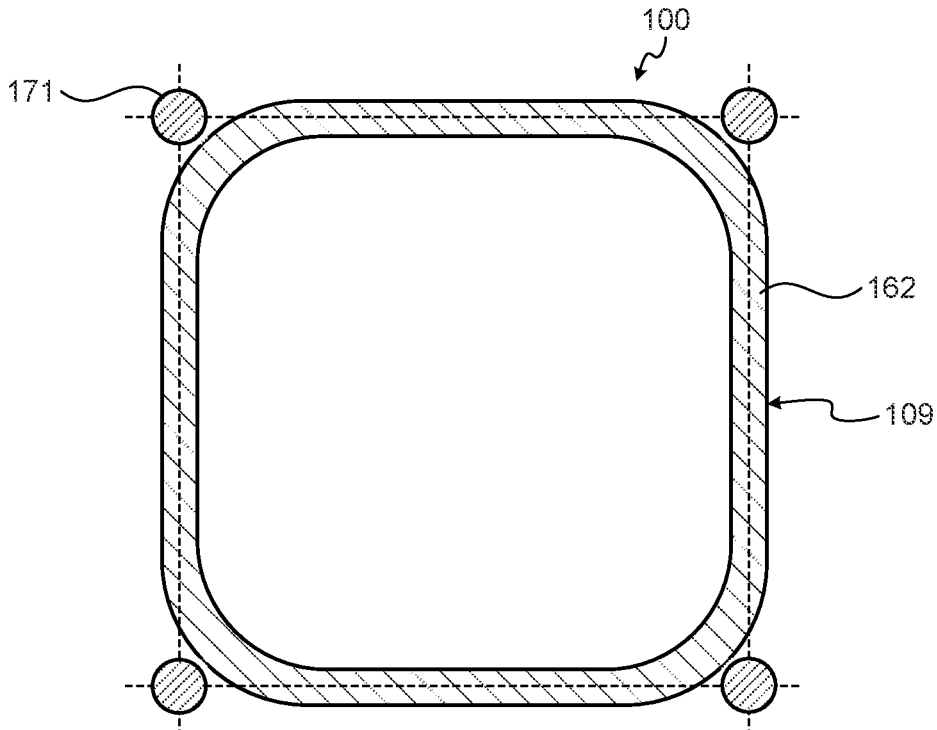
FIG. 21B is a diagram illustrating another configuration example of the pixel according to the modification example of the present disclosure.

FIG. 21B is a diagram illustrating an example of the pixel isolation electrode 109 constituted by the electrode 162 having rounded corners in a plan view of the semiconductor substrate 120. Similarly to the case of the electrode 162 in FIG. 21A, it is possible to reduce the concentration of the electric field on the corner portions of the pixel 100 when the first bias voltage is applied.

The configuration of the imaging element 1 other than this is similar to the configuration of the imaging element 1 in the first embodiment of the present disclosure, and thus description thereof is omitted.

8. Configuration Example of Imaging Device

The imaging element 1 described above can be applied to various electronic apparatuses such as an imaging system such as a digital still camera and a digital video camera, a mobile phone having an imaging function, and another apparatus having an imaging function.

Figure 22:
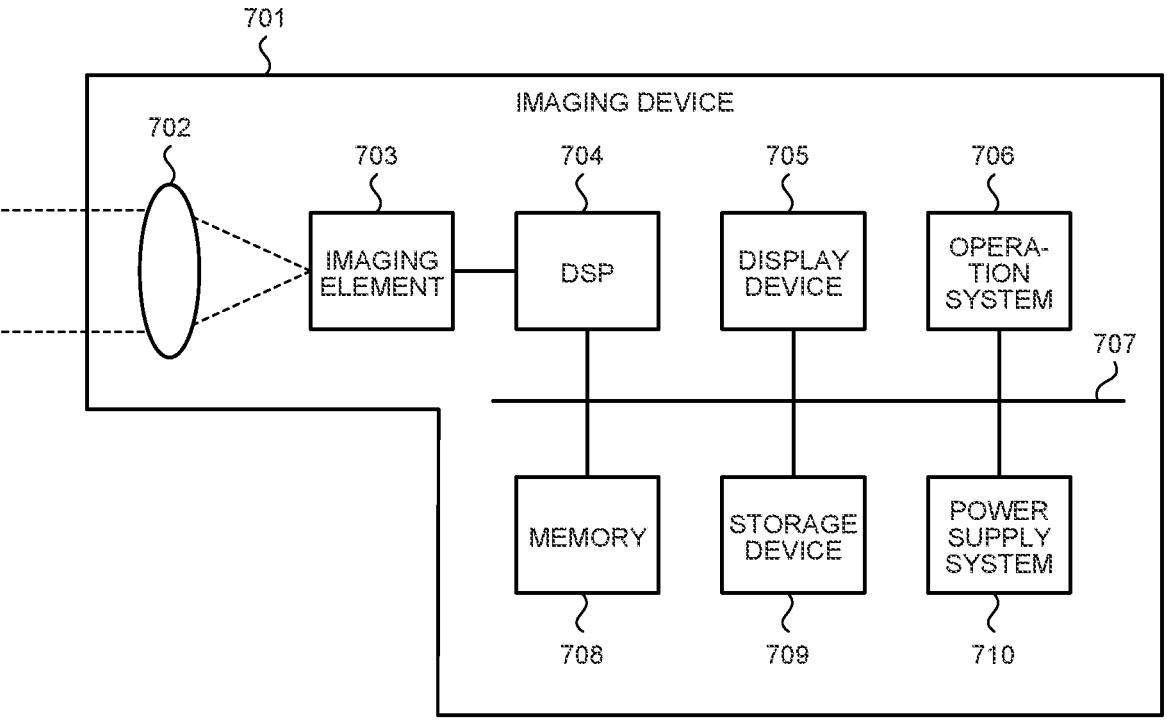
FIG. 22 is a block diagram illustrating a configuration example of an imaging device mounted on an electronic apparatus.

FIG. 22 is a block diagram illustrating a configuration example of an imaging device mounted on an electronic apparatus. As illustrated in FIG. 22, an imaging device 701 includes an optical system 702, an imaging element 703, and a digital signal processor (DSP) 704, is connected to a DSP 704, a display device 705, an operation system 706, a memory 708, a recording device 709, and a power supply system 710 via a bus 707, and is capable of capturing a still image and a moving image.

The optical system 702 includes one or a plurality of lenses, and guides image light (incident light) from a subject to the imaging element 703 to form an image on the light receiving surface (sensor unit) of the imaging element 703.

As the imaging element 703, the imaging element 1 in any of the above-described configuration examples is applied. Electrons are accumulated in the imaging element 703 for a certain period in accordance with the image formed on the light receiving surface via the optical system 702. Then, a signal corresponding to the electrons accumulated in the imaging element 703 is input into the DSP 704.

The DSP 704 performs various types of signal processing on the signal from the imaging element 703 to acquire an image, and temporarily stores data of the image in the memory 708. The data of the image stored in the memory 708 is recorded in the recording device 709 or supplied to the display device 705 to display the image. Furthermore, the operation system 706 receives various operations from the user and supplies an operation signal to each of the blocks of the imaging device 701, and the power supply system 710 supplies power necessary for driving each of the blocks of the imaging device 701.

Note that the effects described in the present specification are illustrative only and are not limited, and other effects may be provided.

Note that the present technology can also employ the following configuration.

(1)
An imaging element comprising:
a pixel that includes a plurality of photoelectric conversion units that is formed in a semiconductor substrate having an interconnect region arranged on a front surface side and performs photoelectric conversion of incident light from a subject to generate charges;
an overflow path that mutually transfers charges between the plurality of photoelectric conversion units;
a pixel isolation unit that is arranged at a boundary of the pixel;
a pixel isolation electrode that is arranged in the pixel isolation unit and to which a first bias voltage is applied;
an in-pixel isolation unit that isolates the plurality of photoelectric conversion units from each other;
an in-pixel isolation electrode that is arranged in the in-pixel isolation unit and to which a second bias voltage is applied;
a charge holding unit that holds the generated charges;
a plurality of charge transfer units that are each arranged in the corresponding one of the plurality of photoelectric conversion units and configured to transfer charges generated by the photoelectric conversion units to the charge holding unit to cause the charge holding unit to hold the charges; and
an image signal generation unit that generates an image signal on a basis of the held charges.

(2)
The imaging element according to the above (1), wherein the second bias voltage for adjusting a potential barrier of the overflow path is applied to the in-pixel isolation electrode.

(3)
The imaging device according to the above (1) or (2),
wherein the plurality of charge transfer units performs collective transfer, in which charges respectively generated by the plurality of photoelectric conversion units are commonly transferred to the charge holding unit and the charges generated by the plurality of photoelectric conversion units are simultaneously and collectively held in the charge holding unit, and individual transfer, in which charges respectively generated by the plurality of photoelectric conversion units are individually transferred to the charge holding unit, and
wherein the image signal generation unit generates the image signal on a basis of the charges collectively held in the charge holding unit by the collective transfer, and generates a plurality of phase difference signals for performing pupil division on the subject and detecting an image-plane phase difference on a basis of the respective charges individually held in the charge holding unit by the individual transfer.

28

(4)
The imaging element according to any one of the above (1) to (3), wherein the overflow path is arranged between the in-pixel isolation unit and the pixel isolation unit.

(5)
The imaging device according to any one of the above (1) to (4),
wherein the pixel includes the plurality of in-pixel isolation units, and
wherein the overflow path is arranged between the plurality of in-pixel isolation units.

(6)
The imaging element according to the above (3), wherein the second bias voltage applied to the in-pixel isolation electrode when the charges transferred by the collective transfer are generated is different from that when the charges transferred by the individual transfer are generated.

(7)
The imaging element according to any one of the above (1) to (6), wherein the second bias voltage for adjusting an accumulation capacity of the charge in the photoelectric conversion unit is applied to the in-pixel isolation electrode.

(8)
The imaging element according to any one of the above (1) to (7), wherein the in-pixel isolation unit is arranged on a back surface side of the semiconductor substrate.

(9)
The imaging element according to the above (8), further comprising an in-pixel isolation region that is a semiconductor region arranged on the front surface side of the semiconductor substrate in the pixel and isolating the plurality of photoelectric conversion units from each other.

(10)
The imaging element according to the above (8), further comprising:
a second in-pixel isolation unit that is the in-pixel isolation unit arranged on the front surface side of the semiconductor substrate; and
a second in-pixel isolation electrode that is the in-pixel isolation electrode arranged in the second in-pixel isolation unit.

(11)
The imaging element according to the above (10), wherein the second bias voltage different from that to the in-pixel isolation electrode is applied to the second in-pixel isolation electrode.

(12)
The imaging element according to the above (8), further comprising an in-pixel isolation unit interconnect that is arranged on the back surface side of the semiconductor substrate and applies the second bias voltage to the in-pixel isolation electrode.

(13)
The imaging element according to the above (12), wherein the in-pixel isolation unit interconnect is made of a transparent member.

(14)
The imaging element according to the above (13), wherein the in-pixel isolation unit interconnect is formed to cover the plurality of photoelectric conversion units.

(15)
The imaging element according to any one of the above (1) to (14), wherein the in-pixel isolation unit and the in-pixel isolation electrode are formed to penetrate the semiconductor substrate.

29

(16)

The imaging element according to any one of the above (1) to (15), wherein the first bias voltage for adjusting an accumulation capacity of the charge in the photoelectric conversion unit is applied to the pixel isolation electrode.

(17)

The imaging element according to any one of the above (1) to (16), wherein the pixel isolation unit is arranged on a back surface side of the semiconductor substrate.

(18)

The imaging element according to the above (17), further comprising:

a second pixel isolation unit that is the pixel isolation unit arranged on the front surface side of the semiconductor substrate; and a second pixel isolation electrode that is the pixel isolation electrode arranged in the second pixel isolation unit.

(19)

The imaging element according to the above (17), further comprising a pixel isolation unit interconnect that is arranged on the back surface side of the semiconductor substrate and transmits the first bias voltage to the pixel isolation unit.

(20)

The imaging element according to any one of the above (1) to (19), wherein the pixel isolation unit and the pixel isolation electrode are formed to penetrate the semiconductor substrate.

(21)

The imaging element according to any one of the above (1) to (20), wherein the in-pixel isolation electrode is made of a transparent member.

(22)

The imaging element according to any one of the above (1) to (21), wherein the pixel isolation electrode is made of a transparent member.

(23)

An imaging device comprising:

a pixel that includes a plurality of photoelectric conversion units that is formed in a semiconductor substrate having an interconnect region arranged on a front surface side and performs photoelectric conversion of incident light from a subject to generate charges;

an overflow path that mutually transfers charges between the plurality of photoelectric conversion units;

a pixel isolation unit that is arranged at a boundary of the pixel;

a pixel isolation electrode that is arranged in the pixel isolation unit and to which a first bias voltage is applied;

an in-pixel isolation unit that isolates the plurality of photoelectric conversion units from each other;

an in-pixel isolation electrode that is arranged in the in-pixel isolation unit and to which a second bias voltage is applied;

a charge holding unit that holds the generated charge;

a plurality of charge transfer units that are each arranged in the corresponding one of the plurality of photoelectric conversion units and configured to transfer charges generated by the photoelectric conversion units to the charge holding unit to cause the charge holding unit to hold the charges;

an image signal generation unit that generates an image signal on a basis of the held charges; and a processing circuit that processes the generated image signal.

REFERENCE SIGNS LIST 1, 703 IMAGING ELEMENT
5 COLUMN SIGNAL PROCESSING CIRCUIT
100 PIXEL
101, 102 PHOTOELECTRIC CONVERSION UNIT
103, 104 CHARGE HOLDING UNIT
105, 106 CHARGE TRANSFER UNIT
107, 107a, 107b OVERFLOW PATH
108, 108a, 108b IN-PIXEL ISOLATION ELECTRODE
109, 109a, 109b PIXEL ISOLATION ELECTRODE
110 IMAGE SIGNAL GENERATION UNIT
120 SEMICONDUCTOR SUBSTRATE
127 IN-PIXEL ISOLATION REGION
131 ISOLATION UNIT
150, 154 IN-PIXEL ISOLATION UNIT
152, 156 to 158, 162, 166, 167 ELECTRODE
160, 164 PIXEL ISOLATION UNIT
181, 183 IN-PIXEL ISOLATION UNIT INTERCONNECT
182, 184 PIXEL ISOLATION UNIT INTERCONNECT
701 IMAGING DEVICE

What is claimed is:

1. An imaging element, comprising:

a pixel that includes a plurality of photoelectric conversion units that is formed in a semiconductor substrate having an interconnect region arranged on a front surface side and performs photoelectric conversion of incident light from a subject to generate charges;

an overflow path that mutually transfers charges between the plurality of photoelectric conversion units;

a pixel isolation unit that is arranged at a boundary of the pixel;

a pixel isolation electrode that is arranged in the pixel isolation unit and to which a first bias voltage is applied;

an in-pixel isolation unit that isolates the plurality of photoelectric conversion units from each other;

an in-pixel isolation electrode that is arranged in the in-pixel isolation unit and to which a second bias voltage is applied;

a charge holding unit that holds the generated charges;

a plurality of charge transfer units that are each arranged in a corresponding one of the plurality of photoelectric conversion units and configured to transfer charges generated by the photoelectric conversion units to the charge holding unit to cause the charge holding unit to hold the charges; and an image signal generation unit that generates an image signal on a basis of the held charges.

2. The imaging element according to claim 1, wherein the second bias voltage for adjusting a potential barrier of the overflow path is applied to the in-pixel isolation electrode.

3. The imaging element according to claim 1, wherein the plurality of charge transfer units performs collective transfer, in which charges respectively generated by the plurality of photoelectric conversion units are commonly transferred to the charge holding unit and the charges generated by the plurality of photoelectric conversion units are simultaneously and collectively held in the charge holding unit, and individual transfer, in which charges respectively generated by the plurality of photoelectric conversion units are individually transferred to the charge holding unit, and wherein the image signal generation unit generates the image signal on a basis of the charges collectively held in the charge holding unit by the collective transfer, and generates a plurality of phase difference signals for performing pupil division on the subject and detecting an image-plane phase difference on a basis of the respective charges individually held in the charge holding unit by the individual transfer.

4. The imaging element according to claim 1, wherein the overflow path is arranged between the in-pixel isolation unit and the pixel isolation unit.

5. The imaging element according to claim 1, wherein the pixel includes a plurality of the in-pixel isolation units, and wherein the overflow path is arranged between the plurality of in-pixel isolation units.

6. The imaging element according to claim 3, wherein the second bias voltage applied to the in-pixel isolation electrode when the charges transferred by the collective transfer are generated is different from that when the charges transferred by the individual transfer are generated.

7. The imaging element according to claim 1, wherein the second bias voltage for adjusting an accumulation capacity of the charge in the photoelectric conversion unit is applied to the in-pixel isolation electrode.

8. The imaging element according to claim 1, wherein the in-pixel isolation unit is arranged on a back surface side of the semiconductor substrate.

9. The imaging element according to claim 8, further comprising an in-pixel isolation region that is a semiconductor region arranged on the front surface side of the semiconductor substrate in the pixel and isolating the plurality of photoelectric conversion units from each other.

10. The imaging element according to claim 8, further comprising:

a second in-pixel isolation unit that is the in-pixel isolation unit arranged on the front surface side of the semiconductor substrate; and a second in-pixel isolation electrode that is the in-pixel isolation electrode arranged in the second in-pixel isolation unit.

11. The imaging element according to claim 10, wherein the second bias voltage different from that to the in-pixel isolation electrode is applied to the second in-pixel isolation electrode.

12. The imaging element according to claim 8, further comprising an in-pixel isolation unit interconnect that is arranged on the back surface side of the semiconductor substrate and applies the second bias voltage to the in-pixel isolation electrode.

13. The imaging element according to claim 12, wherein the in-pixel isolation unit interconnect is made of a transparent member.

14. The imaging element according to claim 13, wherein the in-pixel isolation unit interconnect is formed to cover the plurality of photoelectric conversion units.

15. The imaging element according to claim 1, wherein the in-pixel isolation unit and the in-pixel isolation electrode are formed to penetrate the semiconductor substrate.

16. The imaging element according to claim 1, wherein the first bias voltage for adjusting an accumulation capacity of the charge in the photoelectric conversion unit is applied to the pixel isolation electrode.

17. The imaging element according to claim 1, wherein the pixel isolation unit is arranged on a back surface side of the semiconductor substrate.

18. The imaging element according to claim 17, further comprising:

a second pixel isolation unit that is the pixel isolation unit arranged on the front surface side of the semiconductor substrate; and a second pixel isolation electrode that is the pixel isolation electrode arranged in the second pixel isolation unit.

19. The imaging element according to claim 17, further comprising a pixel isolation unit interconnect that is arranged on the back surface side of the semiconductor substrate and transmits the first bias voltage to the pixel isolation unit.

20. The imaging element according to claim 1, wherein the pixel isolation unit and the pixel isolation electrode are formed to penetrate the semiconductor substrate.

21. The imaging element according to claim 1, wherein the in-pixel isolation electrode is made of a transparent member.

22. The imaging element according to claim 1, wherein the pixel isolation electrode is made of a transparent member.

23. An imaging, device comprising:

a pixel that includes a plurality of photoelectric conversion units that is formed in a semiconductor substrate having an interconnect region arranged on a front surface side and performs photoelectric conversion of incident light from a subject to generate charges;

an overflow path that mutually transfers charges between the plurality of photoelectric conversion units;

a pixel isolation unit that is arranged at a boundary of the pixel;

a pixel isolation electrode that is arranged in the pixel isolation unit and to which a first bias voltage is applied;

an in-pixel isolation unit that isolates the plurality of photoelectric conversion units from each other;

an in-pixel isolation electrode that is arranged in the in-pixel isolation unit and to which a second bias voltage is applied;

a charge holding unit that holds the generated charge;

a plurality of charge transfer units that are each arranged in a corresponding one of the plurality of photoelectric conversion units and configured to transfer charges generated by the photoelectric conversion units to the charge holding unit to cause the charge holding unit to hold the charges;

an image signal generation unit that generates an image signal on a basis of the held charges; and a processing circuit that processes the generated image signal.

* * * * *